(12) United States Patent
Adachi et al.

(10) Patent No.: US 8,933,463 B2
(45) Date of Patent: *Jan. 13, 2015

(54) SEMICONDUCTOR ELEMENT, SEMICONDUCTOR DEVICE, AND POWER CONVERTER

(71) Applicants: Kazuhiro Adachi, Osaka (JP); Osamu Kusumoto, Nara (JP); Masao Uchida, Osaka (JP); Koichi Hashimoto, Osaka (JP); Shun Kazama, Osaka (JP)

(72) Inventors: Kazuhiro Adachi, Osaka (JP); Osamu Kusumoto, Nara (JP); Masao Uchida, Osaka (JP); Koichi Hashimoto, Osaka (JP); Shun Kazama, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/780,876

(22) Filed: Feb. 28, 2013

(65) Prior Publication Data

US 2014/0152374 A1    Jun. 5, 2014

Related U.S. Application Data

(63) Continuation of application No. 13/266,271, filed as application No. PCT/JP2010/003062 on Apr. 28, 2010, now Pat. No. 8,410,489.

(30) Foreign Application Priority Data

Apr. 30, 2009   (WO) ................. PCT/JP2009/001960

(51) Int. Cl.
*H01L 29/16*  (2006.01)
*H01L 29/66*  (2006.01)
(Continued)

(52) U.S. Cl.
CPC ...... *H01L 29/1608* (2013.01); *H01L 29/66068* (2013.01); *H01L 29/7828* (2013.01);
(Continued)

(58) Field of Classification Search
CPC .......... H01L 29/1608; H01L 29/7827; H03K 17/145

USPC ........... 257/77, 330–332, E29.262, E29.168; 438/153, 154

See application file for complete search history.

(56) References Cited

U.S. PATENT DOCUMENTS 5,696,396 A   12/1997  Tokura et al.
5,744,994 A   4/1998   Williams
(Continued)

FOREIGN PATENT DOCUMENTS

JP   02-091974 A   3/1990
JP   07-142722 A   6/1995
(Continued)

OTHER PUBLICATIONS

Notice of Reasons for Rejection for corresponding Japanese Application No. 2012-014688 mailed on Jan. 14, 2014 with partial English translation.

(Continued)

*Primary Examiner* — Thao X Le
*Assistant Examiner* — Sheng Zhu
(74) *Attorney, Agent, or Firm* — Renner, Otto, Boisselle & Sklar, LLP

(57) ABSTRACT

A semiconductor element including an MISFET exhibits diode characteristics in a reverse direction through an epitaxial channel layer. The semiconductor element includes: a silicon carbide semiconductor substrate of a first conductivity type, semiconductor layer of the first conductivity type, body region of a second conductivity type, source region of the first conductivity type, epitaxial channel layer in contact with the body region, source electrode, gate insulating film, gate electrode and drain electrode. If the voltage applied to the gate electrode is smaller than a threshold voltage, the semiconductor element functions as a diode wherein current flows from the source electrode to the drain electrode through the epitaxial channel layer. The absolute value of the turn-on voltage of this diode is smaller than the turn-on voltage of a body diode that is formed of the body region and the first silicon carbide semiconductor layer.

40 Claims, 31 Drawing Sheets

(51) Int. Cl.
  *H01L 29/78* (2006.01)
  *H03K 17/14* (2006.01)
  *H01L 29/45* (2006.01)
(52) U.S. Cl.
  CPC .......... *H01L 29/7827* (2013.01); *H03K 17/145* (2013.01); *H01L 29/45* (2013.01); *H01L 29/7805* (2013.01)
  USPC ............. 257/77; 257/330; 257/331; 257/332; 257/E29.262; 257/E29.168; 438/153; 438/154

(56) References Cited

U.S. PATENT DOCUMENTS

| | | | |
|---|---|---|---|
| 5,808,327 | A | 9/1998 | Maier et al. |
| 5,929,690 | A | 7/1999 | Williams |
| 7,709,403 | B2 | 5/2010 | Yamashita et al. |
| 7,871,871 | B2 * | 1/2011 | Hishiki et al. ................ 438/153 |
| 8,022,474 | B2 | 9/2011 | Haeberlen et al. |
| 8,283,973 | B2 | 10/2012 | Hashimoto et al. |
| 8,410,489 | B2 * | 4/2013 | Adachi et al. .................... 257/77 |
| 2004/0119076 | A1 | 6/2004 | Ryu |
| 2004/0212011 | A1 | 10/2004 | Ryu |
| 2005/0001217 | A1 | 1/2005 | Kusumoto et al. |
| 2005/0173739 | A1 | 8/2005 | Kusumoto et al. |
| 2005/0230686 | A1 | 10/2005 | Kojima et al. |
| 2007/0145377 | A1 | 6/2007 | Miura |
| 2008/0001219 | A1 | 1/2008 | Bhalia et al. |
| 2008/0067586 | A1 | 3/2008 | Williams et al. |
| 2008/0121993 | A1 | 5/2008 | Hefner et al. |
| 2010/0283514 | A1 | 11/2010 | Soeno et al. |
| 2010/0295060 | A1 | 11/2010 | Kudou et al. |

FOREIGN PATENT DOCUMENTS

| | | |
|---|---|---|
| JP | 09-502335 T | 3/1997 |
| JP | 09-097912 A | 4/1997 |
| JP | 2000-512805 A | 9/2000 |
| JP | 2001-186780 A | 7/2001 |
| JP | 2002-299625 A | 10/2002 |
| JP | 2003-309262 A | 10/2003 |
| JP | 2004-096061 | 3/2004 |
| JP | 2004-111614 A | 4/2004 |
| JP | 2005-039257 A | 2/2005 |
| JP | 2005-310886 A | 11/2005 |
| JP | 2006-511961 T | 4/2006 |
| JP | 2006-524432 | 10/2006 |
| JP | 2006-344779 | 12/2006 |
| JP | 2007-305836 A | 11/2007 |
| JP | 2008-017237 A | 1/2008 |
| JP | 2008-166640 A | 7/2008 |
| JP | 2009-065185 A | 3/2009 |
| JP | 2009-141202 | 6/2009 |
| WO | 94/23457 A1 | 10/1994 |
| WO | WO 97/43823 | 11/1997 |
| WO | 2004/097944 A2 | 11/2004 |
| WO | WO 2005/083796 A1 | 9/2005 |
| WO | 2008/057438 A2 | 5/2008 |
| WO | 2009/034851 A1 | 3/2009 |
| WO | 2009/050871 A1 | 4/2009 |

OTHER PUBLICATIONS

International Search Report for corresponding International Application No. PCT/JP2010/003062 mailed Aug. 3, 2010.

International Preliminary Report on Patentability for corresponding International Application No. PCT/JP2010/003062 dated Aug. 30, 2011.

"Fundamentals and Applications of SiC elements", edited by Kazuo Arai and Sadashi Yoshida, Ohmsha Ltd., 2003, p. 2003 and concise explanation (cited in [0003] of the specification).

Lendenmann et al., "High-Power SiC Diodes: Characteristics, Reliability and Relation to Material Defects", Materials Science Forum vols. 389-393 (2002), pp. 1259-1264 (cited in [0003] of the specification).

Fukuda et al., "Status and Problems of Silicon Power Devices", The National Institute of Advanced Industrial Science and Technology (AIST), Power Device Seminar of SEMI Forum of Japan Jun. 20, 2008 and concise explanation.

* cited by examiner (a)

(b)

(a)

(b)

(a)

(b)

(Vds=20V, Vg=0, 1, 2, 3, 4V)

(c)

(Vgs=0V, Vds=-2.0, -1.5, -1.0, -0.5, 0V)

(a)

(b)

(a)

(b)

(a)

(b)

(a)

(b)

(a)

(b)

(a)

(b)

SEMICONDUCTOR ELEMENT, SEMICONDUCTOR DEVICE, AND POWER CONVERTER

TECHNICAL FIELD

The present invention relates to a semiconductor element and more particularly relates to a silicon carbide semiconductor element (as a power semiconductor device), which can be used in applications that require a high breakdown voltage and a large amount of current. The present invention also relates to a semiconductor device and power converter including such a silicon carbide semiconductor element.

BACKGROUND ART

Silicon carbide (SiC) is a high-hardness semiconductor material with a greater bandgap than silicon (Si), and has been used extensively in various types of semiconductor devices including power elements, hostile-environment elements, high temperature operating elements, and radio frequency elements. Among other things, the application of SiC to power elements such as semiconductor elements and rectifiers has attracted a lot of attention. This is because a power element that uses SiC can significantly reduce the power loss compared to a Si power element. In addition, by utilizing such properties, SiC power elements can form a smaller semiconductor device than Si power elements.

A metal-insulator-semiconductor field effect transistor (MISFET) is a typical semiconductor element among various power elements that use SiC. In this description, a MISFET of SiC will sometimes be simply referred to herein as a "SiC-FET". And a metal-oxide-semiconductor field effect transistor (MOSFET) is one of those MISFETs. Somebody reported that if a forward current is supplied to the pn junction of SiC, stacking defects will increase due to dislocations produced at the bottom of a substrate, which is a problem unique to SiC. Such a problem will arise when a SiC-FET is used as a switching element for a power converter for driving and controlling a load such as a motor. As will be described in detail later, if a SiC-FET is used as a switching element for a power converter that performs a synchronous rectification control, then return current needs to flow when the SiC-FET is in OFF state. And a pn junction inside of a SiC-FET is sometimes used as a path for such a return current. Such a pn junction is present deep inside a semiconductor element that works as the SiC-FET and functions as a kind of diode. That is why the pn junction is called a "body diode". If the pn junction diode (body diode) inside a SiC-FET is used as a freewheeling diode, then current will flow in the forward direction through the body diode that is a pn junction. It is believed that if such current flows through the pn junction of SiC, then the degree of crystallinity of a SiC-FET will decrease due to a bipolar operation performed by the body diode (see, for example, Patent Document No. 1 and Non-Patent Documents Nos. 1 and 2).

If the degree of crystallinity of a SiC-FET decreases, the ON voltage of the body diode could rise. Also, if a body diode is used as a freewheeling diode, a reverse recovery current will flow due to the bipolar operation performed by the pn junction diode when the diode in ON state changes into OFF state. And that reverse recovery current causes not only recovery loss but also a decrease in switching rate as well.

Thus, in order to overcome such a problem involved by using a body diode as a freewheeling diode, it was proposed (in Patent Document No. 2, for example) that a return current is made to flow through a freewheeling diode element as an electronic part by connecting the freewheeling diode element and an SiC-FET in anti-parallel with each other.

FIG. 1 illustrates a configuration for a typical inverter circuit 1000 including freewheeling diode elements.

The inverter circuit 1000 is a circuit for driving a load 1500 such as a motor and includes multiple semiconductor elements 1100, which are implemented as SiC-FETs. In this inverter circuit 1000, the semiconductor elements 1100 and freewheeling diode elements 1200 are connected in anti-parallel together. In this configuration, ON-state current $I_F$ flows through the semiconductor elements 1100 and return current $I_R$ flows through the freewheeling diode elements 1200. Two semiconductor elements 1100 that are connected in series together form one set of semiconductor elements. And in this example, three sets of semiconductor elements are arranged in parallel with each other with respect to a DC power supply 2000. The gate potential of each of these semiconductor elements 1100 is controlled by a controller.

FIG. 2(a) illustrates the structure of a semiconductor element (SiC-FET) 1100. This semiconductor element 1100 is made of silicon carbide (SiC) semiconductors and has a structure in which an n$^-$-drift layer 120 has been stacked on an n$^+$-substrate (SiC substrate) 110. A p-body region 130 has been defined in an upper part of the n$^-$-drift layer 120. A p-body contact region 132 and an n+ source region 140 have been defined in an upper part of the p-body region 130. And a source electrode 145 is arranged on the p-body contact region 132 and the n$^+$-source region 140.

An epitaxial channel layer 150 has been formed to cover the surface of the n$^-$-drift layer 120, the p-body region 130 and the n$^+$-source region 140. A gate insulating film 160 and a gate electrode 165 are further arranged on the epitaxial channel layer 150. A portion of the epitaxial channel layer 150, which contacts with the upper surface of the p-body region 130, functions as a channel region. On the back surface of the n$^+$-substrate 110, arranged is a drain electrode 170.

A body diode 180 has been formed inside of this semiconductor element 1100. Specifically, the pn junction between the p-body region 130 and the n$^-$-drift layer 120 forms the body diode 180.

Since SiC is a wide bandgap semiconductor, the body diode 180 has a relatively high turn-on voltage Vf of around 3 V (e.g., approximately 2.7 V) at room temperature and would cause a lot of loss.

FIG. 4 shows the current-voltage characteristics and turn-on voltages of the body diode 180 at multiple different operating temperatures thereof. The turn-on voltage Vf of the body diode 180, which is obtained by making a tangential approximation on a curve representing its current-voltage characteristic, is as high as about 2.8 V at 25° C. A diode with such a high turn-on voltage is not practical. The higher the operating temperature, the smaller Vf. Also, as mentioned above, if the body diode 180 is used as a freewheeling diode, the degree of crystallinity of the semiconductor element 1100 will decrease and its reliability will also decline eventually, which is a problem.

For that reason, it is difficult to replace the freewheeling diode element 1200 of the inverter circuit 1000 with the body diode 180. Also, if a forward current is continuously supplied to the pn junction of SiC, crystal imperfections of SiC will increase so much as to cause even more loss, which is a problem unique to SiC.

The body diode 180 is a pn junction diode and is also an element that performs a bipolar operation. When the body diode 180 turns OFF, a reverse recovery current flows, thus causing some recovery loss. As a result, as there is a period in which the reverse recovery current flows, it becomes very difficult to switch the semiconductor element 1100 at high rates. In addition, since the switching loss increases, it becomes difficult to increase the switching frequency, too.

On the other hand, the semiconductor element 1110 shown in FIG. 2(b) is an insulated gate bipolar transistor (IGBT) of SiC. As for this semiconductor element 1110, the body diode 181 cannot be used as a freewheeling diode in the first place, because the substrate 112 of this semiconductor element 1110 is a $p^+$-substrate. Inside of this semiconductor element 1110, there are not only the body diode 181 between the p-body region 130 and the $n^-$-drift layer 120 but also another body diode 182 between the $p^+$-substrate 112 and the $n^-$-drift layer 120 as well. Thus, the presence of the body diode 182 prevents the return current $I_R$ from flowing.

FIG. 17 is a circuit diagram illustrating a part of the configuration shown in FIG. 1 for illustration purposes. In FIG. 17, the DC power supply 2000 supplies power to an inductive load 2100 such as a motor. A high-side MISFET H and a low-side MISFET L are connected in series together. A controller 2200 that drives the high-side MISFET H and the low-side MISFET L outputs a gate drive voltage Vg1 to the high-side MISFET H and a gate drive voltage Vg2 to the low-side MISFET L, respectively.

The controller 2200 and the DC power supply 2000 together function as a "potential setting section" for setting the potentials of respective MOSFETs (i.e., semiconductor elements). And the semiconductor device shown in FIG. 17 is driven by that potential setting section.

Each of the currents I1 and I2 indicated by the arrows in FIG. 17 is supposed to have a positive value when flowing in the direction indicated by the arrow and a negative value when flowing in the opposite direction to the one indicated by the arrow, respectively.

Portions (a) through (e) of FIG. 18 show the operating waveforms of the circuit shown in FIG. 17 and illustrate a timing diagram showing voltages applied to, and currents flowing through, respective parts of the circuit when a current needs to be supplied to the inductive load 2100.

The respective gate drive voltages Vg1 and Vg2 for the high-side MISFET H and the low-side MISFET L are turned ON and OFF exclusively. In addition, a dead time Td1, Td2 is provided between Vg1 and Vg2 to prevent the high-side and low-side MISFETs H and L from turning ON simultaneously and causing a short-circuit breakdown.

In the initial state indicated by the timing diagram shown in FIG. 18, Vg2 is in ON state to make a current flow in the path indicated by the arrow 96 shown in FIG. 17. Next, during the dead time Td1 after Vg2 has fallen to OFF state, current flows in the path indicated by the arrow 97 shown in FIG. 17. That is to say, the current flows through the freewheeling diode element that is connected anti-parallel to the low-side MISFET L. In that case, the current I1 has a negative value.

If the high-side MISFET H is turned ON while current is flowing through the freewheeling diode element that is connected anti-parallel to the low-side MISFET L, a voltage is applied to that freewheeling diode element that is connected anti-parallel to the low-side MISFET L. This voltage is a reverse voltage for the freewheeling diode element. That is why after a reverse recovery current has flowed through the freewheeling diode element that is connected anti-parallel to the low-side MISFET L along the path indicated by the arrow 95 shown in FIG. 17, that freewheeling diode that is connected anti-parallel to the low-side MISFET L turns OFF. More specifically, when the high-side MISFET H turns ON, the reverse recovery current flows from the high-side MISFET H through the freewheeling diode element that is connected anti-parallel to the low-side MISFET L as a sort of transient current, which is illustrated as a peak current 98. This reverse recovery current never flows through the inductive load 2100. However, as indicated by the arrow 95 in FIG. 17, the reverse recovery current is superposed on the current flowing through the high-side MISFET H, thus causing an increase in switching loss, a breakdown of the element due to overcurrent, and a lot of noise.

When the freewheeling diode element that is connected anti-parallel to the low-side MISFET L turns OFF, current flows along the path indicated by the arrow 94 in FIG. 17. Next, during the dead time Td2 after Vg1 has fallen to OFF state, current flows along the path indicated by the arrow 97 shown in FIG. 17, i.e., through the freewheeling diode element that is connected anti-parallel to the low-side MISFET L.

When the low-side MISFET L turns ON while current is flowing through the freewheeling diode element that is connected anti-parallel to the low-side MISFET L, a channel current flows along the path indicated by the arrow 96 shown in FIG. 17, i.e., through the channel of the low-side MISFET L. As a result, the initial state is recovered. It should be noted that although the high-side MISFET H and the low-side. MISFET L turn ON and OFF at mutually different times, the reverse recovery current is also generated on the high side, and therefore, current does flow through the freewheeling diode element on the high side.

Next, the reverse recovery current of a pn junction diode will be described with reference to FIG. 3, in which curves (a) and (b) show variations in the amount of current flowing through a pn junction diode of Si (which is labeled as Si-PND). Specifically, the curve (a) shows the results obtained at 25° C. ($T_j$=25° C.) and the curve (b) shows the results obtained at 150° C. ($T_j$=150° C.).

As indicated by these curves (a) and (b), a pn junction diode has a period in which a reverse recovery current is generated, thus deteriorating the performance of the inverter circuit 1000 (e.g., interfering with the high-rate switching and increasing the switching loss). The magnitude of the reverse recovery current indicated by the 150° C. curve (b) is greater than that of the reverse recovery current indicated by the 25° C. curve. That is why the higher the temperature, the more seriously the characteristic of the pn junction is affected.

On the other hand, the curve (c) shown in FIG. 3 shows a variation in the amount of current flowing through a Schottky barrier diode of SiC (which is labeled as SiC-SBD). As indicated by the curve (c), the magnitude of the reverse recovery current generated in that case is smaller than what is indicated by the curve (a) or (b). In addition, since the curve (c) shows both of the results that were obtained at ° C., and 150° C., it can be seen that almost no reverse recovery current is generated in the SiC-SBD even at high temperatures. For that reason, it is preferred that a SiC-SBD, rather than Si-PND, be used as the freewheeling diode element 1200.

However, SiC-SBD is expensive, which is a problem. On top of that, if the number of components to use to make the inverter circuit 1000 is increased to cope with the return current, then the circuit cost will increase as well.

CITATION LIST

Patent Literature

Patent Document No. 1: Japanese Patent Application Laid-Open Publication No. 2008-17237

Patent Document No. 2: Japanese Patent Application Laid-Open Publication No. 2002-299625

Non-Patent Literature

Non-Patent Document No. 1: Fundamentals and Applications of SiC elements, edited by Kazuo Arai and Sadashi Yoshida, Ohmsha, Ltd., 2003, p. 206

Non-Patent Document No. 2: Materials Science Forum Vols. 389-393 (2002), pp. 1259-1264

SUMMARY OF INVENTION

Technical Problem

The SiC semiconductor device disclosed in Patent Document No. 2 uses a SiC SBD as a freewheeling diode element. An SBD has a lower turn-on voltage than a SiC-FET body diode. That is why if the amount of return current is small, then the return current will flow through the SBD and will not flow through the body diode.

However, if a SiC SBD is used as the freewheeling diode element, the circuit cost should increase because silicon carbide semiconductor materials themselves, and therefore SiC SBDs, are too expensive. Furthermore, if the SiC-FET disclosed in Patent Document No. 2 is used to make a power converter, the failure rate of the SiC-FET will increase when return current flows through the body diode. Thus, it cannot be said that the reliability of such a power converter is high. On top of that, since the number of components to use increases by introducing the SiC-SBD, the power converter comes to have an increased size, which is contrary to the recent downsizing and weight reduction trends of power converters.

It is therefore a primary object of the present invention to provide an SiC semiconductor element that can maintain high reliability by minimizing the deterioration of crystallinity of an SiC semiconductor device without increasing the number of components to use.

Another object of the present invention is to provide a SiC semiconductor element that can operate at high rates with the loss cut down.

Solution to Problem

A semiconductor device according to the present invention includes a semiconductor element including a metal-insulator-semiconductor field effect transistor, and a potential setting section for setting a potential at the semiconductor element. The metal-insulator-semiconductor field effect transistor includes: a semiconductor substrate of a first conductivity type; a first silicon carbide semiconductor layer of the first conductivity type, which is arranged on the principal surface of the semiconductor substrate; a body region of a second conductivity type, which is defined in the first silicon carbide semiconductor layer; a source region of the first conductivity type, which is defined in the body region; a second silicon carbide semiconductor layer of the first conductivity type, which is arranged on the first silicon carbide semiconductor layer so as to be at least partially in contact with the body region and the source region; a gate insulating film, which is arranged on the second silicon carbide semiconductor layer; a gate electrode, which is arranged on the gate insulating film; a source electrode, which contacts with the source region; and a drain electrode, which is arranged on the back surface of the semiconductor substrate. Supposing the potential of the drain electrode with respect to the potential of the source electrode is identified by Vds, the potential of the gate electrode with respect to the potential of the source electrode is identified by Vgs, the gate threshold voltage of the metal-insulator-semiconductor field effect transistor is identified by Vth, the direction of a current flowing from the drain electrode toward the source electrode is defined to be a forward direction, and the direction of a current flowing from the source electrode toward the drain electrode is defined to be a reverse direction, the potential setting section raises, in a transistor turned-ON mode, the potential Vgs of the gate electrode with respect to the potential of the source electrode to a level that is equal to or higher than the gate threshold voltage Vth, thereby making the drain electrode and the source electrode electrically conductive with each other through the second silicon carbide semiconductor layer. In a transistor turned-OFF mode, on the other hand, the potential setting section sets the potential Vgs of the gate electrode with respect to the potential of the source electrode to be equal to or higher than zero volts but less than the gate threshold voltage Vth, thereby making the metal-insulator-semiconductor field effect transistor function as a diode that makes a current flow in the reverse direction from the source electrode toward the drain electrode through the second silicon carbide semiconductor layer.

In one preferred embodiment, the absolute value of a turn-on voltage of the diode is smaller than the absolute value of a turn-on voltage of a body diode that is formed by the body region and the first silicon carbide semiconductor layer.

In this particular preferred embodiment, the difference in the absolute value of the turn-on voltage between the diode and the body diode is 0.7 V or more.

In another preferred embodiment, the absolute value of the turn-on voltage of the diode is less than 1.3 V at room temperature.

In still another preferred embodiment, the absolute value of the turn-on voltage of the diode is less than 1.0 V at room temperature.

In yet another preferred embodiment, the absolute value of the turn-on voltage of the diode is less than 0.6 V at room temperature.

Another semiconductor element according to the present invention includes a metal-insulator-semiconductor field effect transistor. The metal-insulator-semiconductor field effect transistor includes: a semiconductor substrate of a first conductivity type; a first silicon carbide semiconductor layer of the first conductivity type, which is arranged on the principal surface of the semiconductor substrate; a body region of a second conductivity type, which is defined in the first silicon carbide semiconductor layer; a source region of the first conductivity type, which is defined in the body region; a second silicon carbide semiconductor layer of the first conductivity type, which is arranged on the first silicon carbide semiconductor layer so as to be at least partially in contact with the body region and the source region; a gate insulating film, which is arranged on the second silicon carbide semiconductor layer; a gate electrode, which is arranged on the gate insulating film; a source electrode, which contacts with the source region; and a drain electrode, which is arranged on the back surface of the semiconductor substrate. Suppose the potential of the drain electrode with respect to the potential of the source electrode is identified by Vds, the potential of the gate electrode with respect to the potential of the source electrode is identified by Vgs, the gate threshold voltage of the metal-insulator-semiconductor field effect transistor is identified by Vth, the direction of a current flowing from the drain electrode toward the source electrode is defined to be a forward direction, and the direction of a current flowing from the source electrode toward the drain electrode is defined to be a reverse direction. In that case, if Vgs≥Vth is satisfied, then the metal-insulator-semiconductor field effect transistor makes the drain electrode and the source electrode electrically conductive with each other through the second silicon carbide semiconductor layer. On the other hand, if 0 V≤Vgs<Vth is satisfied, then the metal-insulator-semiconductor field effect transistor does not make a current flow in the forward direction but functions as a diode that makes a current flow in the reverse direction from the source electrode toward the drain electrode through the second silicon carbide semiconductor layer when Vds<0 V. The absolute value of a turn-on voltage of the diode is smaller than the absolute value of a turn-on voltage of a body diode that is formed by the body region and the first silicon carbide semiconductor layer.

In one preferred embodiment, the difference in the absolute value of the turn-on voltage between the diode and the body diode is 0.7 V or more.

In another preferred embodiment, the absolute value of the turn-on voltage of the diode is less than 1.3 V at room temperature.

In still another preferred embodiment, the absolute value of the turn-on voltage of the diode is less than 1.0 V at room temperature.

In yet another preferred embodiment, the absolute value of the turn-on voltage of the diode is less than 0.6 V at room temperature.

In yet another preferred embodiment, the semiconductor element is used in a semiconductor device that includes a semiconductor element including a transistor that has a gate electrode, a source electrode, a drain electrode and a channel region, and a potential setting section for setting the potential of the gate electrode. Supposing the potential of the drain electrode with respect to the potential of the source electrode is identified by Vds, the potential of the gate electrode with respect to the potential of the source electrode is identified by Vgs, the gate threshold voltage of the transistor is identified by Vth, the direction of a current flowing from the drain electrode toward the source electrode is defined to be a forward direction, and the direction of a current flowing from the source electrode toward the drain electrode is defined to be a reverse direction, the potential setting section raises, in a transistor turned-ON mode, the potential Vgs of the gate electrode with respect to the potential of the source electrode to a level that is equal to or higher than the gate threshold voltage Vth, thereby making the drain electrode and the source electrode electrically conductive with each other through the channel region. On the other hand, in a transistor turned-OFF mode, the potential setting section sets the potential Vgs of the gate electrode with respect to the potential of the source electrode to be equal to or higher than zero volts but less than the gate threshold voltage Vth, thereby making the transistor function as a diode that makes a current flow in the reverse direction from the source electrode toward the drain electrode through the channel region.

Another semiconductor element according to the present invention includes a metal-insulator-semiconductor field effect transistor. The metal-insulator-semiconductor field effect transistor includes: a semiconductor substrate of a first conductivity type; a first silicon carbide semiconductor layer of the first conductivity type, which is arranged on the principal surface of the semiconductor substrate; a body region of a second conductivity type, which is defined in the first silicon carbide semiconductor layer; a source region of the first conductivity type, which is defined in the body region; a second silicon carbide semiconductor layer of the first conductivity type, which is arranged on the first silicon carbide semiconductor layer so as to be at least partially in contact with the body region and the source region; a gate insulating film, which is arranged on the second silicon carbide semiconductor layer; a gate electrode, which is arranged on the gate insulating film; a source electrode, which contacts with the source region; and a drain electrode, which is arranged on the back surface of the semiconductor substrate. The second silicon carbide semiconductor layer includes at least one dopant doped layer, which is doped with a dopant of the first conductivity type. And if the second silicon carbide semiconductor layer has an average dopant concentration of N ($cm^{-3}$) and a thickness of d (nm), then N and d satisfy $$b_{1.3} \times d^{\char`\^ a_{1.3}} \leq N < b_0 \times d^{\char`\^ a_0},$$

$$b_0 = 1.349 \times 10^{21},$$

$$a_0 = -1.824,$$

$$b_{1.3} = 2.399 \times 10^{20} \text{ and}$$

$$a_{1.3} = -1.774.$$

In one preferred embodiment, N and d further satisfy $$N \geq b_1 \times d^{\char`\^ a_1},$$

$$b_1 = 2.188 \times 10^{20} \text{ and}$$

$$a_1 = -1.683.$$

In another preferred embodiment, N and d further satisfy $$N \geq b_{0.6} \times d^{\char`\^ a_{0.6}},$$

$$b_{0.6} = 7.609 \times 10^{20} \text{ and}$$

$$a_{0.6} = -1.881.$$

In still another preferred embodiment, d is within the range of 5 nm to 200 nm.

In yet another preferred embodiment, d is within the range of 10 nm to 100 nm.

In yet another preferred embodiment, d is within the range of 20 nm to 75 nm.

In yet another preferred embodiment, the second silicon carbide semiconductor layer has been grown epitaxially on the first silicon carbide semiconductor layer.

In yet another preferred embodiment, the second silicon carbide semiconductor layer has been formed by implanting ions into the first silicon carbide semiconductor layer.

A power converter according to the present invention includes: a semiconductor element according to any of the preferred embodiments of the present invention described above; a first line for applying at least a part of a supply voltage to between the source and drain electrodes of the semiconductor element; and a second line for applying a voltage from a controller, which controls switching of the semiconductor element, to the gate electrode of the semiconductor element. The power converter outputs power to be supplied to a load.

In one preferred embodiment, the semiconductor device further includes a terminal to be electrically connected to a power supply.

In another preferred embodiment, the semiconductor device further includes a terminal to be electrically connected to an inductive load.

Another semiconductor device according to the present invention includes a semiconductor element including a metal-insulator-semiconductor field effect transistor, and a potential setting section for setting a potential at the semiconductor element. The metal-insulator-semiconductor field effect transistor includes: a semiconductor substrate of a first conductivity type; a first silicon carbide semiconductor layer of the first conductivity type, which is arranged on the principal surface of the semiconductor substrate; a body region of a second conductivity type, which is arranged on the first silicon carbide semiconductor layer; a source region of the first conductivity type, which is arranged on the body region; a recess, which extends through the body region and the source region to reach the first silicon carbide semiconductor layer; a second silicon carbide semiconductor layer of the first conductivity type, which defines the side surface of the recess and which is arranged so as to be at least partially in contact with the body region and the source region; a gate insulating film, which is arranged on the second silicon carbide semiconductor layer; a gate electrode, which is arranged on the gate insulating film; a source electrode, which contacts with the source region; and a drain electrode, which is arranged on the back surface of the semiconductor substrate. Supposing the potential of the drain electrode with respect to the potential of the source electrode is identified by Vds, the potential of the gate electrode with respect to the potential of the source electrode is identified by Vgs, the gate threshold voltage of the metal-insulator-semiconductor field effect transistor is identified by Vth, the direction of a current flowing from the drain electrode toward the source electrode is defined to be a forward direction, and the direction of a current flowing from the source electrode toward the drain electrode is defined to be a reverse direction, the potential setting section raises, in a transistor turned-ON mode, the potential Vgs of the gate electrode with respect to the potential of the source electrode to a level that is equal to or higher than the gate threshold voltage Vth, thereby making the drain electrode and the source electrode electrically conductive with each other through the second silicon carbide semiconductor layer. On the other hand, in a transistor turned-OFF mode, the potential setting section sets the potential Vgs of the gate electrode with respect to the potential of the source electrode to be equal to or higher than zero volts but less than the gate threshold voltage Vth, thereby making the metal-insulator-semiconductor field effect transistor function as a diode that makes a current flow in the reverse direction from the source electrode toward the drain electrode through the second silicon carbide semiconductor layer.

In one preferred embodiment, the absolute value of a turn-on voltage of the diode is smaller than the absolute value of a turn-on voltage of a body diode that is formed by the body region and the first silicon carbide semiconductor layer.

In this particular preferred embodiment, the difference in the absolute value of the turn-on voltage between the diode and the body diode is 0.7 V or more.

In another preferred embodiment, the absolute value of the turn-on voltage of the diode is less than 1.3 V at room temperature.

In another preferred embodiment, the absolute value of the turn-on voltage of the diode is less than 1.0 V at room temperature.

In another preferred embodiment, the absolute value of the turn-on voltage of the diode is less than 0.6 V at room temperature.

Still another semiconductor element according to the present invention includes a metal-insulator-semiconductor field effect transistor. The metal-insulator-semiconductor field effect transistor includes: a semiconductor substrate of a first conductivity type; a first silicon carbide semiconductor layer of the first conductivity type, which is arranged on the principal surface of the semiconductor substrate; a body region of a second conductivity type, which is arranged on the first silicon carbide semiconductor layer; a source region of the first conductivity type, which is arranged on the body region; a recess, which extends through the body region and the source region to reach the first silicon carbide semiconductor layer; a second silicon carbide semiconductor layer of the first conductivity type, which defines the side surface of the recess and which is arranged so as to be at least partially in contact with the body region and the source region; a gate insulating film, which is arranged on the second silicon carbide semiconductor layer; a gate electrode, which is arranged on the gate insulating film; a source electrode, which contacts with the source region; and a drain electrode, which is arranged on the back surface of the semiconductor substrate. Suppose the potential of the drain electrode with respect to the potential of the source electrode is identified by Vds, the potential of the gate electrode with respect to the potential of the source electrode is identified by Vgs, the gate threshold voltage of the metal-insulator-semiconductor field effect transistor is identified by Vth, the direction of a current flowing from the drain electrode toward the source electrode is defined to be a forward direction, and the direction of a current flowing from the source electrode toward the drain electrode is defined to be a reverse direction. In that case, if Vgs≥Vth is satisfied, then the metal-insulator-semiconductor field effect transistor makes the drain electrode and the source electrode electrically conductive with each other through the second silicon carbide semiconductor layer. On the other hand, if 0 V≤Vgs<Vth is satisfied, then the metal-insulator-semiconductor field effect transistor does not make a current flow in the forward direction but functions as a diode that makes a current flow in the reverse direction from the source electrode toward the drain electrode through the second silicon carbide semiconductor layer when Vds<0 V. And the absolute value of a turn-on voltage of the diode is smaller than the absolute value of a turn-on voltage of a body diode that is formed by the body region and the first silicon carbide semiconductor layer.

In one preferred embodiment, the difference in the absolute value of the turn-on voltage between the diode and the body diode is 0.7 V or more.

In another preferred embodiment, the absolute value of the turn-on voltage of the diode is less than 1.3 V at room temperature.

In another preferred embodiment, the absolute value of the turn-on voltage of the diode is less than 1.0 V at room temperature.

In another preferred embodiment, the absolute value of the turn-on voltage of the diode is less than 0.6 V at room temperature.

In another preferred embodiment, the semiconductor element is used in a semiconductor device that includes a semiconductor element including a transistor that has a gate electrode, a source electrode, a drain electrode and a channel region, and a potential setting section for setting a potential at the semiconductor element. Supposing the potential of the drain electrode with respect to the potential of the source electrode is identified by Vds, the potential of the gate electrode with respect to the potential of the source electrode is identified by Vgs, the gate threshold voltage of the transistor is identified by Vth, the direction of a current flowing from the drain electrode toward the source electrode is defined to be a forward direction, and the direction of a current flowing from the source electrode toward the drain electrode is defined to be a reverse direction, the potential setting section raises, in a transistor turned-ON mode, the potential Vgs of the gate electrode with respect to the potential of the source electrode to a level that is equal to or higher than the gate threshold voltage Vth, thereby making the drain electrode and the source electrode electrically conductive with each other through the channel region. On the other hand, in a transistor turned-OFF mode, the potential setting section sets the potential Vgs of the gate electrode with respect to the potential of the source electrode to be equal to or higher than zero volts but less than the gate threshold voltage Vth, thereby making the transistor function as a diode that makes a current flow in the reverse direction from the source electrode toward the drain electrode through the channel region.

Yet another semiconductor element according to the present invention includes a metal-insulator-semiconductor field effect transistor. The metal-insulator-semiconductor field effect transistor includes: a semiconductor substrate of a first conductivity type; a first silicon carbide semiconductor layer of the first conductivity type, which is arranged on the principal surface of the semiconductor substrate; a body region of a second conductivity type, which is arranged on the first silicon carbide semiconductor layer; a source region of the first conductivity type, which is arranged on the body region; a recess, which extends through the body region and the source region to reach the first silicon carbide semiconductor layer; a second silicon carbide semiconductor layer of the first conductivity type, which defines the side surface of the recess and which is arranged so as to be at least partially in contact with the body region and the source region; a gate insulating film, which is arranged on the second silicon carbide semiconductor layer; a gate electrode, which is arranged on the gate insulating film; a source electrode, which contacts with the source region; and a drain electrode, which is arranged on the back surface of the semiconductor substrate. The second silicon carbide semiconductor layer includes at least one dopant doped layer, which is doped with a dopant of the first conductivity type. If the second silicon carbide semiconductor layer has an average dopant concentration of N (cm$^{-3}$) and a thickness of d (nm), then N and d satisfy $$b_{1.3} \times d^{\wedge}a_{1.3} \leq N < b_0 \times d^{\wedge}a_0,$$

$$b_0 = 1.349 \times 10^{21},$$

$$a_0 = -1.824,$$

$$b_{1.3} = 2.399 \times 10^{20}, \text{ and}$$

$$a_{1.3} = -1.774.$$

In one preferred embodiment, N and d further satisfy $$N \geq b_1 \times d^{\wedge}a_1,$$

$$b_1 = 2.188 \times 10^{20} \text{ and}$$

$$a_1 = -1.683.$$

In another preferred embodiment, N and d further satisfy $$N \geq b_{0.6} \times d^{\wedge}a_{0.6},$$

$$b_{0.6} = 7.609 \times 10^{20} \text{ and}$$

$$a_{0.6} = -1.881.$$

In still another preferred embodiment, d is within the range of 5 nm to 200 nm.

In yet another preferred embodiment, d is within the range of 10 nm to 100 nm.

In yet another preferred embodiment, d is within the range of 20 nm to 75 nm.

In yet another preferred embodiment, the second silicon carbide semiconductor layer has been grown epitaxially.

In yet another preferred embodiment, the second silicon carbide semiconductor layer has been formed by implanting ions.

Another power converter according to the present invention includes: a semiconductor element according to any of the preferred embodiments of the present invention described above; a first line for applying at least a part of a supply voltage to between the source and drain electrodes of the semiconductor element; and a second line for applying a voltage from a controller, which controls switching of the semiconductor element, to the gate electrode of the semiconductor element. And the power converter outputs power to be supplied to a load.

In one preferred embodiment, the semiconductor device further includes a terminal to be electrically connected to a power supply.

In another preferred embodiment, the semiconductor device further includes a terminal to be electrically connected to an inductive load.

Advantageous Effects of Invention

According to the present invention, the diode current is made to flow through a channel, not a body diode formed by a pn junction, and therefore, the turn-on voltage becomes lower than that of the body diode and the conduction loss can be reduced. This is even more effective for a wide bandgap semiconductor such as a silicon carbide semiconductor, in particular, because the body diode of such a semiconductor will have a high turn-on voltage. In addition, by lowering as much as possible the turn-on voltage of the diode at room temperature (25° C.), at which current flows through the channel, the voltage directly applied to the pn junction of the silicon carbide semiconductor can be kept less than the turn-on voltage (of 2.7 V) of the body diode. As a result, the increase in the number of crystal imperfections that would otherwise be caused by supplying a forward current to the pn junction of a silicon carbide semiconductor can be avoided. On top of that, since the diode performs a unipolar operation, not the bipolar operation, the reverse recovery current can be reduced. As a result, the loss involved by the reverse recovery current and the switching loss can both be reduced, and the diode can be switched at increased rates. What is more, with this element, the power converter no longer needs to have a freewheeling diode element, and therefore, the number of components required can be reduced. In other words, according to the present invention, a single element can operate as either an MISFET or a diode according to the voltage applied to an electrode of that element. Consequently, the circuit cost can be cut down.

BRIEF DESCRIPTION OF DRAWINGS

FIG. 13(a) is a graph showing the Id-Vd characteristic of a reverse current that is plotted on a linear scale, while FIG. 13(b) is a graph showing the Id-Vd characteristic of a reverse current that is plotted on a (semi-) logarithmic scale.

Figure 17:
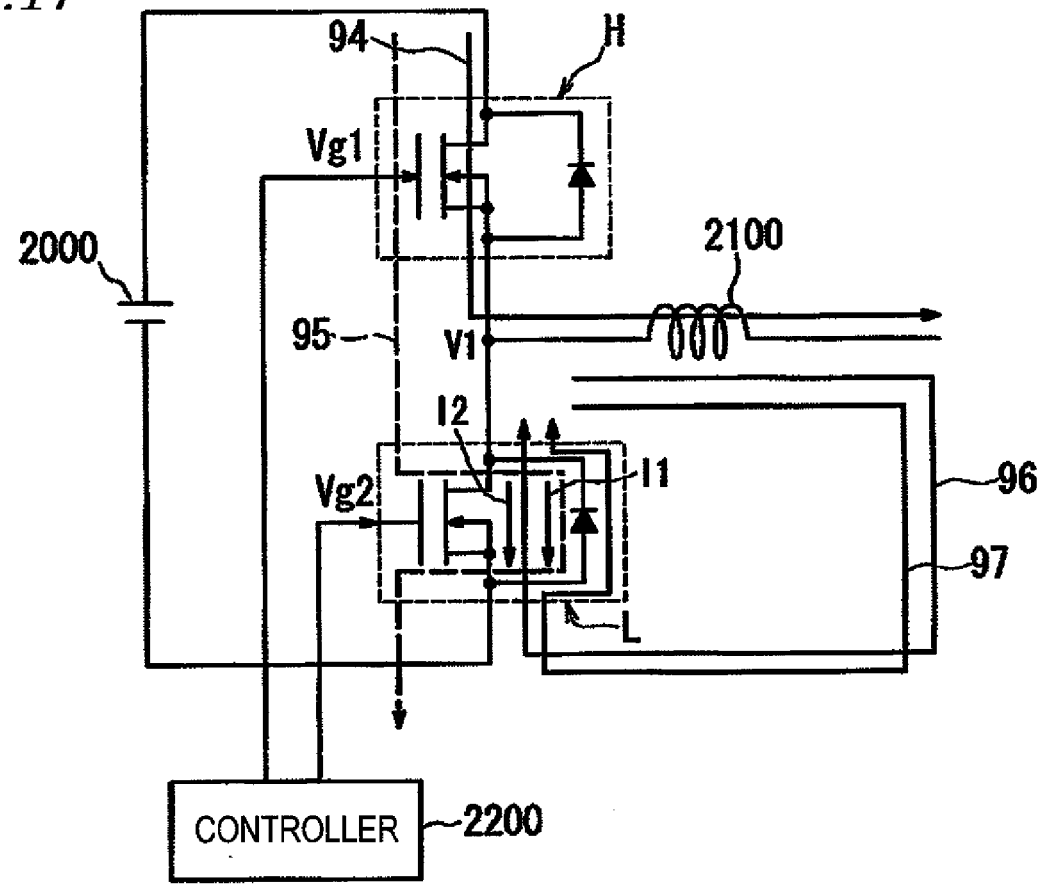
FIG. 17 is a circuit diagram illustrating a one-phase portion of the three-phase inverter of the inverter circuit shown in FIG. 1.
Figure 18:
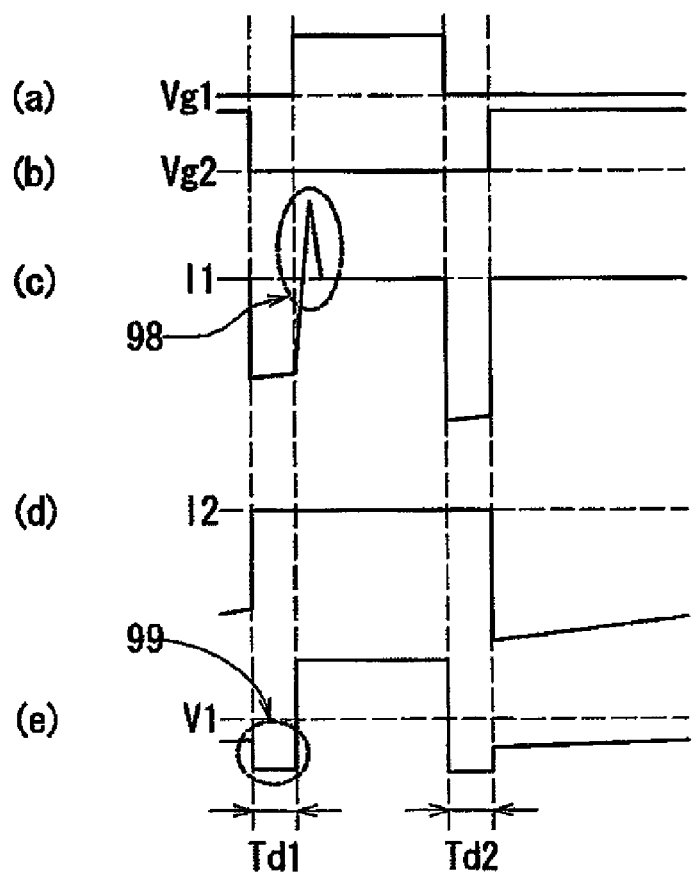

Portions (a) through (e) of FIG. 18 are a timing diagram showing the operating waveforms of the circuit shown in FIG. 17.

Figure 19:
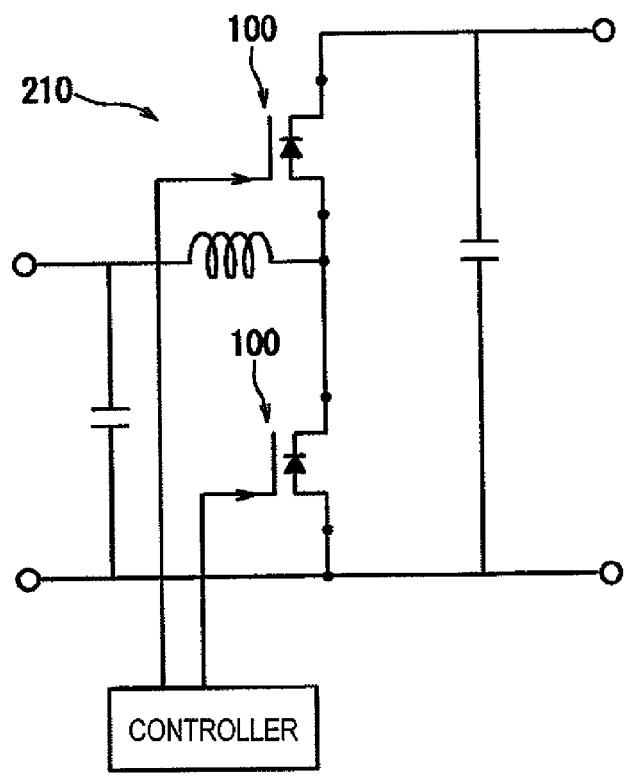

FIG. 19 is a circuit diagram illustrating a voltage step-up/down converter 210.

Figure 20:
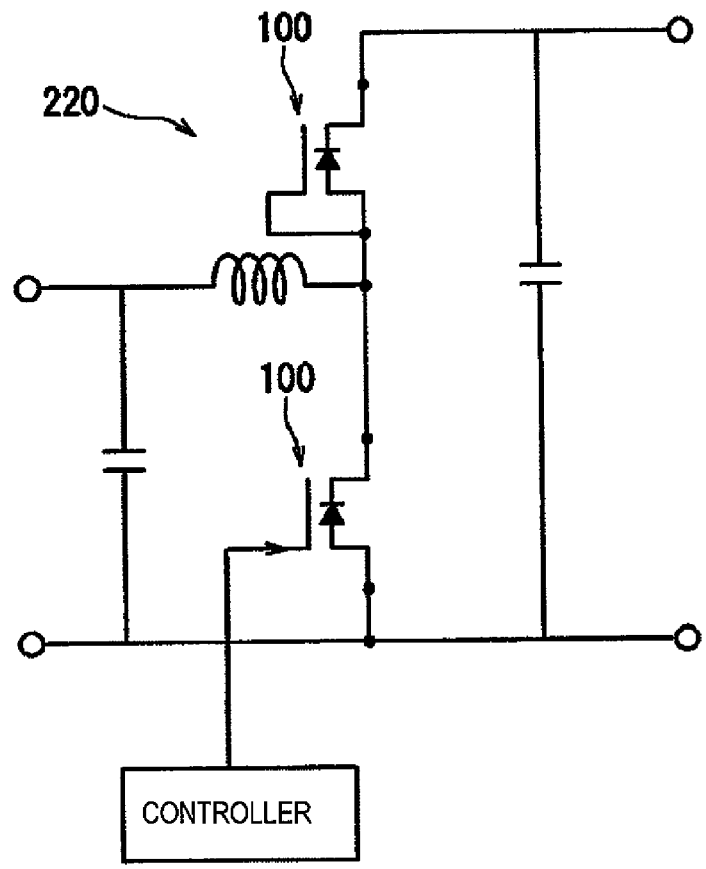

FIG. 20 is a circuit diagram illustrating a voltage step-up converter 220.

Figure 21:
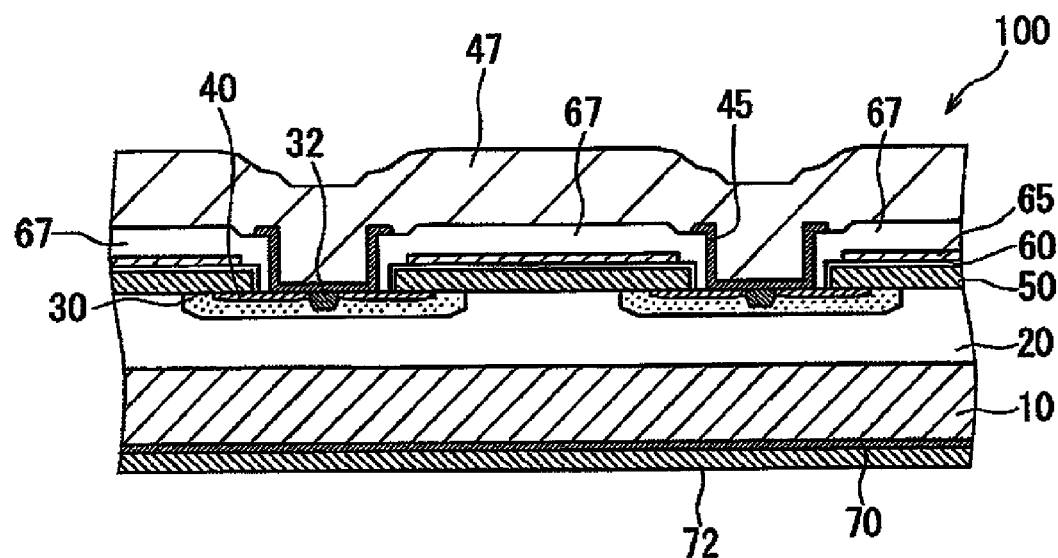

FIG. 21 is a cross-sectional view schematically illustrating the structure of a semiconductor element 100 as a preferred embodiment of the present invention.

Figure 22:
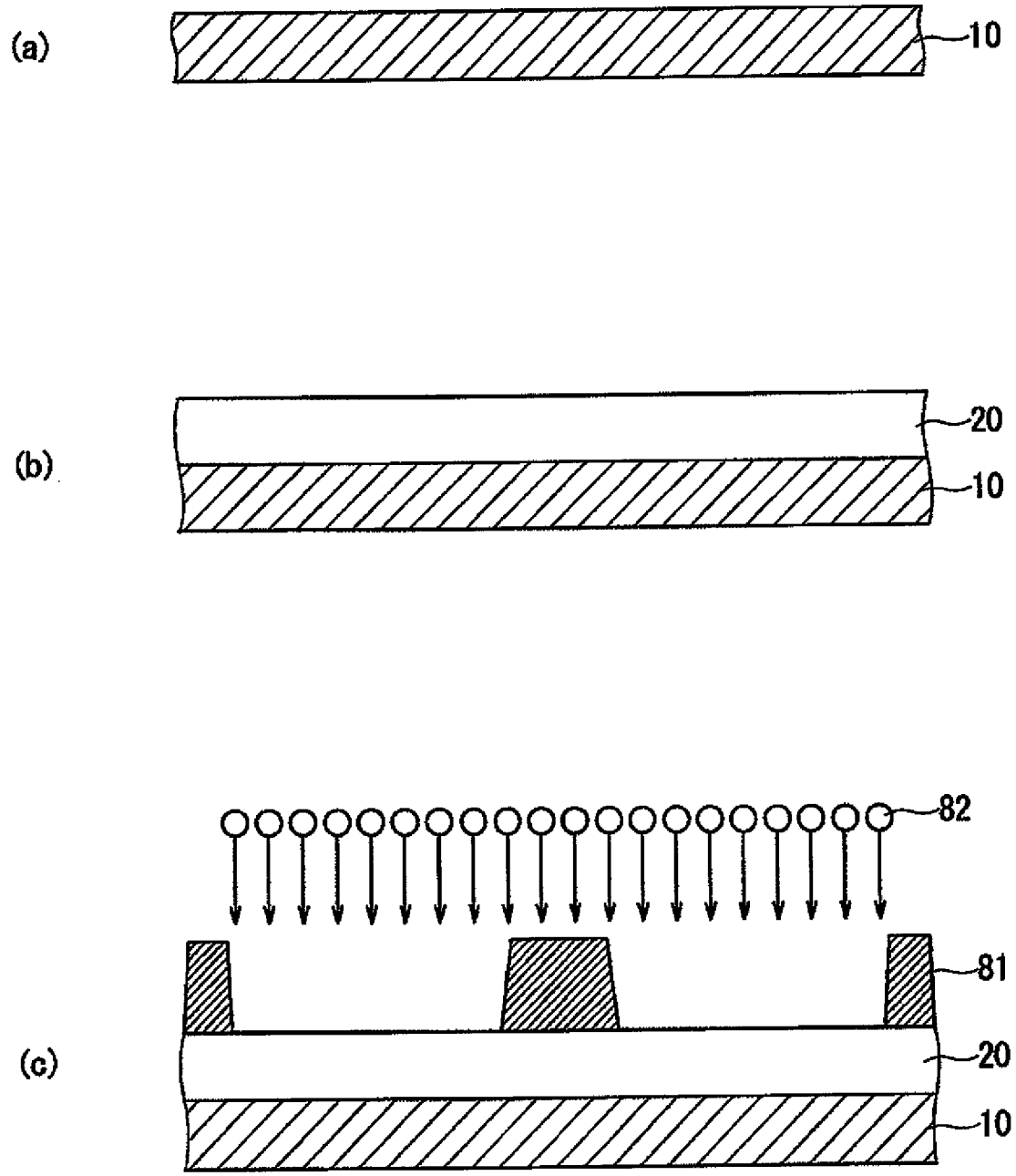

FIGS. 22(a) through 22(c) are cross-sectional views illustrating respective manufacturing process steps to fabricate the semiconductor element 100.

Figure 23:
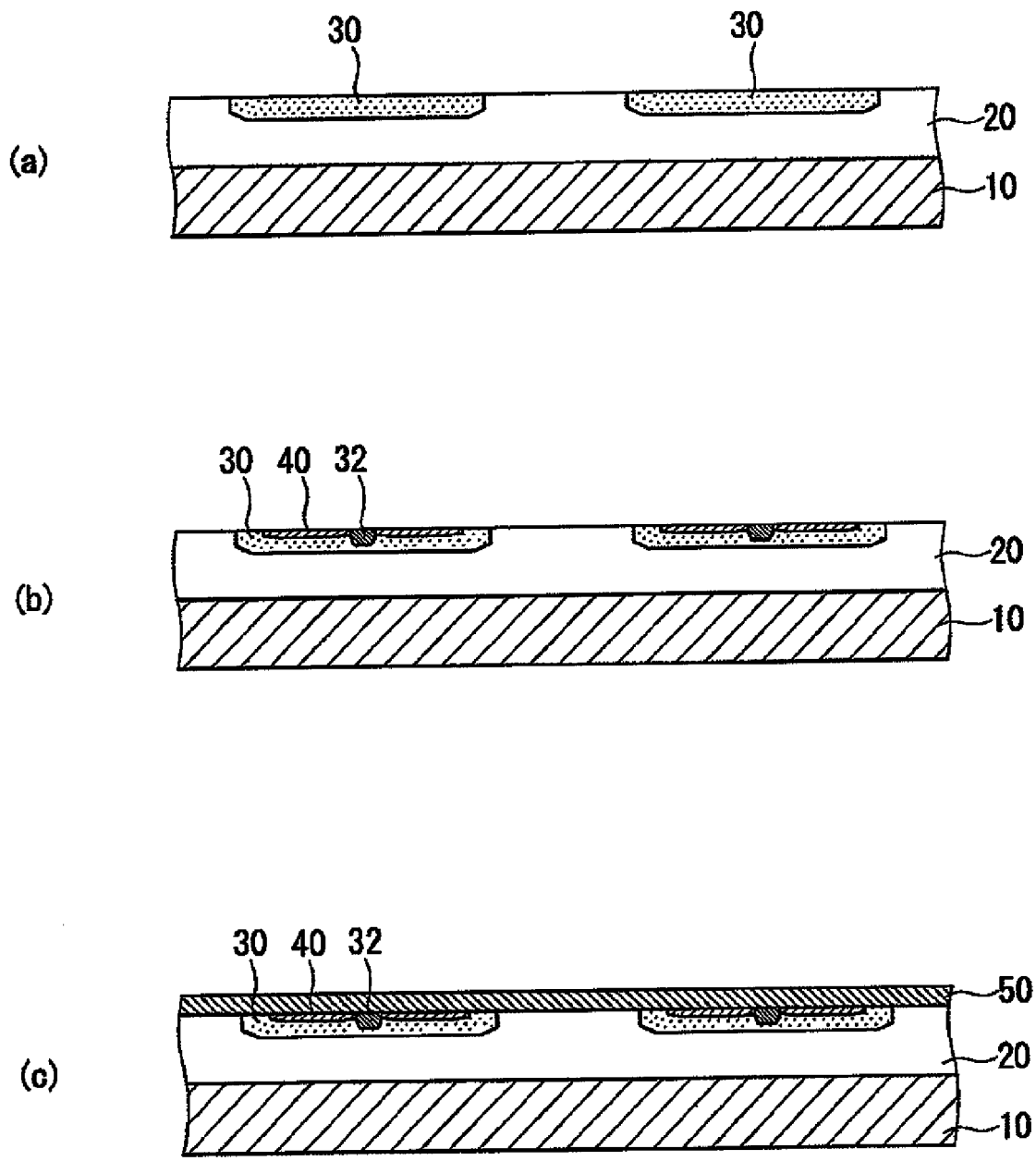

FIGS. 23(a) through 23(c) are cross-sectional views illustrating respective manufacturing process steps to fabricate the semiconductor element 100.

Figure 24:
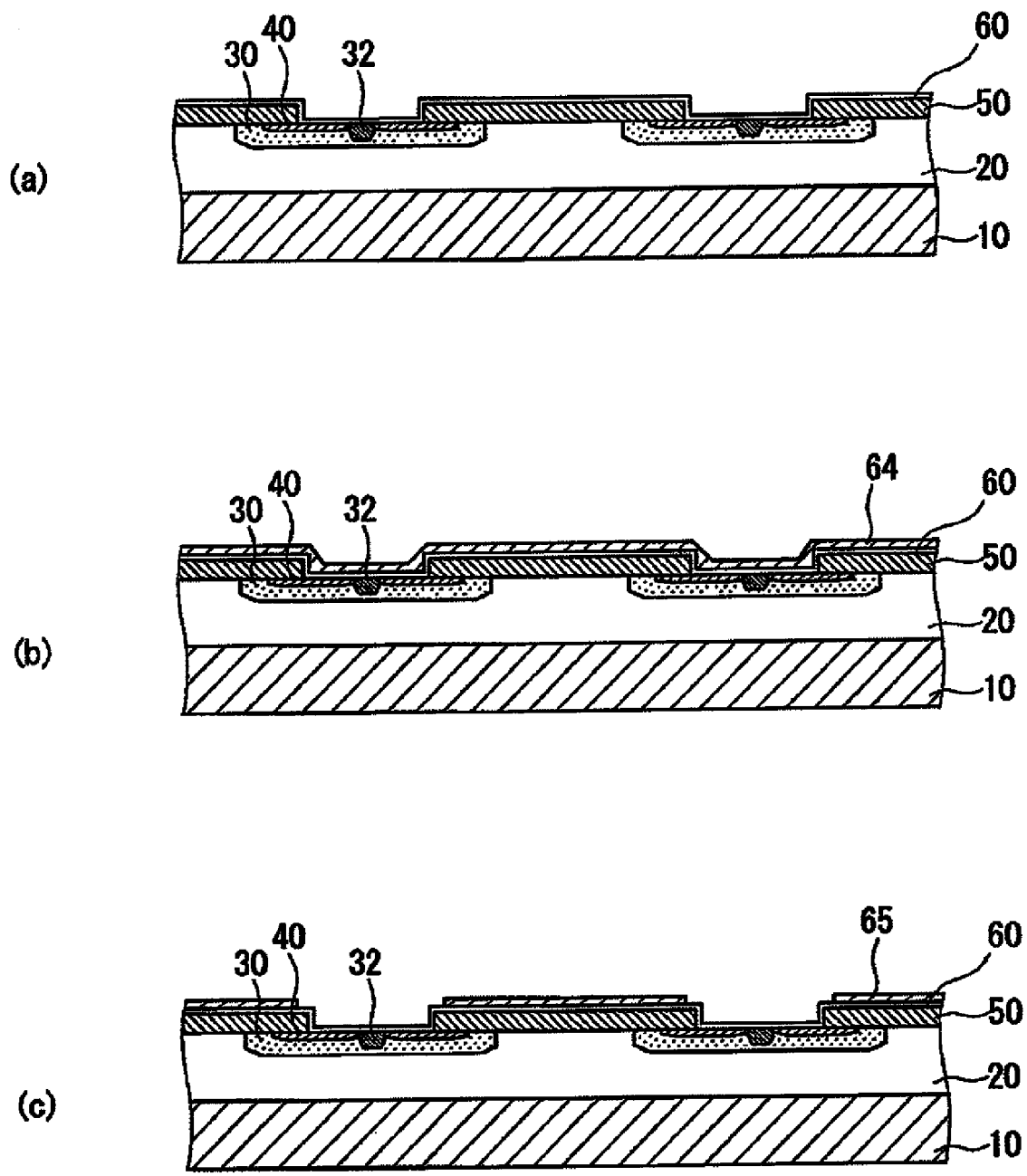

FIGS. 24(a) through 24(c) are cross-sectional views illustrating respective manufacturing process steps to fabricate the semiconductor element 100.

Figure 25:
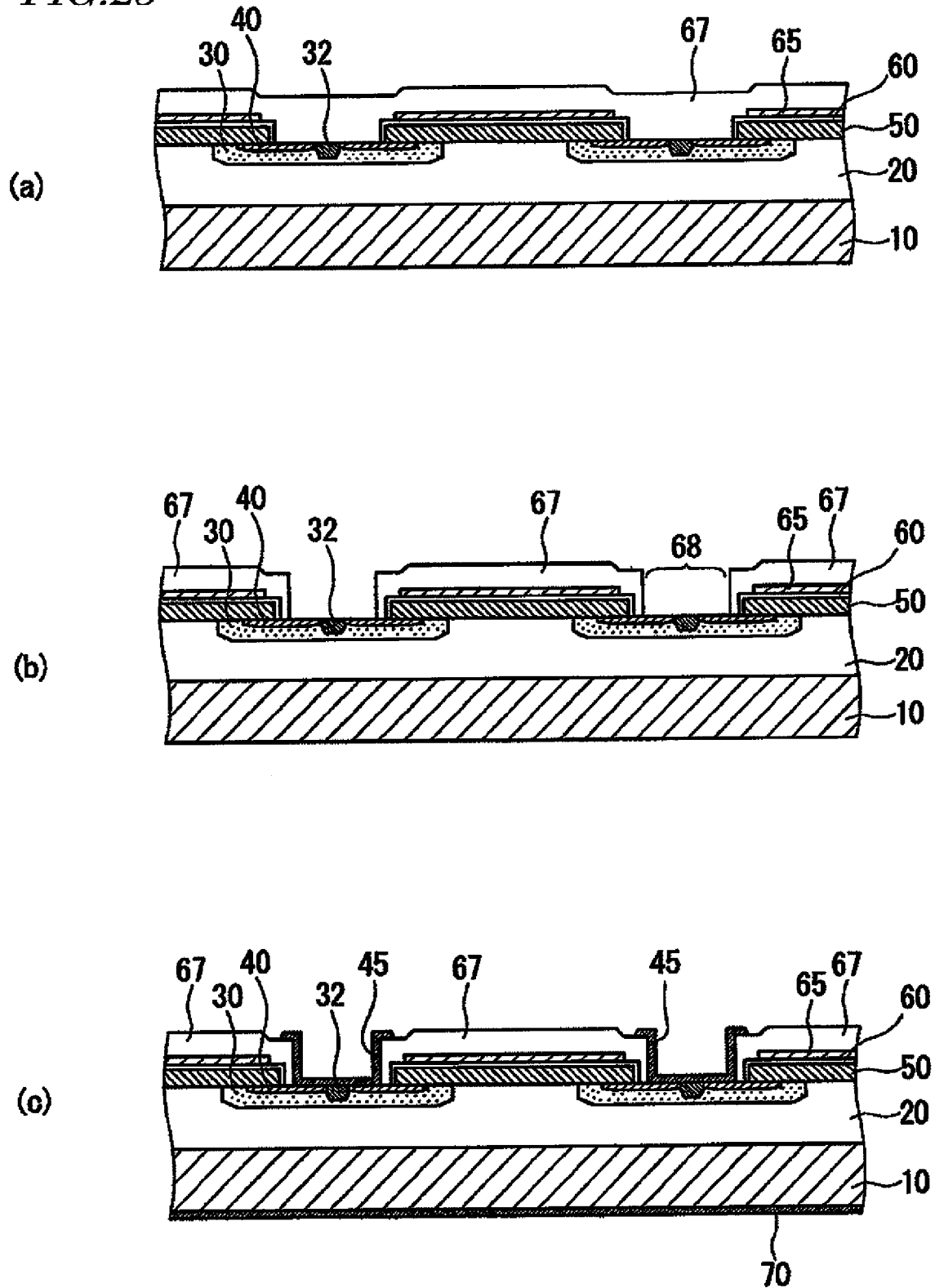

FIGS. 25(a) through 25(c) are cross-sectional views illustrating respective manufacturing process steps to fabricate the semiconductor element 100.

Figure 26:
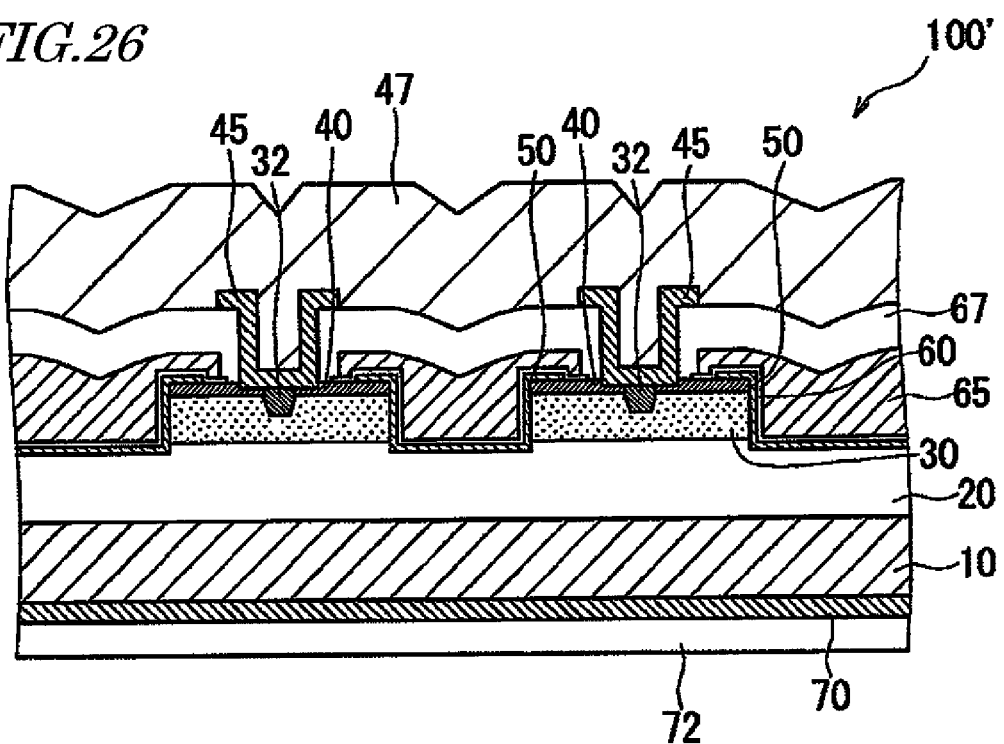

FIG. 26 is a cross-sectional view schematically illustrating the structure of a semiconductor element 100' as another preferred embodiment of the present invention.

Figure 27:
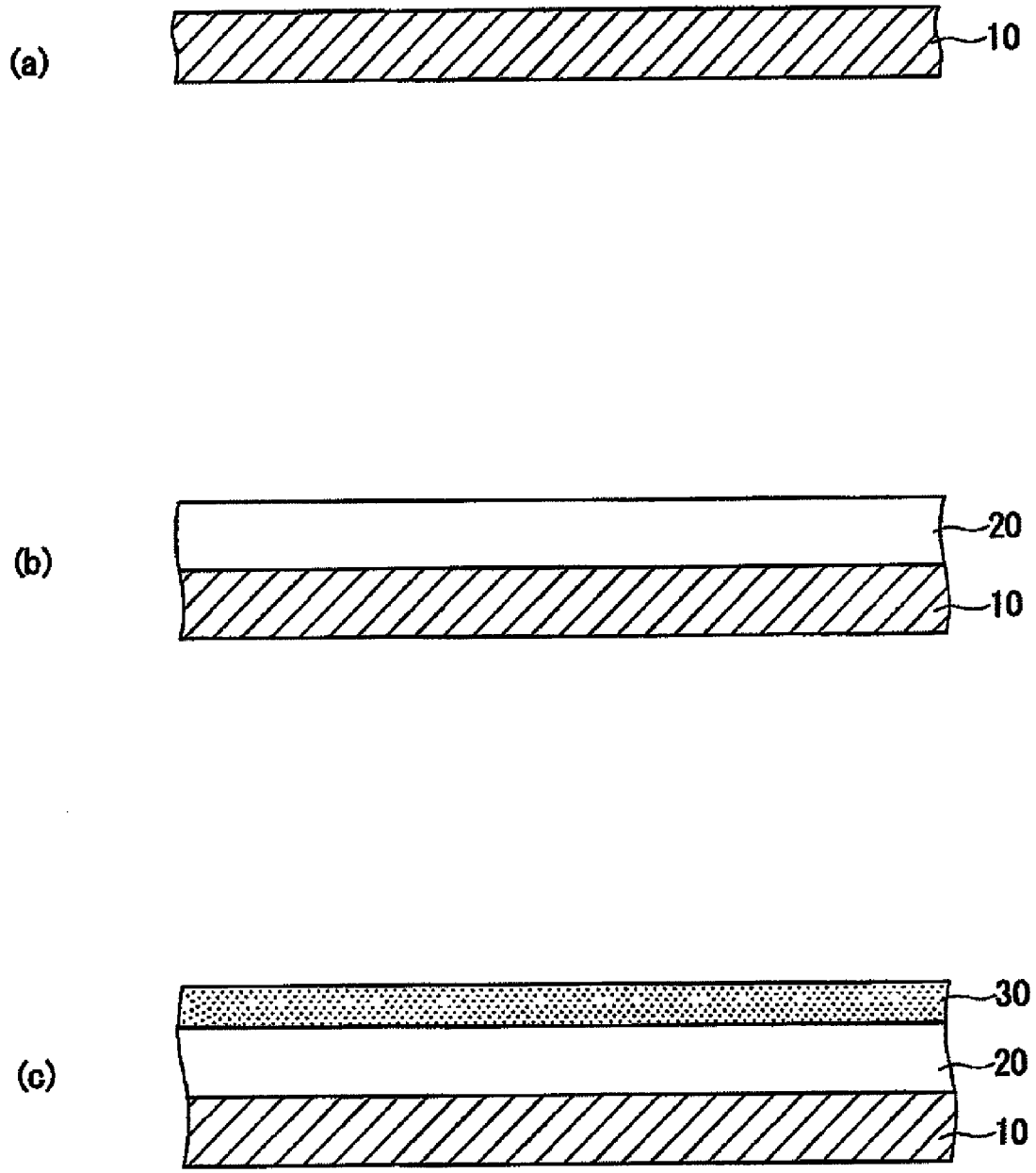

FIGS. 27(a) through 27(c) are cross-sectional views illustrating respective manufacturing process steps to fabricate the semiconductor element 100'.

Figure 28:
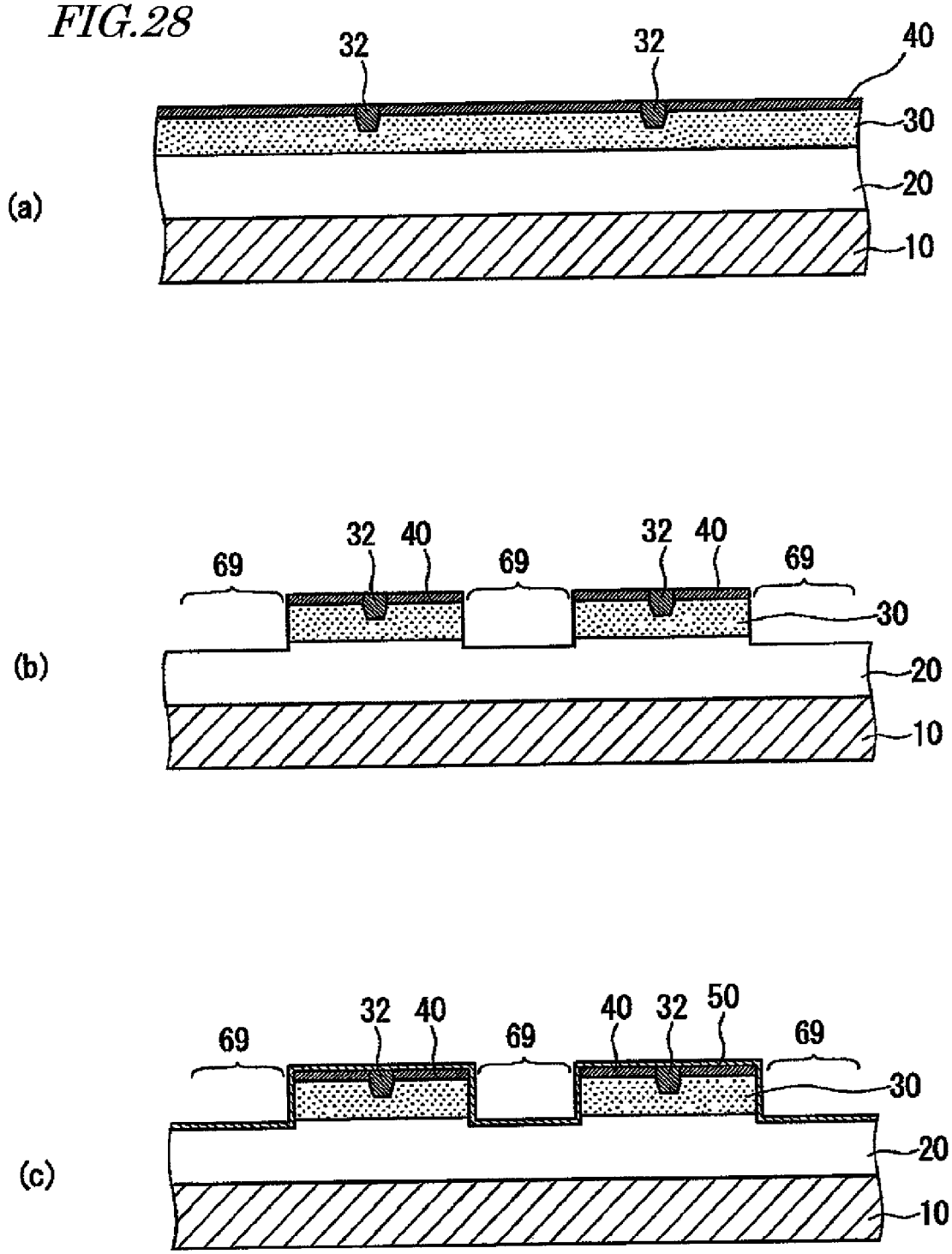

FIGS. 28(a) through 28(c) are cross-sectional views illustrating respective manufacturing process steps to fabricate the semiconductor element 100'.

Figure 29:
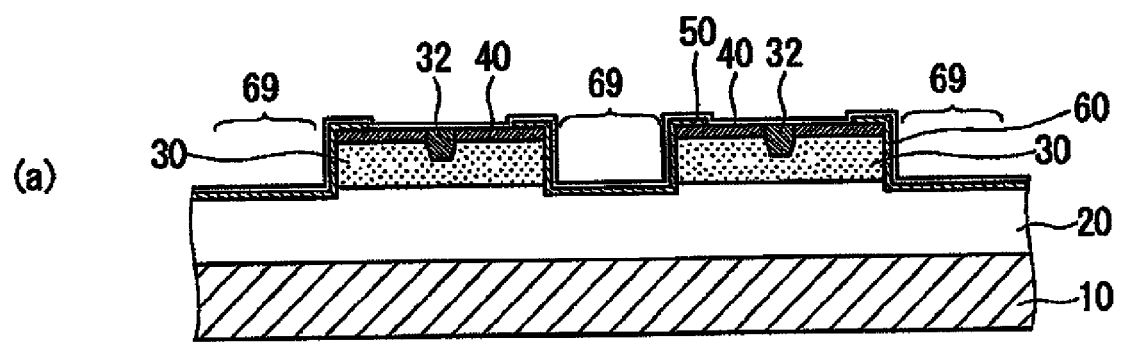
Figure 29:
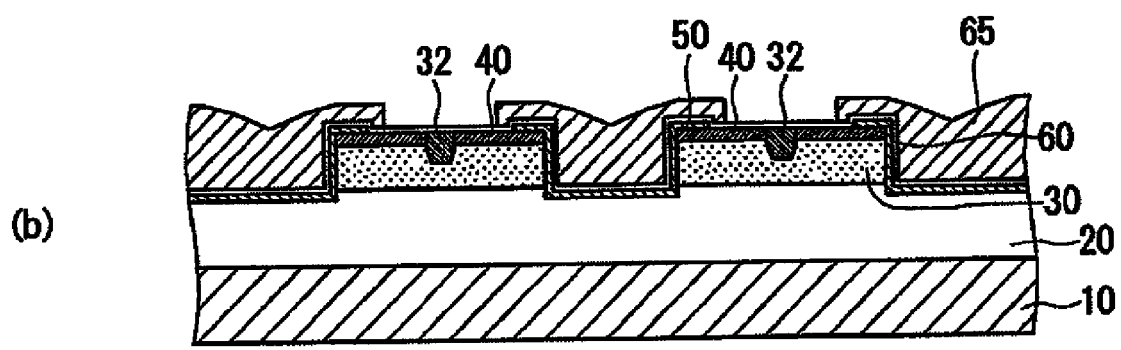

FIGS. 29(a) and 29(b) are cross-sectional views illustrating respective manufacturing process steps to fabricate the semiconductor element 100'.

Figure 30:
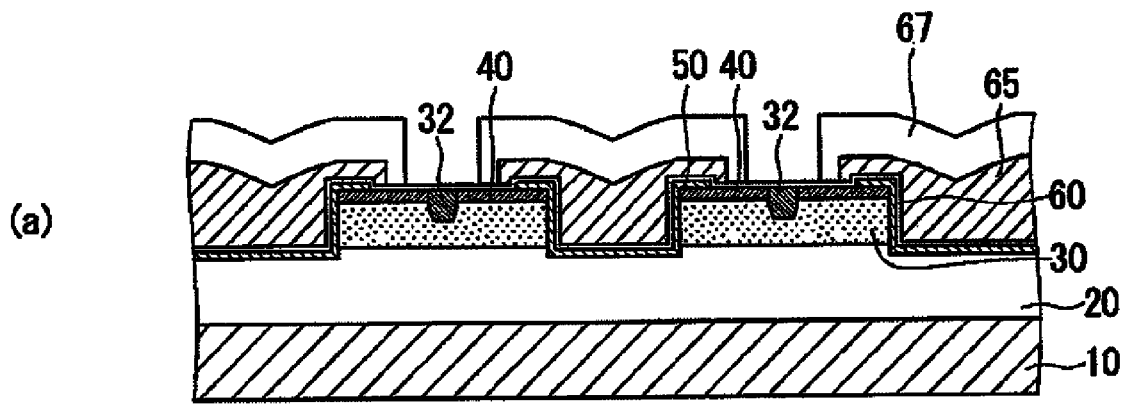
Figure 30:
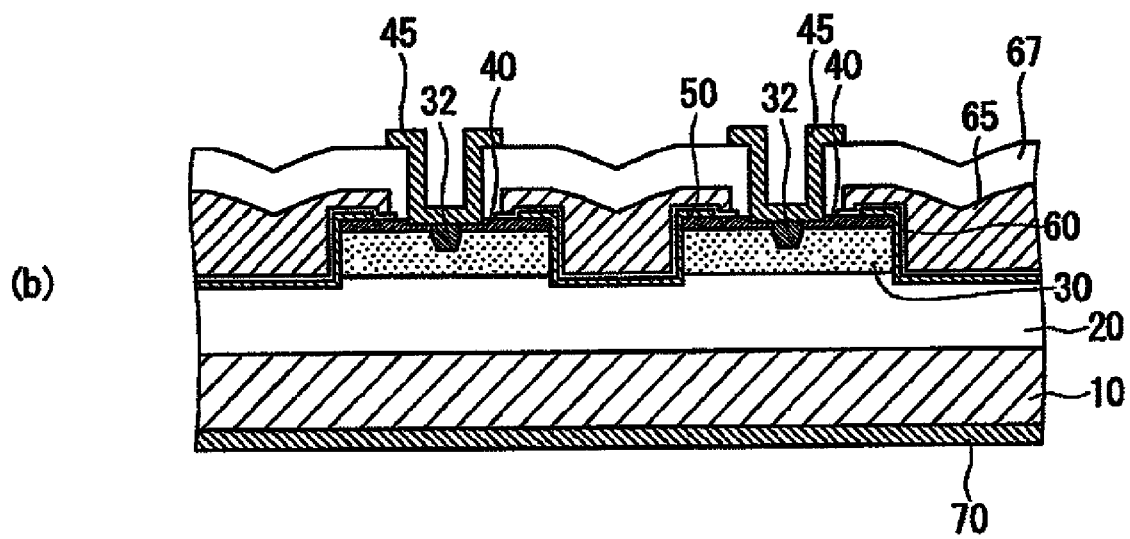

FIGS. 30(a) and 30(b) are cross-sectional views illustrating respective manufacturing process steps to fabricate the semiconductor element 100'.

Figure 31:
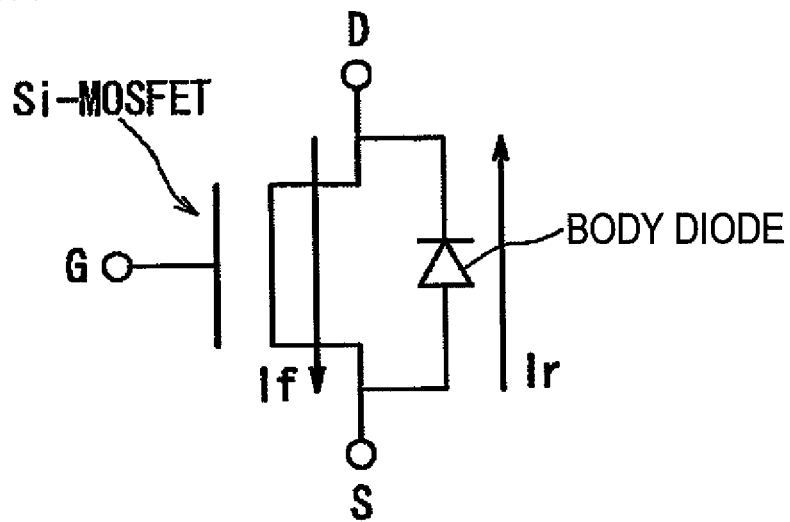

FIG. 31 illustrates an equivalent circuit consisting of an Si-MOSFET alone.

Figure 32:
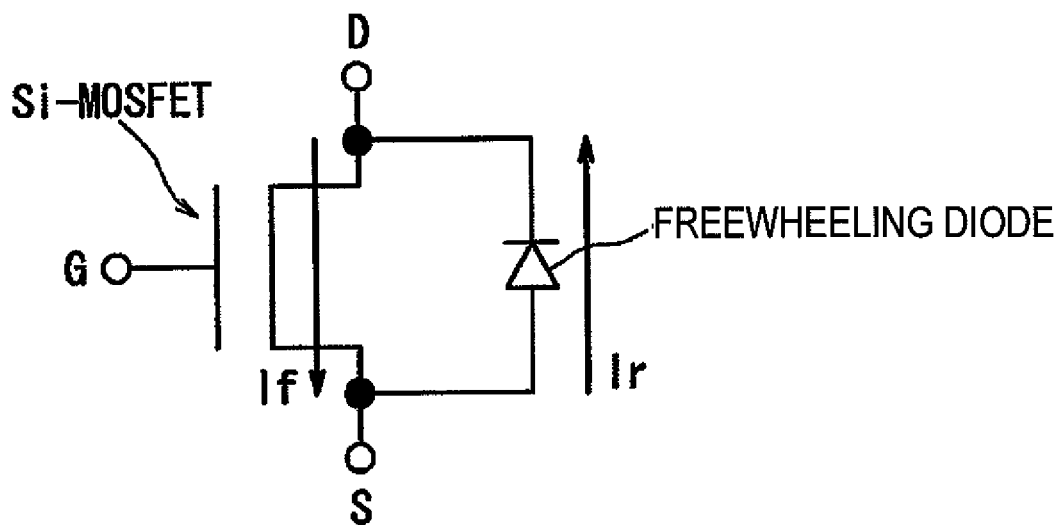

FIG. 32 illustrates an equivalent circuit including an Si-MOSFET and a freewheeling diode element in combination.

Figure 33:
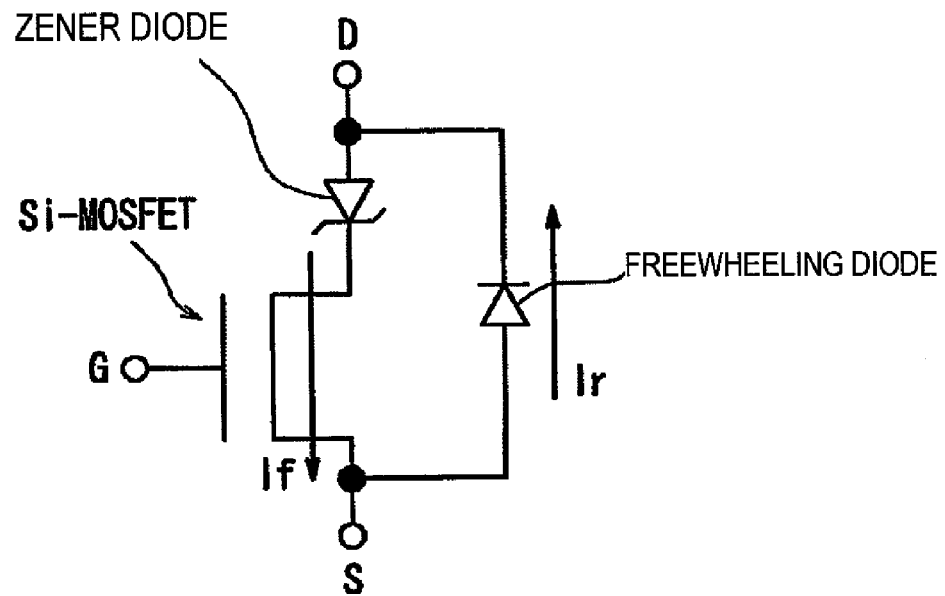

FIG. 33 illustrates an equivalent circuit including an Si-MOSFET and an SiC-SBD in combination.

Figure 34:
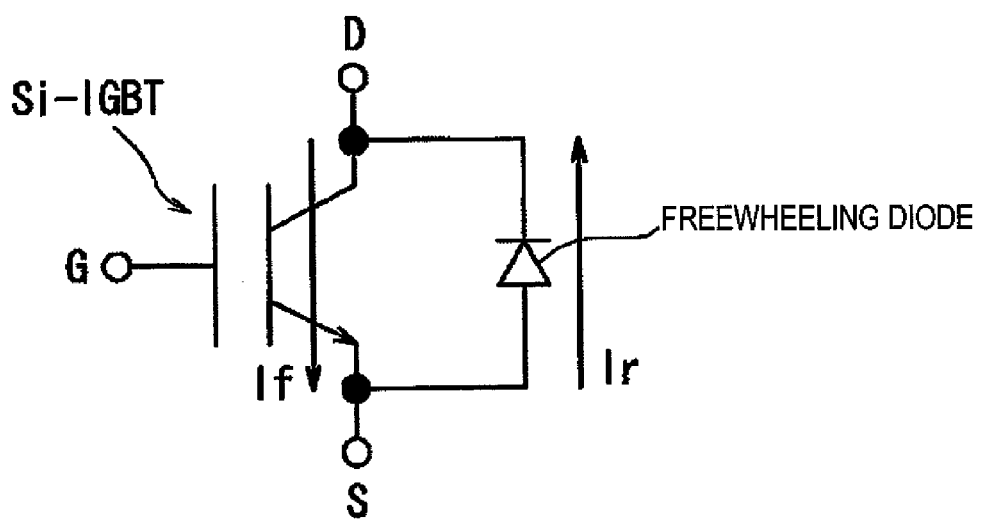

FIG. 34 illustrates an equivalent circuit including an Si-IGBT and a freewheeling diode in combination.

Figure 35:
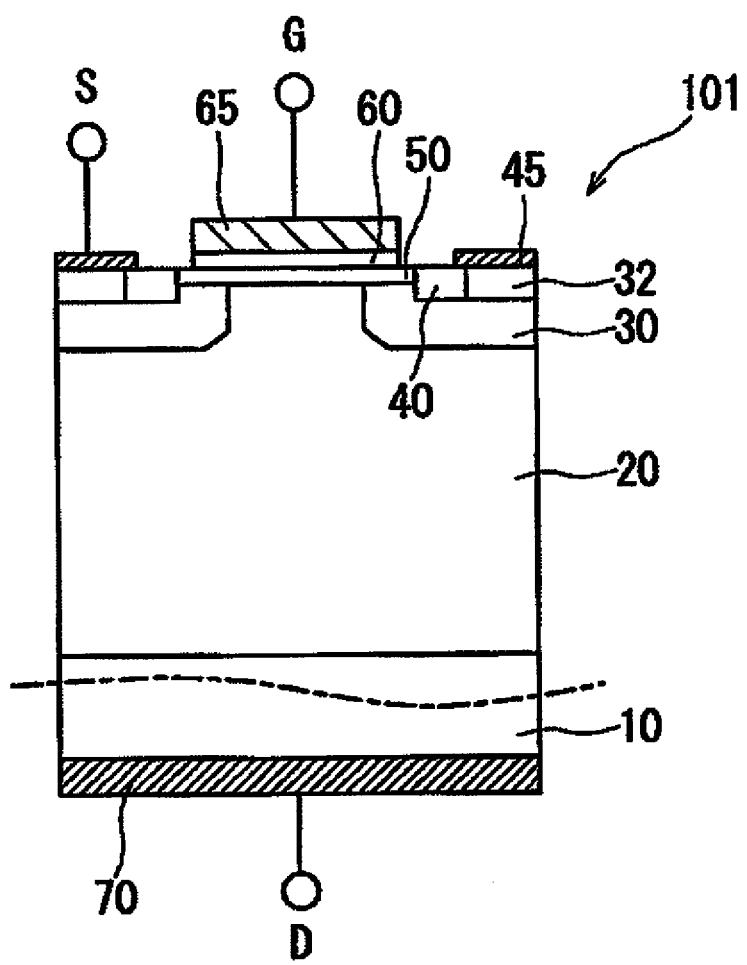

FIG. 35 is a cross-sectional view schematically illustrating the structure of a modified example of the semiconductor element 100.

Figure 36:
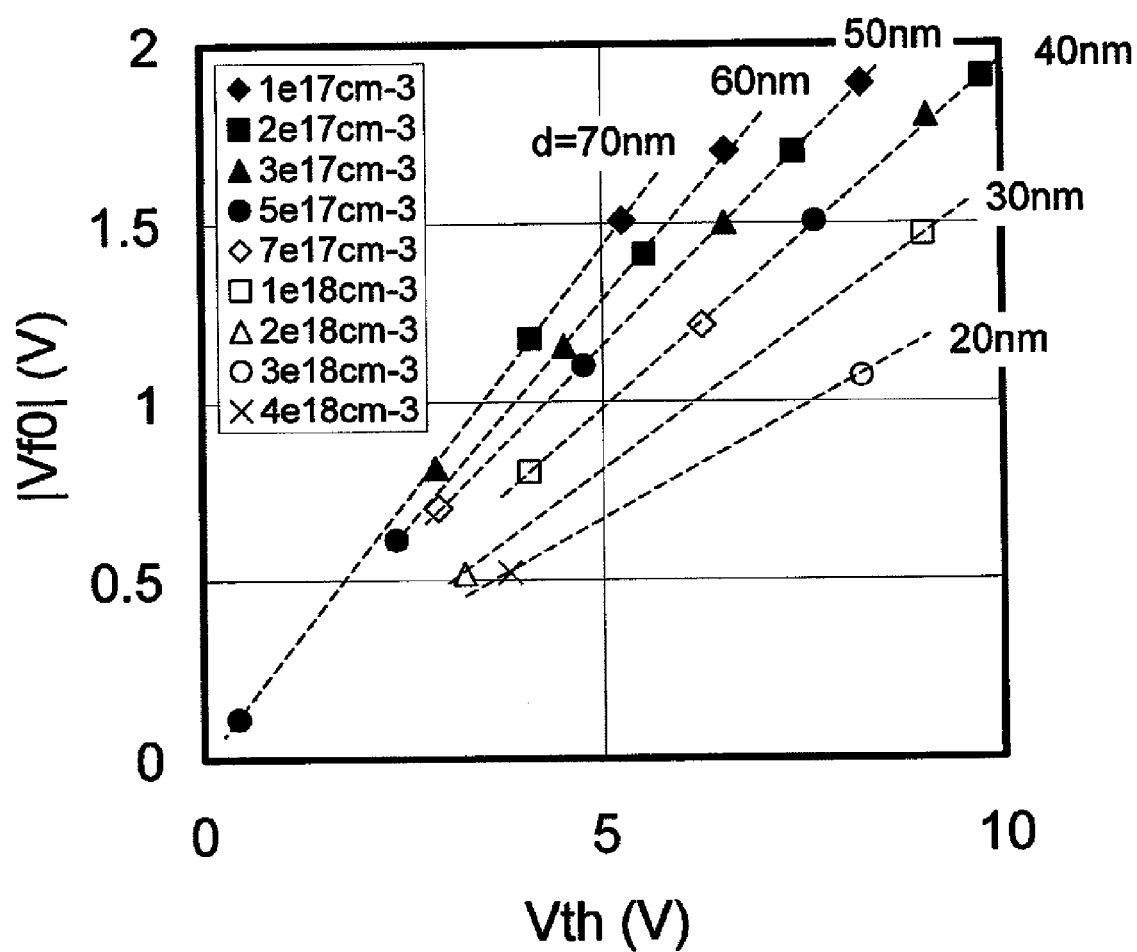

FIG. 36 shows a correlation between Vth of the forward current and Vf0 of a reverse current in a situation where the thickness and dopant concentration of the epitaxial channel layer 50 are changed.

DESCRIPTION OF EMBODIMENTS

A semiconductor device according to the present invention includes a semiconductor element including an MISFET and a potential setting section for setting a potential at the semiconductor element. The semiconductor element includes an MISFET, which includes a silicon carbide semiconductor layer that functions as a channel region, a gate electrode and a source electrode that are arranged on the principal surface of a substrate, and a drain electrode that is arranged on the back surface of the substrate. The potential setting section applies a potential, which is defined with respect to the potential of the source electrode to be equal to or higher than 0 V but less than the threshold voltage Vth of the transistor, to the gate electrode, thereby making the MISFET operate as a diode that makes current flow from the source electrode toward the drain electrode by way of the channel region.

The semiconductor element of the present invention further includes an MISFET, which includes a silicon carbide semiconductor layer that functions as a channel region, a gate electrode and a source electrode that are arranged on the principal surface of a substrate, and a drain electrode that is arranged on the back surface of the substrate. If the potential of the gate electrode with respect to the source electrode potential is equal to or higher than 0 V but less than the threshold voltage Vth of the transistor, this MISFET operates as a diode that makes current flow from the source electrode toward the drain electrode by way of the channel region.

Hereinafter, preferred embodiments of a semiconductor element according to the present invention will be described with reference to the accompanying drawings. It should be noted, however, that the present invention is in no way limited to the specific preferred embodiments to be described below.

A semiconductor element 100 as a preferred embodiment of the present invention will now be described with reference to FIGS. 5(a) and 5(b). FIG. 5(a) is a cross-sectional view schematically illustrating the structure of the semiconductor element 100 of this preferred embodiment. On the other hand, FIG. 5(b) illustrates the semiconductor element 100 of this preferred embodiment by a circuit symbol. Specifically, the diode symbol shown in FIG. 5(b) represents a diode that makes a current flow through the channel region of the semiconductor element 100. Also, in FIG. 5(b), G, S and D denote a gate electrode, a source electrode and a drain electrode, respectively.

In this description, the potential of the drain electrode D with respect to the potential of the source electrode S will be identified herein by Vds. The potential of the gate electrode G with respect to the potential of the source electrode S will be identified herein by Vgs. The direction of a current flowing from the drain electrode D toward the source electrode S is defined to be a "forward direction". And the direction of a current flowing from the source electrode S toward the drain electrode D is defined to be a "reverse direction". It should be noted that both potentials and voltages are expressed in volts (V).

The semiconductor element 100 of this preferred embodiment is a semiconductor element including an MISFET, of which the channel region functions as a diode under a predetermined condition.

As shown in FIG. 5(a), the semiconductor element 100 of this preferred embodiment includes a silicon carbide semiconductor substrate 10 of a first conductivity type and a first silicon carbide semiconductor layer 20 of the first conductivity type, which has been formed on the surface 10a of the substrate 10. In this preferred embodiment, the silicon carbide semiconductor substrate 10 is an $n^+$-substrate ($n^+$-SiC substrate) and the first silicon carbide semiconductor layer 20 is an $n^-$-drift layer. That is to say, according to this preferred embodiment, the first conductivity type is n type and the second conductivity type is p type. However, these n and p types may naturally be changed with each other. It should be noted that the superscript "+" or "−" added to the conductivity type "n" represents the relative concentration of the dopant introduced. That is to say, "$n^+$" means that the concentration of an n-type dopant added is higher than "n", while "$n^-$" means that the concentration of an n-type dopant added is lower than "n".

In the first silicon carbide semiconductor layer 20, defined is a body region (well region) 30 of the second conductivity type. And in the body region 30, defined is a source region 40 of the first conductivity type. In this preferred embodiment, the body region 30 has p-type and the source region 40 has $n^+$-type.

A p-type contact region 32 is further defined in the body region 30. And a source electrode 45 is arranged on the source region 40. Specifically, the source electrode 45 covers the surface of both the $n^+$-source region 40 and the p-contact region 32 and is electrically in contact with both of the $n^+$-source region 40 and the p-contact region 32.

A surface region of the first silicon carbide semiconductor layer ($n^-$-drift layer) 20, which is interposed between the right- and left-hand side portions of the body region 30, functions as a JFET (junction field effect transistor) region.

On the first silicon carbide semiconductor layer 20, a second silicon carbide semiconductor layer 50 has been formed so as to be at least partially in contact with the p-body region 30 and the $n^+$-source region 40. In this preferred embodiment, the second silicon carbide semiconductor layer 50 has been grown epitaxially on the $n^-$-drift layer 20 in which the p-body region 30 and the $n^+$-source region 40 have been defined. A portion of the second silicon carbide semiconductor layer 50, which is located over the p-body region 30, functions as a channel region 55. In this description, the second silicon carbide semiconductor layer 50 will be referred to herein as an "epitaxial channel layer". The length of the channel region 55 (which will be referred to herein as a "channel length") is as indicated by each of the two double-headed arrows shown in FIG. 5(a). That is to say, the "channel length" of the MISFET is defined by a horizontal size measured on the upper surface of the p-body region 30 (i.e., the surface that contacts with the epitaxial channel layer 50) on the paper.

A gate insulating film 60 has been formed on the epitaxial channel layer 50. A gate electrode 65 is arranged on the gate insulating film 60. And a drain electrode 70 is arranged on the back surface 10b of the substrate 10.

The threshold voltage of the MISFET as a semiconductor element 100 (i.e., the threshold voltage of its forward current) is identified by Vth. If Vgs≥Vth is satisfied (i.e., in a transistor turned-ON mode), the MISFET makes the drain electrode 70 and the source electrode 45 electrically conductive with each other through the epitaxial channel layer 50 (because an ON-state current flows from the drain electrode 70 toward the source electrode 45 when Vds>0 V). On the other hand, if Vgs<Vth is satisfied, then the transistor turns OFF.

However, even if 0 V≤Vgs<Vth is satisfied in the transistor turned-OFF mode, this MISFET does function as a diode that makes a current flow from the source electrode 45 toward the drain electrode 70 through the epitaxial channel layer 50 when Vds<0 V. In this description, such a diode that makes a current flow from a source electrode toward a drain electrode through a channel layer will sometimes be referred to herein as a "channel diode". Since the direction of a current flowing from the drain electrode 70 toward the source electrode 45 is defined herein to be the "forward direction" and the direction of a current flowing from the source electrode 45 toward the drain electrode 70 is defined herein to be the "reverse direction", the direction in which current flows in that diode is the "reverse direction".

This diode (channel diode) that uses the channel region of the MISFET as a current path has such a characteristic that does not make a current of 1 mA or more flow if Vds>Vf0 (where Vf0 is a negative value) is satisfied but does make a current of 1 mA or more flow if Vds≤Vf0 is satisfied. In other words, the current that flows through this diode is almost zero (i.e., less than 1 mA) if Vds>Vf0 (where Vf0 is a negative value) is satisfied. However, as Vds is gradually decreased from zero (i.e., as the absolute value of Vds is gradually increased), Vds will soon get equal to Vf0, when this diode will start to make a current of 1 mA flow. And as the absolute value of Vds is further increased, the amount of the current flowing will further increase. In this sense, Vf0 corresponds to the "turn-on voltage" as defined in the current-voltage characteristic of a diode.

In this description, the "turn-on voltage" in the current-voltage characteristic of a diode is defined separately for a semiconductor element with a big current-carrying capacity in which a current of 1 A or more flows through an MISFET in ON state (when Vgs is sufficiently greater than Vth and Vds is equal to 1 V so that a rated current flows) and for a semiconductor element with a small current-carrying capacity in which a current of less than 1 A flows.

In the former semiconductor element (i.e., a semiconductor element with a big current-carrying capacity), a voltage that is a forward bias voltage for a diode is supposed to be applied to the diode. If the absolute value of the current flowing through the diode becomes equal to or greater than 1 mA, the diode current is supposed to be "turned ON". And the voltage Vf0 applied to the diode when the absolute value of the current flowing through the diode becomes equal to or greater than 1 mA is defined herein to be the "turn-on voltage". As for the latter semiconductor element (i.e., a semiconductor element with a small current-carrying capacity), on the other hand, the voltage Vf0 applied to the diode when the amount of current flowing through the diode is one-thousandth of that of current flowing through the MISFET in ON state where Vds is 1 V is defined herein to be its "turn-on voltage".

According to the present invention, the potential setting section applies a predetermined potential to the gate electrode of the semiconductor element 100. And the process step of making the drain electrode 70 and the source electrode 45 electrically conductive with each other through the epitaxial channel layer 50 by raising Vgs to Vth or more in this manner is carried out. In addition, the process step of making the MISFET function as a "diode" that makes a current flow in the reverse direction from the source electrode 45 toward the drain electrode 70 through the epitaxial channel layer 50 by having the potential setting section set Vgs to be equal to or higher than 0 V but less than the gate threshold voltage Vth is also carried out.

Also, according to the present invention, the absolute value of Vf0 (representing the turn-on voltage of the diode) is set to be smaller than 2.7 V for the reasons to be described later.

As the semiconductor element 100 of this preferred embodiment has such a structure, the diode current 90 when the semiconductor element 100 functions as a diode flows from the source electrode 45 toward the drain electrode 70 through the epitaxial channel layer 50. The path of the diode current 90 is quite different from that of a current 92 that flows through a parasitic body diode (which is formed by the pn junction between the body region 30 and the semiconductor layer 20).

In the semiconductor element 100 of this preferred embodiment, the diode current is made to flow through the channel region, not the body diode formed by the pn junction, and therefore, the diode can have a lower turn-on voltage than the body diode. Consequently, the conduction loss can be cut down.

The turn-on voltage of a pn junction diode depends on the magnitude of the bandgap of its semiconductor material. With a wide bandgap semiconductor such as a silicon carbide semiconductor, the diode has a particularly high turn-on voltage, and therefore, the turn-on voltage can be reduced particularly effectively by the present invention.

In the semiconductor element 100 of this preferred embodiment, the diode current 90 is made to flow through the epitaxial channel layer 50. As a result, the increase in the number of crystal imperfections that would otherwise be caused by supplying a forward current to the pn junction of a silicon carbide semiconductor can be avoided. On top of that, since the diode that makes a current flow through the epitaxial channel layer performs a unipolar operation, not a bipolar operation using holes and electrons that move through a pn junction, the reverse recovery current can be reduced. As a result, the loss involved by the reverse recovery current and the switching loss can both be reduced, and the diode can be switched at increased rates.

If the switching loss can be reduced, the switching frequency can be increased. Then, the capacitance value of a capacitor as a passive component and the inductance value of a reactor as a passive component can be both reduced. Consequently, the sizes of the capacitor and the reactor and their cost can be cut down. On top of that, since the number of members required can be decreased, the parasitic inductance, parasitic reactance and parasitic resistance of the circuit can all be reduced. As a result, the loss can be cut down. What is more, since the noise can also be reduced, the sizes and cost of a capacitor and a reactor that form a noise filter can also be reduced.

In addition, with the semiconductor element 100 of this preferred embodiment, there is no need to use the freewheeling diode element 1200 of the inverter circuit 1000 and the number of members required can be reduced. As a result, the circuit cost can be cut down significantly.

Hereinafter, it will be further described with reference to FIG. 6 how the semiconductor element 100 of this preferred embodiment operates.

Figure 6:
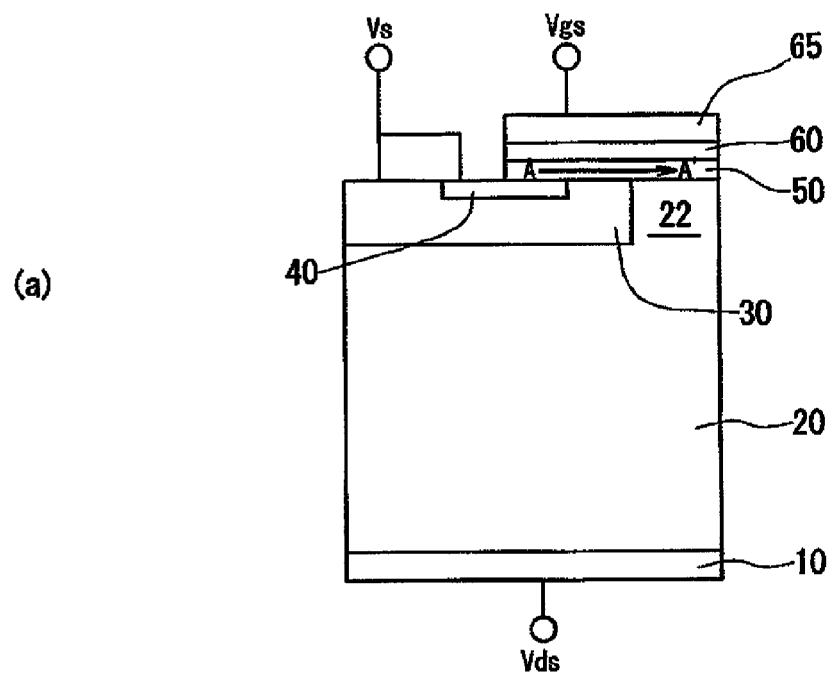
FIG. 6(a) is a cross-sectional view illustrating a conduction band energy distribution at the interface between a channel region 55 and a gate insulating film 60.
FIGS. 6(b) and 6(c) are graphs showing conduction band energy distributions in the channel width direction when current flows in the forward direction and when current flows in the reverse direction, respectively.
Figure 6:
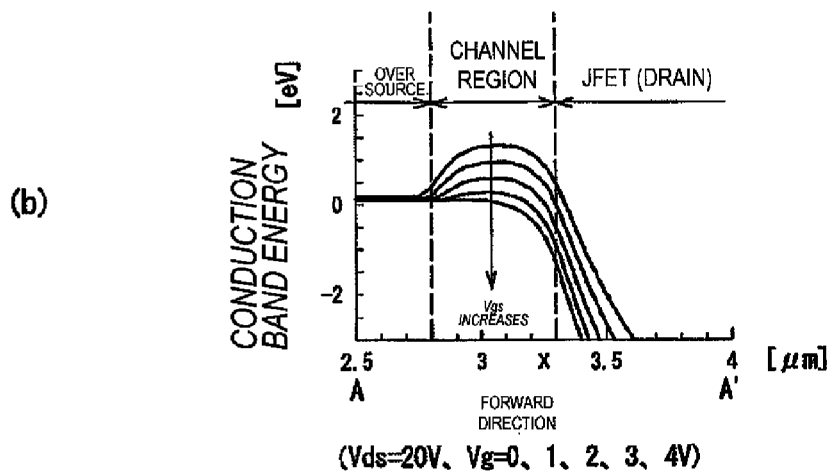
Figure 6:
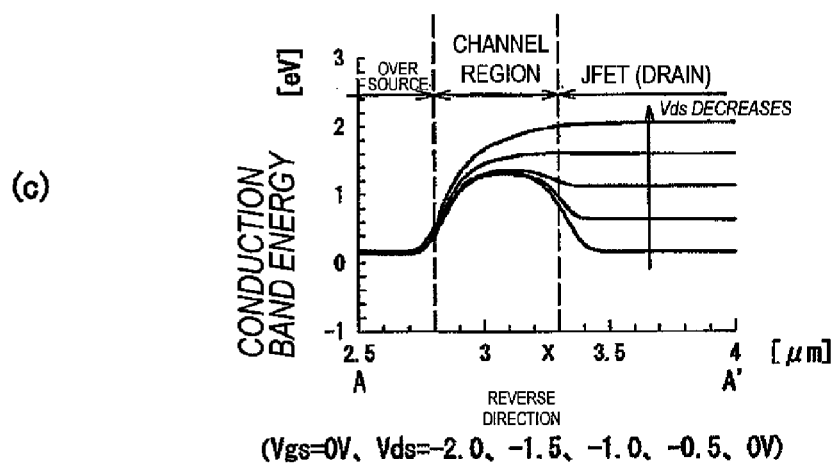

FIG. 6 illustrates the conduction band energy distribution at the interface between the epitaxial channel layer 50 and the gate insulating film 60. Specifically, FIG. 6(a) illustrates a structural model for use to calculate the conduction band energy distribution. And the line A-A' shown in FIG. 6(a) corresponds to the axis of abscissas [µm] shown in FIGS. 6(b) and 6(c), which show conduction band energy distributions in the channel width direction when current flows in the forward direction and when current flows in the reverse direction, respectively. In FIGS. 6(b) and 6(c), the ordinate represents the conduction band energy [eV].

First of all, a situation where current flows in the forward direction (i.e., a situation where Vds is greater than 0 V) will be described. As shown in FIG. 6(b), in the forward direction, a region of the epitaxial channel layer 50 that contacts with the p-body region (or p-well) 30 has a higher conduction band energy (i.e., the conduction band energy of the channel region 55) than other regions of the epitaxial channel layer 50 that are located over the source region 40 and the JFET region (i.e., drain region) 22, and therefore, no carriers flow in such a situation.

Thereafter, as Vgs is increased from 0 V in the positive direction, the channel region 55 comes to have decreased conduction band energy, and eventually the barrier between the region of the epitaxial channel layer 50 that is located over the source region 40 and the channel region 55 disappears. As a result, carriers flow from the source region 40 into the channel region 55.

Next, a situation where current flows in the reverse direction (i.e., a situation where Vds is less than 0 V) will be described. As Vds, which is initially equal to 0 V, is gradually decreased from 0 V, a region of the epitaxial channel layer 50, which is located over the JFET region (drain region) 22, comes to have an increased conduction band energy as shown in FIG. 6(c), and the barrier between the JFET region 22 and the channel region 55 decreases its height. As a result, carriers (electrons) flow from the region over the JFET region (drain region) 22.

That is to say, the reverse current starts to flow through the epitaxial channel layer 50 (or the channel region 55) before flowing through the body diode. Since the reverse current flows through the epitaxial channel layer 50, this semiconductor element 100 performs a unipolar operation as in the situation where a forward current flows through the MISFET (or MOSFET). Consequently, no reverse recovery current is generated and no recovery loss is caused, either. Also, the semiconductor element 100 can have a lower turn-on voltage than what is defined by the diffusion potential of the pn junction of SiC that is a wide bandgap semiconductor.

In sum, in the semiconductor element 100 of this preferred embodiment, in the forward direction, the conduction band energy of the channel region 55 decreases and current flows upon the application of a gate voltage as shown in FIG. 6(b). In the reverse direction, on the other hand, as the conduction band energy rises on the drain side, the energy barrier between the channel and drain decreases its height as shown in FIG. 6(c), and current flows as a result.

Next, a characteristic of the semiconductor element 100 will be described with reference to FIG. 7, which shows the I-V characteristic (at room temperature) of a sample semiconductor element 100 that was made by the present inventors. The sample semiconductor element 100 was a DMOSFET (doubled implanted MOSFET) of SiC, which is a kind of MISFET, and had the same structure as the counterpart shown in FIG. 5. In the graph shown in FIG. 7, the abscissa represents Vds and the ordinate represents the value of current flowing in the forward direction from the drain electrode toward the source electrode. If current flows in the reverse direction from the source electrode toward the drain electrode, the current is supposed to have a negative value.

The I-V characteristics in the case of the forward direction (where Vds>0V) are represented by curves that were plotted when Vgs=0 V, 5 V, 10 V, 15 V and 20 V, respectively. On the other hand, the I-V characteristic in the case of the reverse direction (where Vds≤0 V) is represented by a curve that was plotted when Vgs=0 V.

Figure 7:
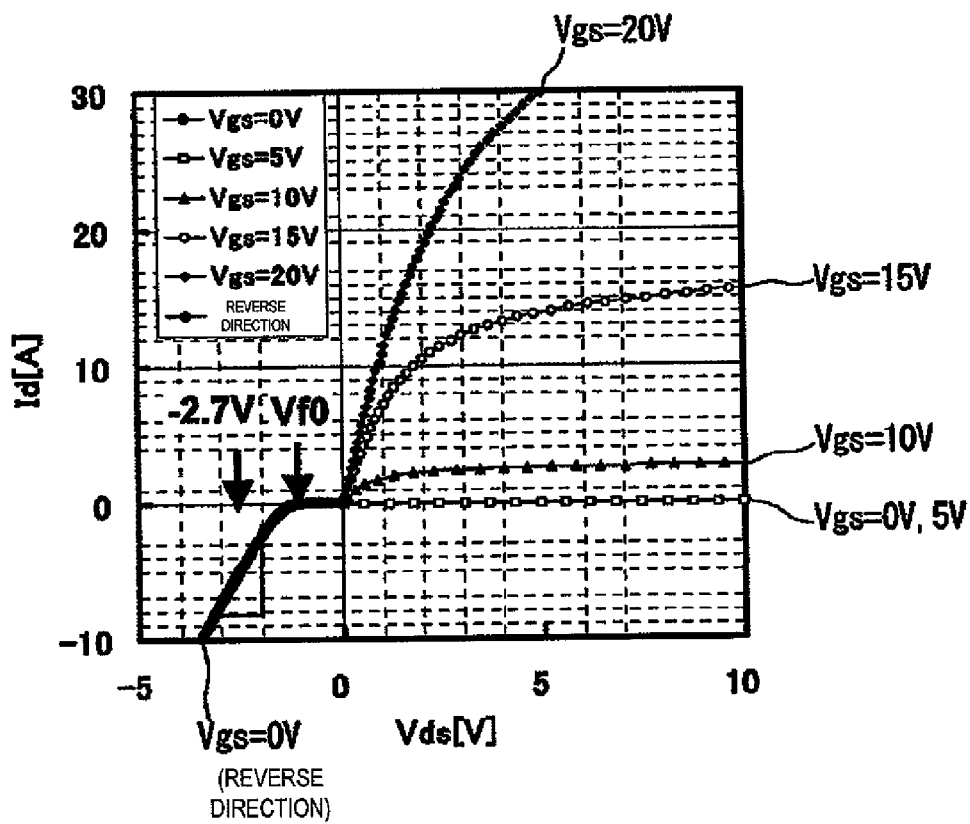
FIG. 7 shows the I-V characteristic of a semiconductor element 100.

As can be seen from FIG. 7, in the semiconductor element 100, the turn-on voltage (e.g., around 1 V) of the reverse current (represented by the absolute value of Vf0) is smaller than 2.7 V that is the pn diffusion potential of SiC. It can be seen that since the turn-on voltage of the reverse current (represented by the absolute value of Vf0) is lower than that of the body diode, the diode current flows through the channel region of the MISFET, not the body diode formed by the pn junction. Consequently, by using this semiconductor element 100, the conduction loss can be reduced. The turn-on voltage of a pn junction diode depends on the magnitude of the bandgap of its semiconductor material. With a wide bandgap semiconductor such as a silicon carbide semiconductor, the body diode has a particularly high turn-on voltage, and therefore, the turn-on voltage can be reduced particularly effectively by the present invention.

Figure 8:
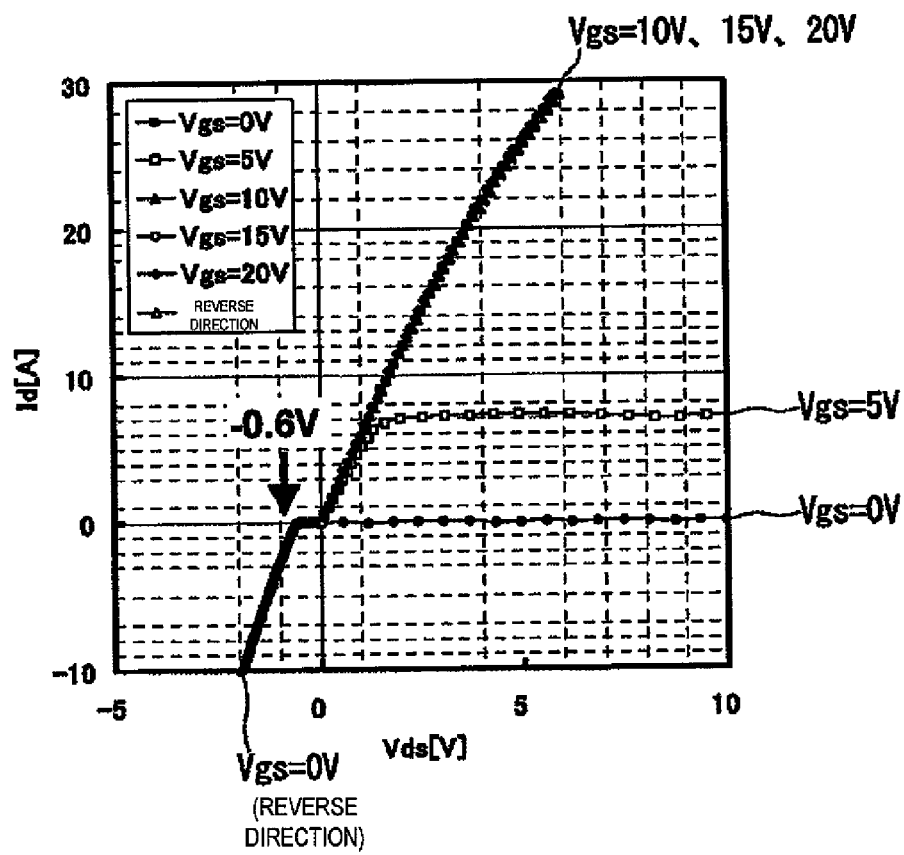
FIG. 8 shows, as a comparative example, the I-V characteristic of a Si-MOSFET.

FIG. 8 shows, as a comparative example, the I-V characteristic of an Si-MOSFET at room temperature. In this comparative example, the threshold value Vf0 of the reverse current has an absolute value of 0.6 V. In this case, the reverse current flows through the body diode, and the turn-on voltage of the reverse current is the turn-on voltage of the pn junction that functions as a body diode. Si has a lower dielectric breakdown voltage than SiC. That is why to achieve a breakdown voltage as high as that of SiC in this comparative example, at least the drift layer needs to have an increased thickness and a decreased dopant concentration. As a result, the Si-MOSFET will cause more conduction loss than an SiC-MISFET that has the same breakdown voltage as the Si-MOSFET. On top of that, since Si has a small bandgap of 1.1 eV, the leakage current to flow through the pn junction increases at approximately 150° C. Consequently, when an Si-MOSFET is used, the MOSFET can operate only within a limited temperature range.

Figure 9:
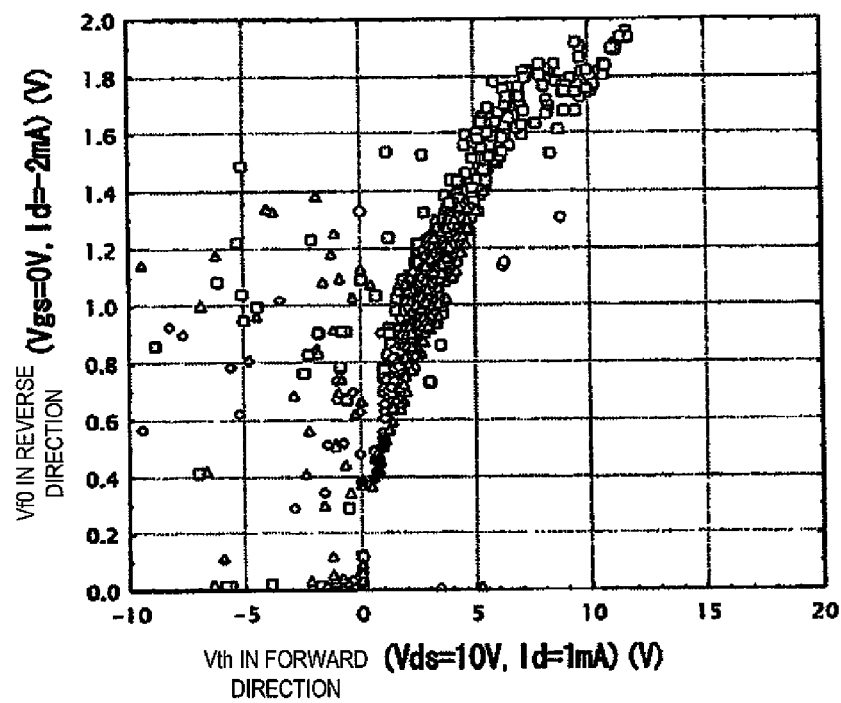
FIGS. 9(a) and 9(b) show correlations between Vth of a forward current and Vf0 of a reverse current.
Figure 9:
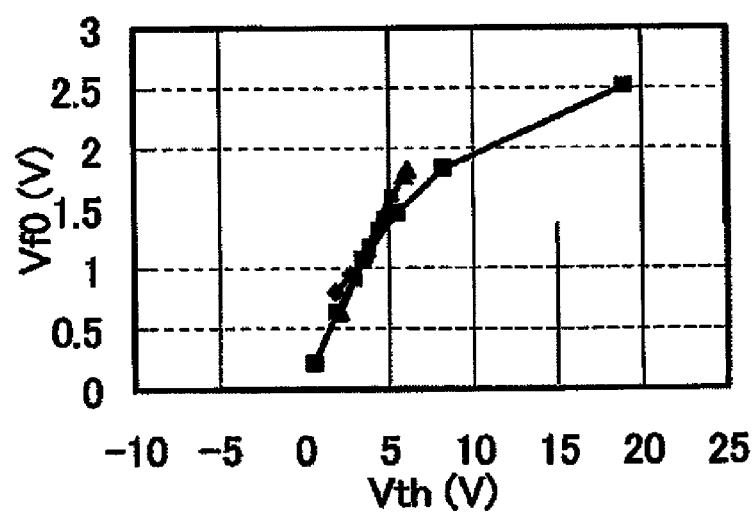

FIG. 9 shows a correlation between the threshold voltage Vth of the forward current and the turn-on voltage Vf0 of the reverse current. Specifically, the correlation shown in FIG. 9(a) was plotted based on the data that was obtained by making actual measurements on samples. In this graph, a voltage when the amount of current Id flowing reached 2 mA was adopted as the turn-on voltage Vf0 of the reverse current. The dopant concentration in the body region and the thickness of the gate insulating film were supposed to be fixed. On the other hand, FIG. 9(b) shows a correlation that was obtained by carrying out simulations on multiple structures that had some MOSFET element parameters (such as the thickness of the epitaxial channel layer 50 or its concentration) changed.

As can be seen from FIG. 9(a), the lower Vth, the smaller |Vf0|. The same trend is observed in FIG. 9(b), too. In this case, the semiconductor element 100 of this preferred embodiment preferably has as small |Vf0| as possible but it is still preferred that the threshold voltage Vth of the forward current be equal to or greater than 2 V. The reasons are as follows.

Figure 1:
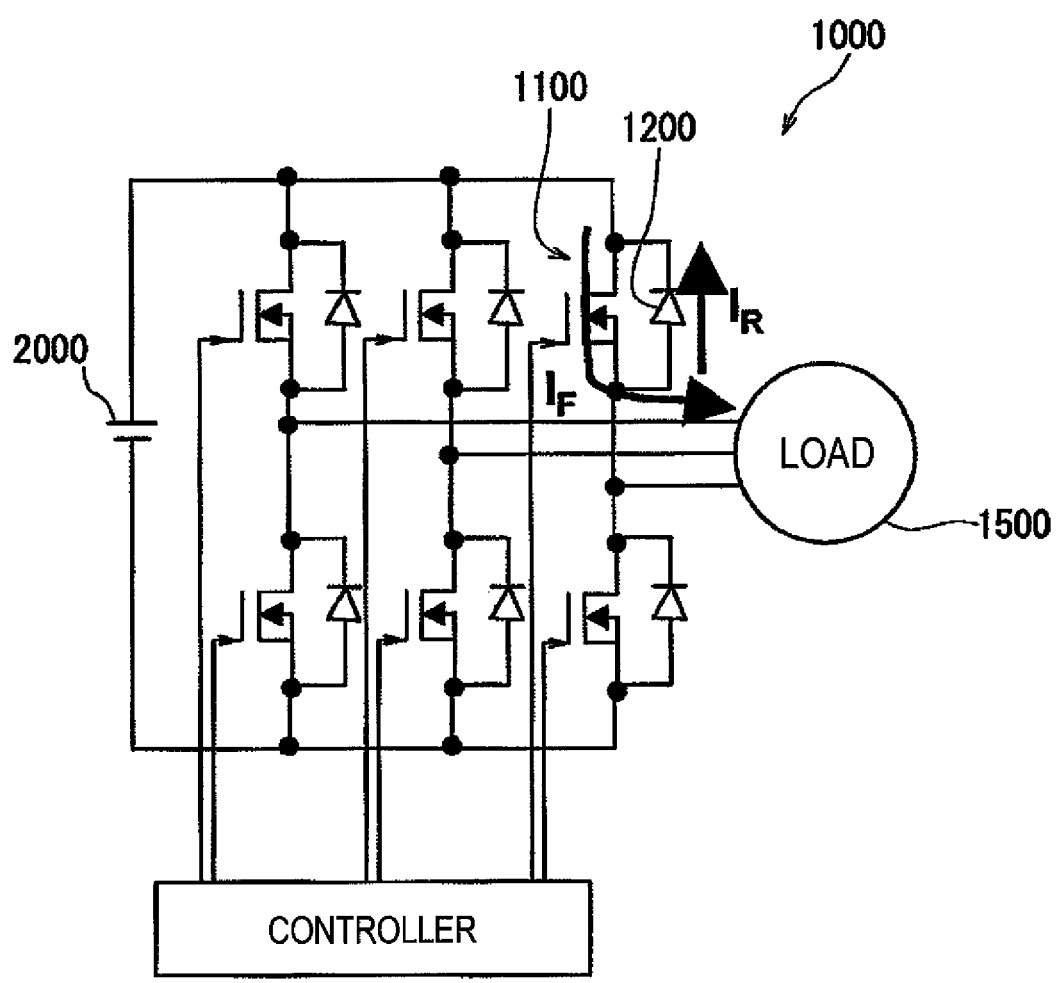
FIG. 1 is a circuit diagram illustrating a typical configuration for an inverter circuit 1000.
Figure 2:
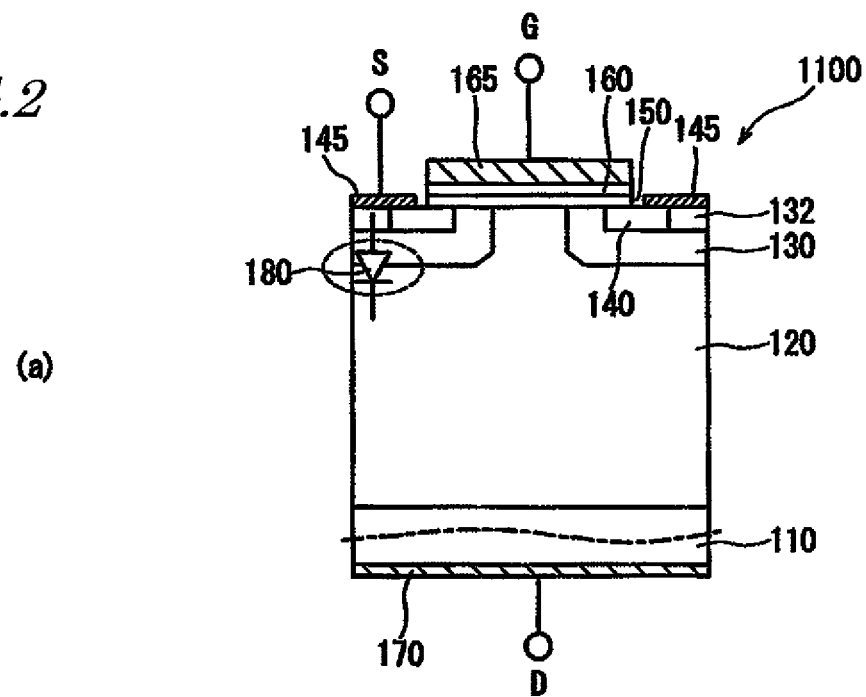
FIG. 2(a) is a cross-sectional view illustrating a semiconductor element (SiC-MISFET) 1100 and FIG. 2(b) is a cross-sectional view illustrating a semiconductor element (SiC-IGBT) 1110.
Figure 2:
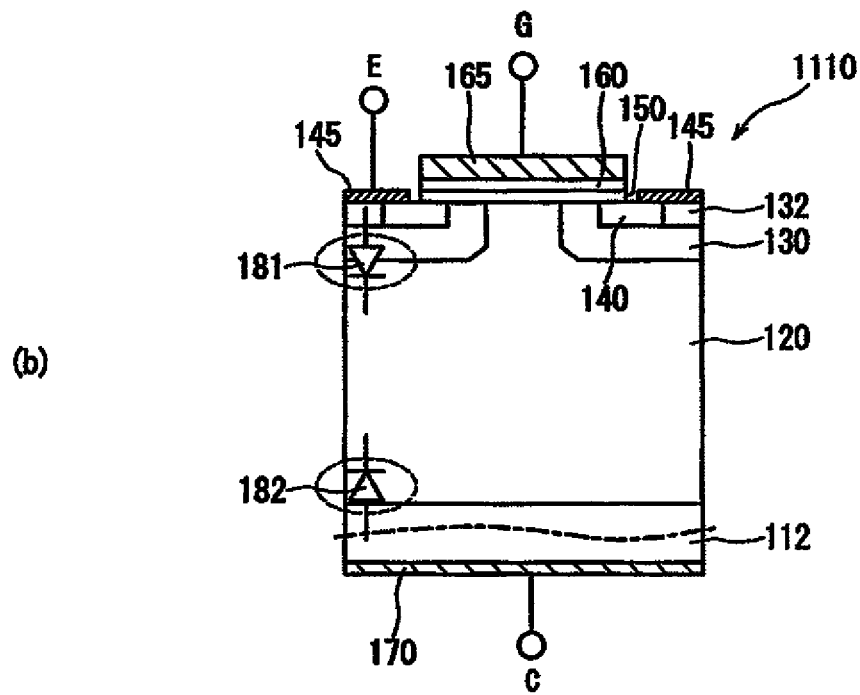
Figure 3:
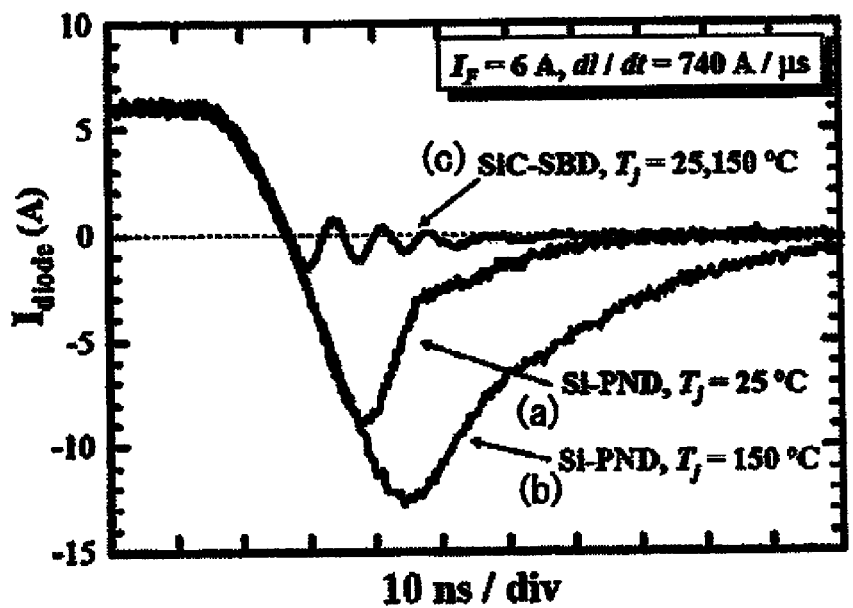
FIG. 3 is a graph showing how a reverse recovery current flows in a pn junction diode.
Figure 4:
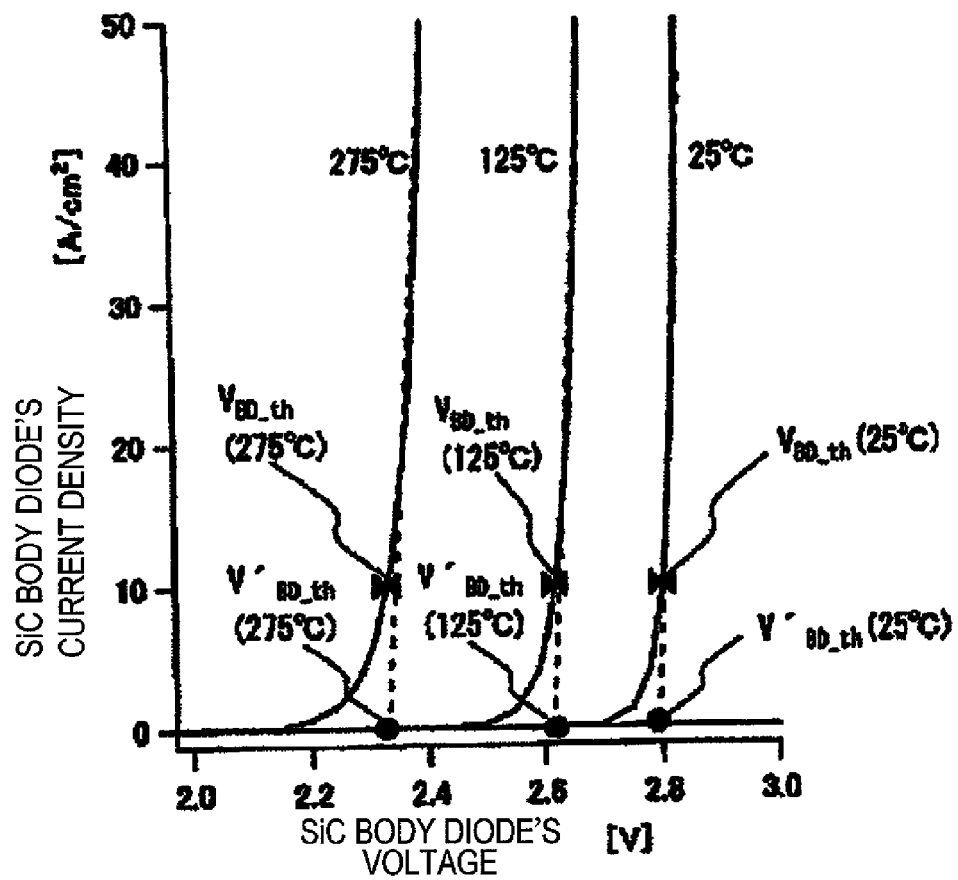
FIG. 4 is a graph showing turn-on voltages of a SiC body diode.

It is preferred that semiconductor elements (MISFETs) 1100, which are generally used in the inverter circuit 1000 that is a power circuit as shown in FIG. 1, be in Normally OFF state (Vth>0 V). This is because even if the gate controller went out of order for some reason to have a gate voltage of 0 V, the drain current could still be shut off and it would be safer then. In addition, the threshold voltage of an MISFET decreases at high temperatures. As for an SiC-MOSFET, for example, its threshold voltage decreases by about 1 V as the temperature rises by 100° C. In this case, if the noise margin is supposed to be 1 V to prevent noise from turning the gate ON accidentally, it is preferred that Vth at room temperature be set to be equal to or greater than 2 V (=1 V+1 V).

Consequently, the threshold voltage Vth of the forward current should be relatively high and yet the absolute value |Vf0| of the turn-on voltage Vf0 of the reverse current should be as low as possible, although these are mutually contradictory requirements.

The present inventors carried out intensive researches to see if those contradictory requirements could be satisfied. As a result, the present inventors discovered via experiments that the absolute value |Vf0| of the turn-on voltage Vf0 of the reverse current could be controlled by adjusting the dopant concentration and thickness of the channel layer. Unlike an inverted MISFET with no channel layers, the MISFET that is a semiconductor element of the present invention has a channel layer. Thus, the present inventors discovered that by not only adjusting the dopant concentration and thickness of the channel layer but also setting the dopant concentration of the p-body region and the thickness of the gate insulating film to be appropriate values, the threshold voltage Vth of the forward current and the absolute value |Vf0| of the turn-on voltage Vf0 of the reverse current could be controlled independently of each other.

FIG. 36 shows a correlation between the threshold voltage Vth of the forward current and the absolute value |Vf0| of the turn-on voltage Vf0 of the reverse current in the semiconductor element of the present invention. In FIG. 36, the abscissa represents the threshold voltage Vth of the forward current and the ordinate represents the absolute value |Vf0| of the turn-on voltage Vf0 of the reverse current. When simulations were carried out to collect the data plotted in this graph, the concentration of the p-type body region (well region) was fixed at $1 \times 10^{19}$ cm$^{-3}$, and the thickness of the gate insulating film was fixed at 70 nm. Other parameters were set to fall within the following ranges:

thickness of the epitaxial channel layer: 20 to 70 nm
concentration of the epitaxial channel layer: $1 \times 10^{17}$ to $4 \times 10^{18}$ cm$^{-3}$ The results shown in FIG. 36 reveal that by decreasing the thickness of the epitaxial channel layer and increasing the dopant concentration of the epitaxial channel layer, Vth can be increased with |Vf0| fixed. That is why Vth and |Vf0| can be controlled independently of each other by setting the dopant concentration and thickness of the epitaxial channel layer to be appropriate values.

As an example, it will be described with reference to FIG. 36 how to set the thickness and dopant concentration of the epitaxial channel layer in a situation where Vth is controlled to be 5 V and |Vf0| is controlled to be 1 V.

First of all, it needs to be determined what epitaxial channel layer thickness is associated with the correlation line that passes the intersection between Vth=5 V and |Vf0|=1 V. According to the data shown in FIG. 36, that epitaxial channel layer thickness turns out to be approximately 40 nm. For that reason, the thickness of the epitaxial channel layer is set to be 40 nm. Next, it needs to be determined at what dopant concentration Vth=5 V is satisfied if the epitaxial channel layer has that thickness. In this case, the dopant concentration may be set to be approximately $8.5 \times 10^{17}$ cm$^{-3}$, which is an intermediate value between the two concentrations at which data was collected (i.e., between $7 \times 10^{17}$ cm$^{-3}$ and $1 \times 10^{18}$ cm$^{-3}$).

By setting the thickness and dopant concentration of the second silicon carbide semiconductor layer (i.e., the epitaxial channel layer) in this manner, the semiconductor element of the present invention can set the absolute value of the turn-on voltage of the diode through the channel to be smaller than that of the turn-on voltage of the body diode.

FIGS. 10A through 10D are graphs showing what ranges the thickness d (nm) and dopant (donor) concentration N (cm$^{-3}$) of the epitaxial channel layer 50 should fall in to make the absolute value |Vf0| of the turn-on voltage Vf0 of the reverse current fall within the predetermined range. In these four graphs, the ordinate represents the dopant concentration [cm$^{-3}$] of the epitaxial channel layer and the abscissa represents the thickness [nm] of the epitaxial channel layer. For example, the ordinate [1E+20] means $1 \times 10^{20}$. The dots were put on these graphs by plotting the values obtained by simulations. When the simulations were made to obtain the results shown in these drawings, the parameters fell within the following ranges:

thickness of the gate insulating film: 60 to 120 nm,
concentration of the p-body region (well region): $2 \times 10^{18}$ to $2 \times 10^{19}$ cm$^{-3}$,
thickness of the epitaxial channel layer: 10 to 70 nm, and
concentration of the epitaxial channel layer: $1 \times 10^{17}$ to $1.5 \times 10^{19}$ cm$^{-3}$ In any of these cases, adjustments were made so that the threshold voltage Vth of the forward current became equal to or higher than 0 V (i.e., so that the MISFET was in Normally OFF state).

In FIGS. 10A through 10D, (i) through (v) are lines indicating respective boundary regions. These lines can be represented by the following equations:

Line (i) is represented by:

$$N = b_0 \times d\char`\^ a_0,$$

$$b_0 = 1.349 \times 10^{21} \text{ and}$$

$$a_0 = -1.824$$

Line (ii) is represented by:

$$N = b_{0.6} \times d\char`\^ a_{0.6},$$

$$b_{0.6} = 7.609 \times 10^{20}, \text{ and}$$

$$a_{0.6} = -1.881$$

Line (iii) is represented by:

$$N = b_1 \times d\char`\^ a_1,$$

$$b_1 = 2.188 \times 10^{20} \text{ and}$$

$$a_1 = -1.683$$

Line (iv) is represented by:

$$N = b_{1.3} \times d\char`\^ a_{1.3},$$

$$b_{1.3} = 2.399 \times 10^{20} \text{ and}$$

$$a_{1.3} = -1.774$$

Line (v) is represented by:

$$N = b_2 \times d\char`\^ a_2,$$

$$b_2 = 5.754 \times 10^{20} \text{ and}$$

$$a_2 = -2.380$$

where ^ indicates a power. For example, "A^B" means $A^B$.

Figure 10A:
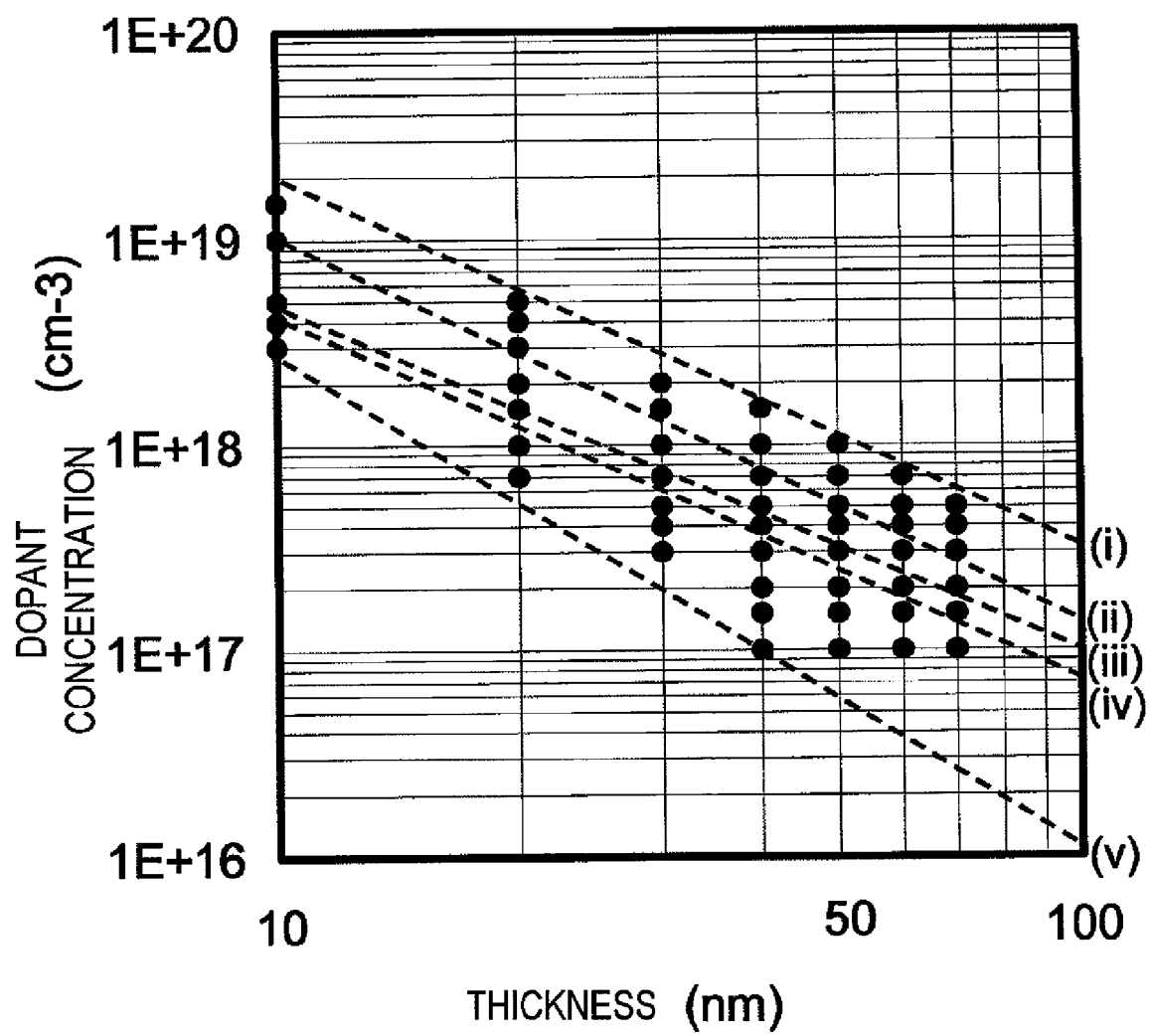
FIG. 10A is a graph showing where the absolute value |Vf0| of the turn-on voltage Vf0 of a reverse current fall within the predetermined range if the thickness and dopant concentration of the epitaxial channel layer 50 are changed.

For example, to satisfy $0 < |Vf0| \leq 2.0$ V, the thickness d (nm) and dopant concentration N (cm$^{-3}$) of the epitaxial channel layer 50 should fall within the range that is interposed between Lines (i) and (v), i.e., $b_2 \times d\char`\^ a_2 \leq N < b_0 \times d\char`\^ a_0$ should be satisfied (see FIG. 10A).

Figure 10B:
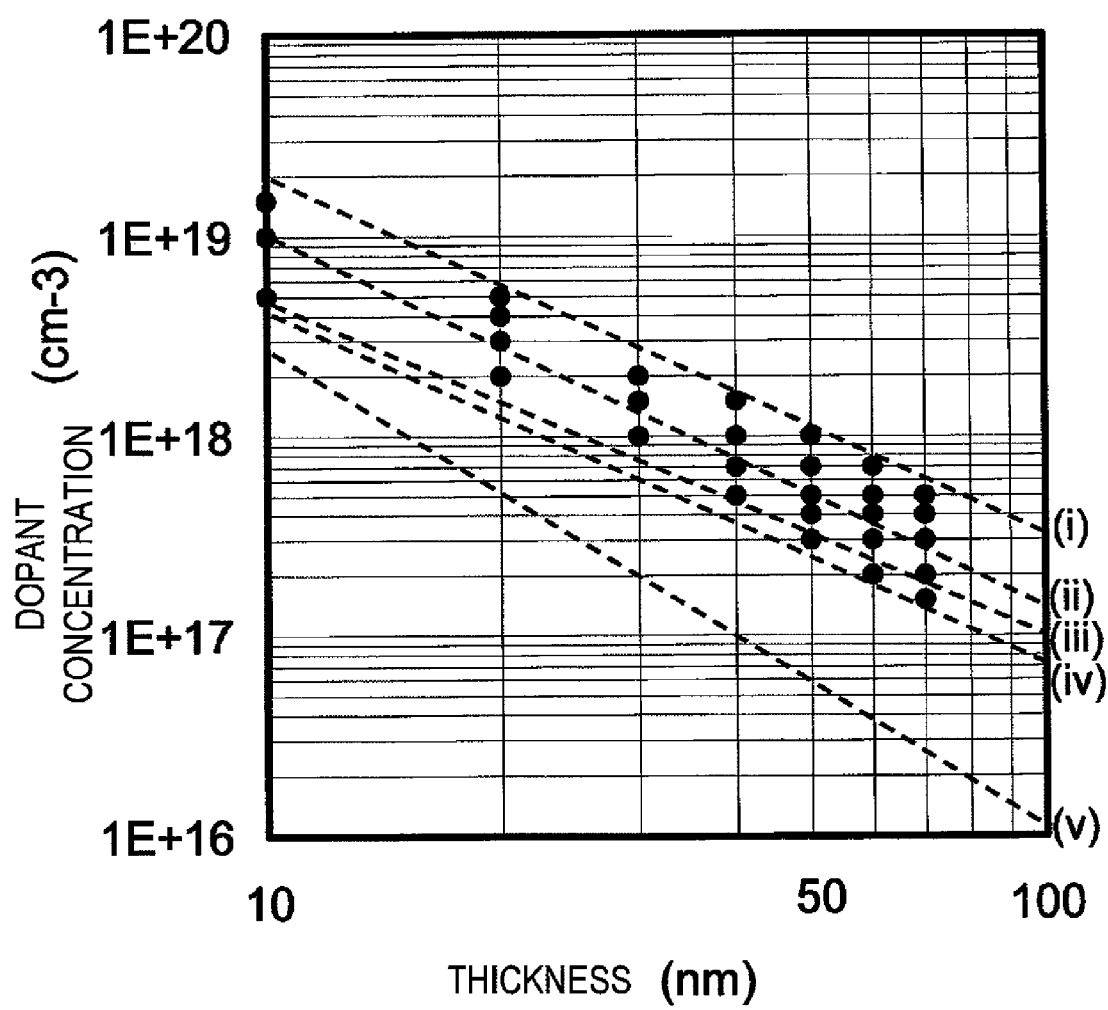
FIG. 10B is a graph showing where the absolute value |Vf0| of the turn-on voltage Vf0 of a reverse current fall within the predetermined range if the thickness and dopant concentration of the epitaxial channel layer 50 are changed.

To satisfy $0 < |Vf0| \leq 1.3$ V, the thickness d (nm) and dopant concentration N (cm$^{-3}$) of the epitaxial channel layer 50 should fall within the range that is interposed between Lines (i) and (iv), i.e., $b_{1.3} \times d\char`\^ a_{1.3} \leq N < b_0 \times d\char`\^ a_0$ should be satisfied (see FIG. 10B).

Figure 10C:
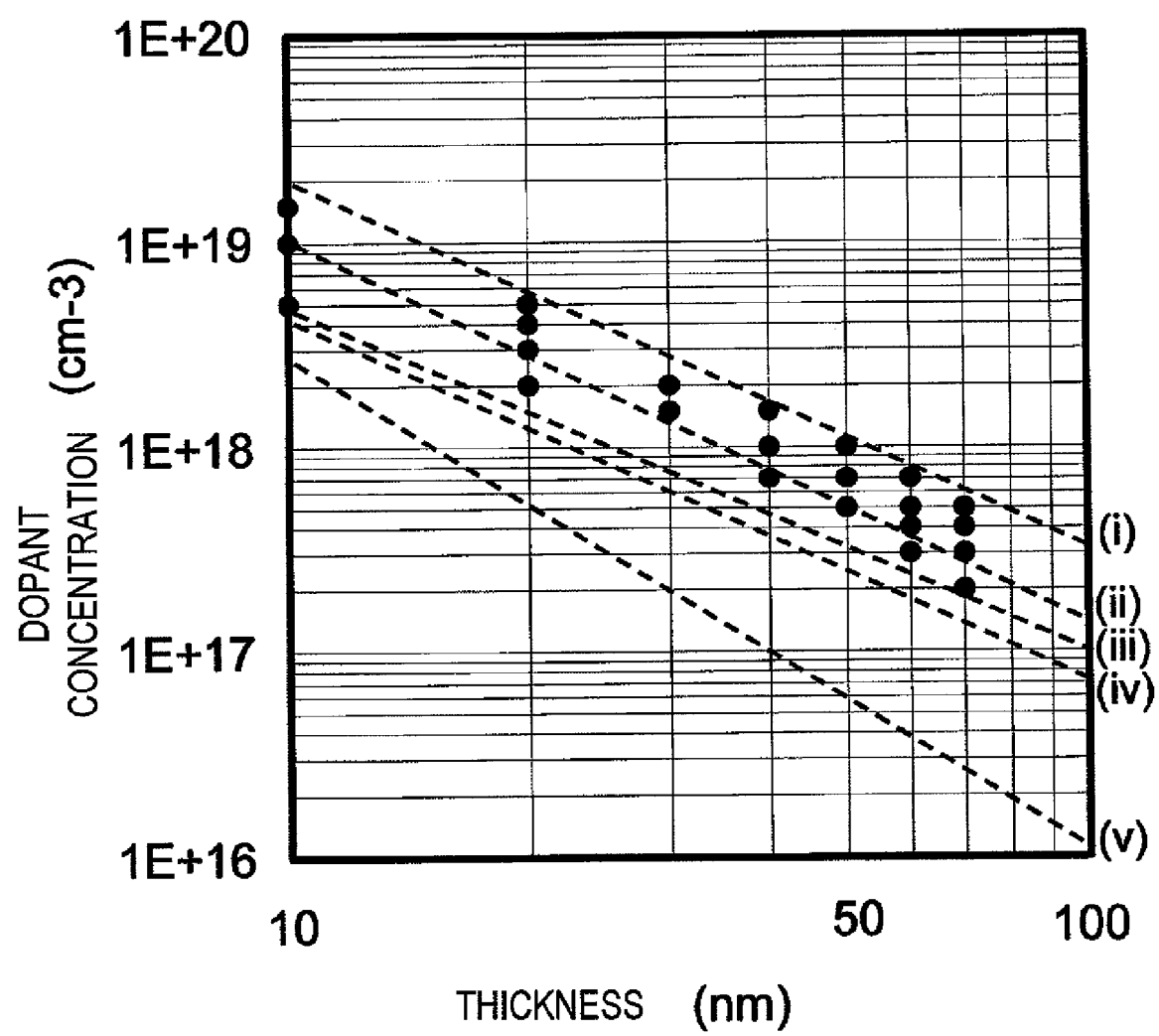
FIG. 10C is a graph showing where the absolute value |Vf0| of the turn-on voltage Vf0 of a reverse current fall within the predetermined range if the thickness and dopant concentration of the epitaxial channel layer 50 are changed.

To satisfy $0 < |Vf0| \leq 1.0$ V, the thickness d (nm) and dopant concentration N (cm$^{-3}$) of the epitaxial channel layer 50 should fall within the range that is interposed between Lines (i) and (iii), i.e., $b_1 \times d\char`\^ a_1 \leq N < b_0 \times d\char`\^ a_0$ should be satisfied (see FIG. 10C).

Figure 10D:
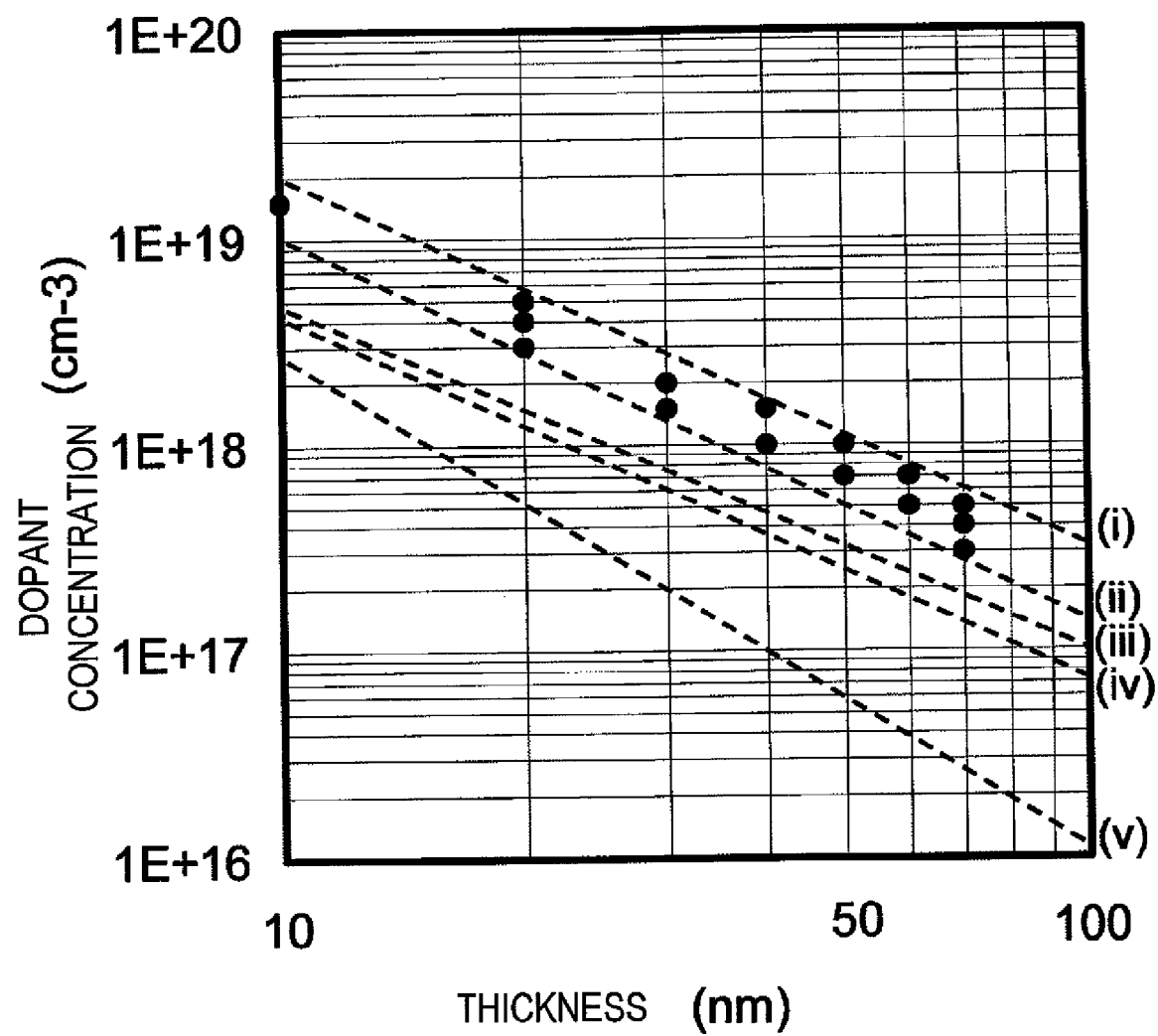
FIG. 10D is a graph showing where the absolute value |Vf0| of the turn-on voltage Vf0 of a reverse current fall within the predetermined range if the thickness and dopant concentration of the epitaxial channel layer 50 are changed.

To satisfy $0 < |Vf0| \leq 0.6$ V, the thickness d (nm) and dopant concentration N (cm$^{-3}$) of the epitaxial channel layer 50 should fall within the range that is interposed between Lines (i) and (ii), i.e., $b_{0.6} \times d\char`\^ a_{0.6} \leq N < b_0 \times d\char`\^ a_0$ should be satisfied (see FIG. 10D).

These graphs were plotted within the ranges of the simulation parameters. However, even if there are any data points that are outside of the simulation parameter ranges but if N and d fall within the ranges indicated by those mathematical equations, then $0 < |Vf0| \leq 2.0$ V, $0 < |Vf0| \leq 1.3$ V, $0 < |Vf0| \leq 1.0$V, and $0 < |Vf0| \leq 0.6$ V should still be satisfied.

For example, if $0 < |Vf0| \leq 0.6$ V should be satisfied, the thickness d and dopant concentration N of the epitaxial channel layer 50 that fall within the range that is interposed between Lines (i) and (ii) are selected. For example, the dopant concentration and thickness of the epitaxial channel layer 50 may be set to be $4 \times 10^{18}$ cm$^{-3}$ and 20 nm, respectively. Furthermore, to obtain an intended Vth (which may be within the range of 2 V through 8 V in this example), the concentration of the p-body region 30 and the thickness of the gate insulating film 60 are set. For example, by setting the dopant (acceptor) concentration of the p-body region 30 to be $1 \times 10^{19}$ cm$^{-3}$ and the thickness of the gate insulating film 60 to be 70 nm, |Vf0| can be approximately equal to 0.5 V. As a result, Vth can also be approximately equal to 3.8 V.

The concentration of the p-body region 30 and the thickness of the gate insulating film 60 may be appropriately determined in view of the device performance required and various constraints imposed on the manufacturing process.

It is preferred that the epitaxial channel layer have a thickness d of at least 5 nm. The reason is that by setting the thickness d of the epitaxial channel layer to be 5 nm or more, no part of the epitaxial channel layer would disappear even if any variation were caused in the film deposition or patterning process.

It is more preferred that the epitaxial channel layer have a thickness d of 10 nm or more. This is because by setting the thickness d of the epitaxial channel layer to be 10 nm or more, the uniformity in the thickness of the epitaxial channel layer can be increased.

It is even more preferred that the epitaxial channel layer have a thickness d of 20 nm or more. This is because by setting the thickness d of the epitaxial channel layer to be 20 nm or more, the uniformity in the thickness of the epitaxial channel layer can be further increased. That is to say, the epitaxial channel layer can be deposited with more stability.

Nevertheless, the thickness d of the epitaxial channel layer is preferably at most equal to 200 nm. The reason is that if the thickness d of the epitaxial channel layer is 200 nm or less, it will not take so long a time to get the process step of etching the epitaxial channel layer to form a source electrode done.

It is more preferred that the epitaxial channel layer have a thickness d of 100 nm or less. This is because by setting the thickness d of the epitaxial channel layer to be 100 nm or less, an adequate threshold voltage Vth and a small turn-on voltage |Vf0| for the freewheeling diode can be easily obtained at the same time when the semiconductor element of the present invention is used as an MISFET.

It is even more preferred that the epitaxial channel layer have a thickness d of 75 nm or less. This is because by setting the thickness d of the epitaxial channel layer to be 75 nm or less, an adequate threshold voltage Vth and a small turn-on voltage |Vf0| for the freewheeling diode can be obtained more easily at the same time when the semiconductor element of the present invention is used as an MISFET.

The turn-on voltage of the channel diode at room temperature is preferably as small as possible. This is because in that case, the voltage directly applied to the pn junction of the silicon carbide semiconductor can be kept equal to or lower than 2.7 V, which is the turn-on voltage of the body diode, and the increase in the number of crystal imperfections that would be caused by supplying a forward current to the pn junction of the silicon carbide semiconductor can be avoided. This point will be described with reference to FIG. 5. For example, if |Vf0| is about 0.6 V and if a potential of 0 V and a potential of −0.6 V or less are applied to the source and drain, respectively, then the semiconductor element functions as a diode. In that case, the current flows along the path 90 through the channel region 55. Next, even if a potential of 0 V and a potential of −2.7 V are applied to the source and drain, respectively, the diode current also flows along the path 90, not along the path 92. The reason will be described below. Specifically, if a potential of 0 V and a potential greater than −2.7 V are applied to the source and drain, respectively, the diode current flows along the path 90 first. In this case, the path 90 includes the substrate 10 and the drift layer 20. Supposing the current flowing is identified by I, the substrate resistance is identified by Rsub, and the resistance in a portion of the drift layer 20 that is located under the p-well region 30 is identified by Rd, the voltage drops by I×(Rsub+Rd) between the p-well region 30 and the drain. The voltage applied to between the p-well region 30 and the drift layer 20 is obtained by subtracting I×(Rsub+Rd) from the source-drain voltage. That is to say, even if a voltage of 2.7 V, at which current could flow through the body diode, is applied as the source-drain voltage, $$Vpn=|Vds|I\times(Rsub+Rd)$$

(where |Vds| represents the source-drain voltage and Vpn represents the voltage applied to the pn junction of the body diode) is satisfied because there is a channel diode in parallel with the body diode. The smaller |Vf0| of the channel diode represented by the path 90, the greater the ratio of I to the same |Vds| and the smaller the voltage Vpn applied to the pn junction of the body diode. Consequently, the voltage Vpn applied to the pn junction of the body diode fails to reach 2.7 V, at which current should start to flow through the body diode. As a result, no current flows through the body diode. That is to say, the increase in the number of crystal imperfections that would be caused by supplying a forward current to the pn junction of the silicon carbide semiconductor can be avoided.

Since SiC is a wide bandgap semiconductor, |Vf0| at room temperature is preferably 1.3 V or less in order to prevent current from flowing through the body diode even in a high-temperature environment in which SIC can be used at an environmental temperature of 300° C. or more, which is much higher than that of Si.

Also, |Vf0| at room temperature is preferably less than 1.0 V, and more preferably less than 0.6 V. The reasons are as follows. If |Vf0| at room temperature is less than 1.0 V, the performance achieved will be better than that of an SiC-SBD (of which the reverse current has a turn-on voltage of about 1.0 V and which is) used as a freewheeling diode element. Also, if |Vf0| at room temperature is less than 0.6 V, the performance achieved will be better than that of an Si-pin diode (of which the reverse current has a turn-on voltage of about 0.6 V and which is) used as a freewheeling diode element.

Figure 11:
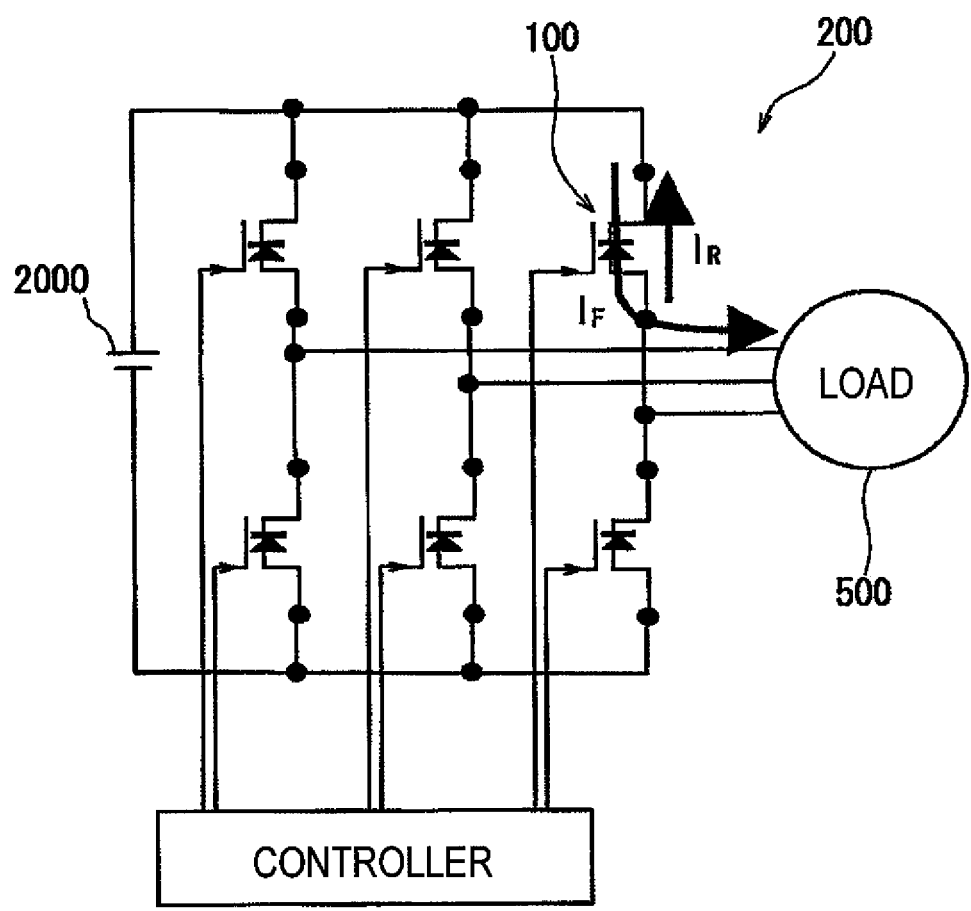
FIG. 11 is a circuit diagram illustrating the configuration of a power converter 200 which uses the semiconductor elements 100 of a preferred embodiment of the present invention.

FIG. 11 illustrates a power converter 200 (which is implemented as an inverter circuit and) which uses the semiconductor elements 100 of this preferred embodiment, a load 500, a power supply 2000 and a controller. Since the semiconductor element 100 of this preferred embodiment is an MISFET that also functions as a freewheeling diode, the freewheeling diode element 1200 shown in FIG. 1 is no longer necessary. That is why although the single inverter circuit 1000 shown in FIG. 1 needs six semiconductor elements 1100 and six freewheeling diode elements 1200 (i.e., twelve elements in total), the inverter circuit 200 can be formed of only six elements if the semiconductor elements 100 of this preferred embodiment shown in FIG. 11 are used. In this case, the controller is equivalent to the potential setting section of the present invention. The controller controls the potential applied to the gate of each semiconductor element 100. For example, the controller controls the gate potential of each semiconductor element so that the gate potential changes from Vgs>Vth into Vgs=0 V and vice versa.

Also, the semiconductor elements 100 and the controller are equivalent to the semiconductor device of the present invention. The semiconductor device of the present invention includes a terminal that is electrically connected to the power supply 2000 and further includes a terminal to be electrically connected to an inductive load 500.

The inverter circuit 200 of this preferred embodiment needs only a half as many parts as the conventional inverter circuit 1000, and therefore, can cut down the cost significantly. In addition, since the number of parts required can be reduced, the loss (such as the connection loss) caused by each element can be reduced, and the inverter circuit 200 can have improved performance, compared to the conventional inverter circuit 1000. On top of that, according to the configuration of this preferred embodiment, since the number of parts required can be only a half as many as the inverter circuit 1000, the inverter circuit 200 can have a smaller size and a lighter weight than the inverter circuit 1000 or can reduce the noise significantly.

What is more, as the number of parts required can be reduced, the parasitic capacitance C and/or the parasitic inductance L can be reduced. As a result, the loss can be cut down for that reason, too, and the problem of electromagnetic interference (i.e., a noise problem) can be relieved. Furthermore, since the loss can be cut down, the quantity of heat generated by the inverter circuit 200 can be smaller than the conventional one. As a result, the heat sink can have a smaller size or the cooling means measure to take can be a simpler one. On top of that, once the loss can be cut down, the frequency can be increased (e.g., doubled), and the volumes of the conductor element C and the inductor element L used can be halved. Consequently, the size and weight of the elements to use can be reduced and the overall cost can be cut down.

In the preferred embodiment described above, the present invention is supposed to be implemented as an inverter circuit. However, the semiconductor elements 100 of this preferred embodiment can be used extensively to make any power converter including an inverter, a converter and a matrix converter. Furthermore, as long as the semiconductor elements 100 can be used, the present invention does not have to be implemented as such a power converter but may also be applied to any other kind of circuit (e.g., a digital circuit such as a logic circuit) as well. The power supply does not have to be a DC power supply but may also be an AC power supply as well. Any appropriate power supply may be selected according to the intended application of the circuit.

Hereinafter, the semiconductor element 100 of the present invention will be further described with reference to FIGS. 12 through 16.

The present inventors carried out simulations and analysis to see how the characteristic would change with the addition of the epitaxial channel layer 50 compared to the situation where there is no epitaxial channel layer 50.

Figure 12:
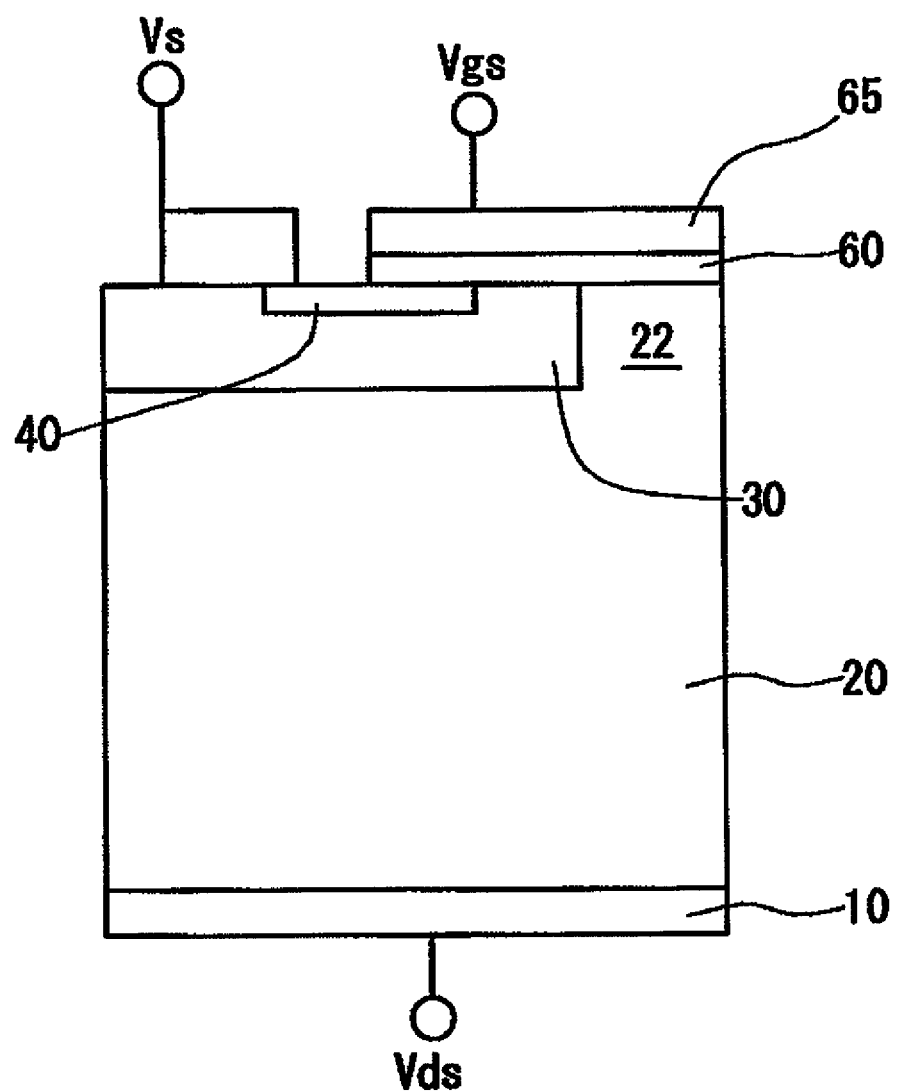
FIG. 12 is a cross-sectional view illustrating the structure of a semiconductor element with no epitaxial channel layer 50 which was used in simulations.

FIG. 12 is a cross-sectional view illustrating a semiconductor element with no epitaxial channel layer 50 (which is implemented as an inverted MISFET and) which was used in the simulations.

Figure 13:
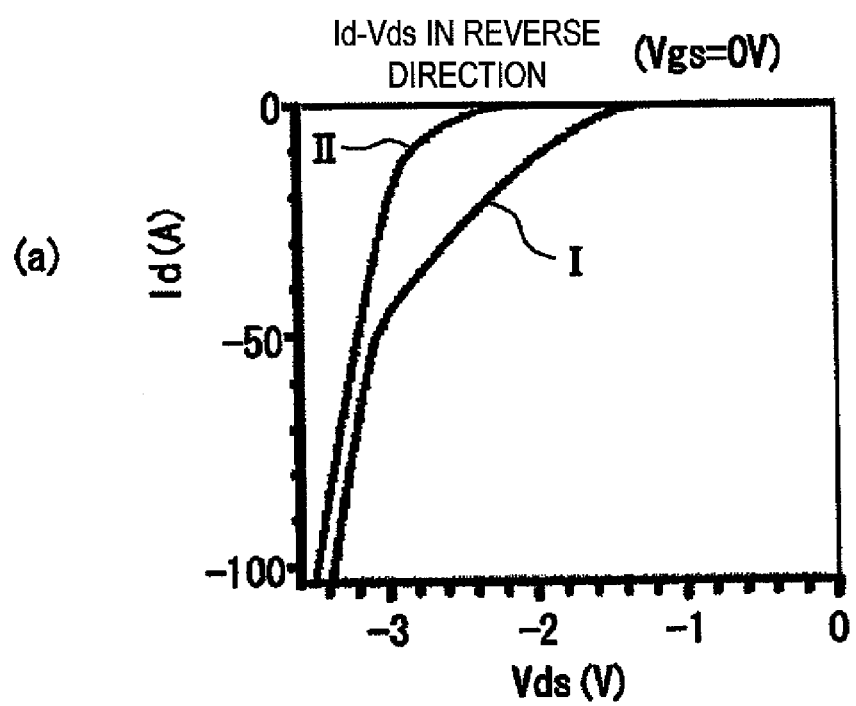
Figure 13:
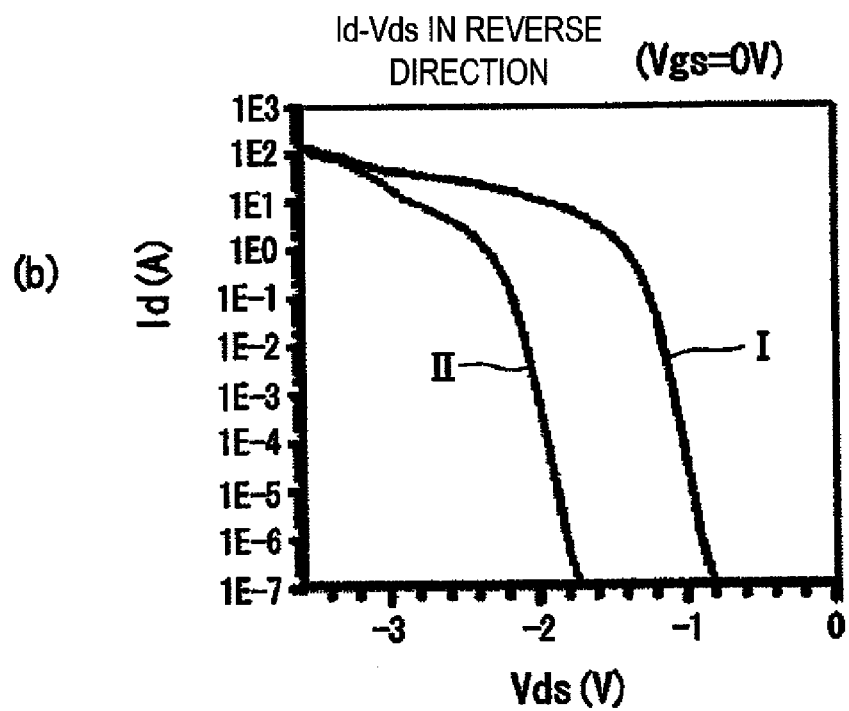

FIG. 13 shows the Id-Vds characteristic (where Id denotes the drain current and Vds denotes a drain voltage) of the reverse current that was analyzed through those simulations. In this case, Vgs is supposed to be 0 V. Specifically, the data shown in FIG. 13(a) is plotted on a linear scale, while the data shown in FIG. 13(b) is plotted on a (semi-) logarithmic scale. Also, in FIG. 13, the curve I indicates the results obtained from the semiconductor element with the epitaxial channel layer, while the curve II indicates the results obtained from the semiconductor element with no epitaxial channel layer.

Both of the two semiconductor elements 100 represented by these curves I and II were designed to have Vth=about 3.5 V. Also, in both of these elements 100, the gate insulating film 60 had a thickness of 70 nm and the channel length Lg thereof was 0.5 μm. Furthermore, the JFET region 22 had a dopant concentration of $1 \times 10^{17}$ cm$^{-3}$.

As can be seen from FIG. 13, even if the threshold voltages Vth of their forward currents are substantially the same, the reverse current flows more easily in the element with the epitaxial channel layer (as indicated by the curve I). For that reason, according to the present invention, the channel region of the MISFET is defined in the channel layer.

Figure 14:
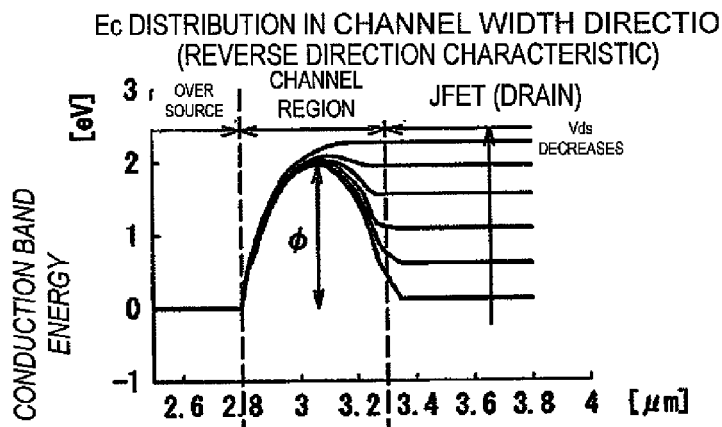
FIGS. 14(a) and 14(b) are graphs showing channel width direction conduction band energy distributions of an element with a reverse characteristic.
Figure 14:
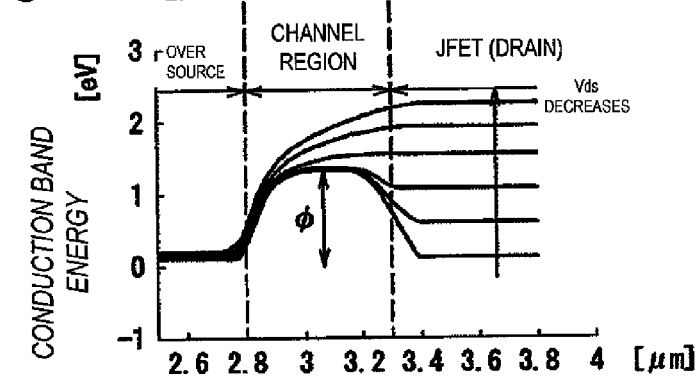

The semiconductor element of the present invention will be further described with reference to FIGS. 14 and 15. FIG. 14 is a graph showing a channel width direction Ec distribution of an element with a reverse characteristic (which is a characteristic of an element in which a reverse current flows). In this case, Ec stands for conduction band energy. In FIG. 14, ø indicates an energy barrier representing a difference between Ec in the JFET region and the maximum Ec in the channel region. FIGS. 14(a) and 15(a) show the results obtained from an element with no epitaxial channel layer, while FIGS. 14(b) and 15(b) show the results obtained from an element with an epitaxial channel layer. Both of the semiconductor element 100 with an epitaxial channel layer and the semiconductor element with no epitaxial channel layer are supposed to have Vth=approximately 3.5 V.

Electrons flowing in the reverse direction flow from the JFET region to the source region by going over Ec at the channel region. As shown in FIGS. 14 and 15, if Vds is decreased, Ec in the JFET region increases and the energy barrier ø decreases its height. And if Vds becomes equal to or smaller than Vf0, the electrons start to flow over the energy barrier ø.

Figure 15:
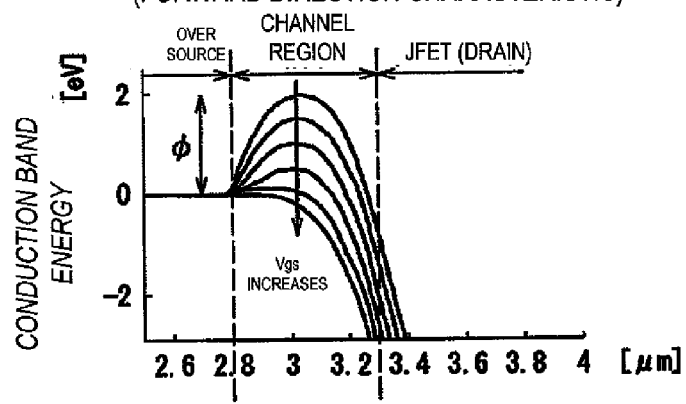
FIGS. 15(a) and 15(b) are graphs showing channel width direction conduction band energy distributions of an element with a forward characteristic.
Figure 15:
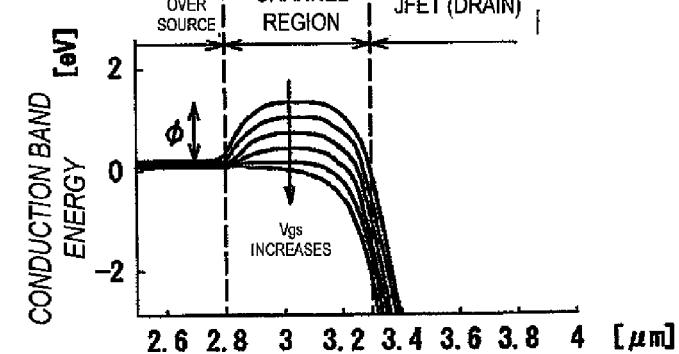

FIG. 15 is a graph showing a channel lateral direction Ec distribution of an element with a forward characteristic. In FIG. 15, ø indicates an energy barrier representing a difference between Ec in the source region and the maximum Ec in the channel region. Electrons flowing in the forward direction flow from the source region to the JFET region by going over the maximum Ec at the channel region. As shown in FIG. 15, if Vds is increased, Ec in the channel region decreases and the energy barrier ø decreases its height. And if Vgs becomes equal to or greater than Vth, the electrons start to flow over the energy barrier ø.

Comparing the results shown in FIGS. 14(a) and 14(b) to each other, it can be seen that if Vth is the same, the semiconductor element without an epitaxial channel layer shown in FIG. 14(a) has a higher energy barrier ø than the semiconductor element with an epitaxial channel layer shown in FIG. 14(b). Consequently, the reverse current flows more easily in the semiconductor element 100 with an epitaxial channel layer.

Figure 16:
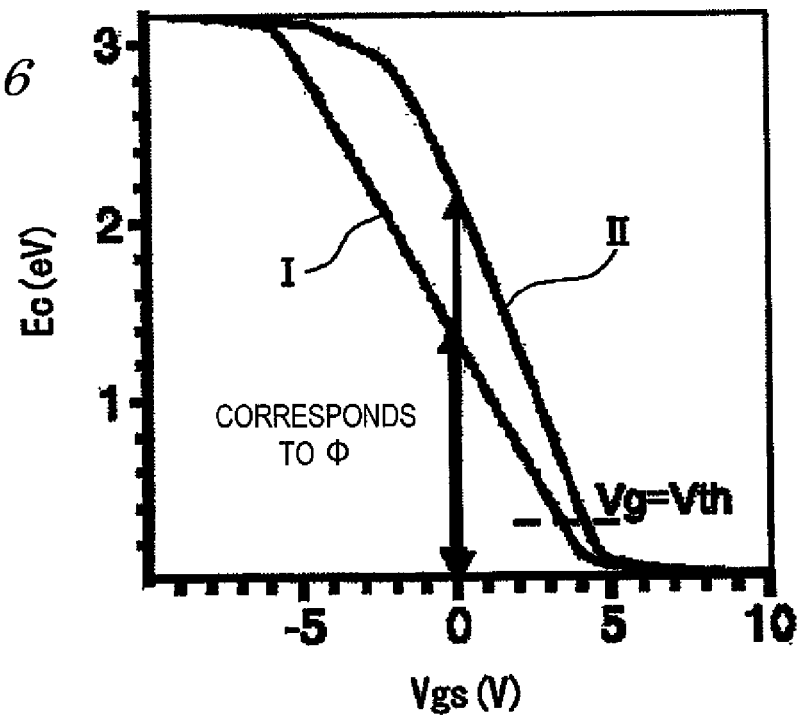
FIG. 16 is a graph showing the Vgs dependence of a channel interface conduction band energy.

FIG. 16 is a graph showing the Vgs dependence of a channel interface Ec. In FIG. 16, the curve I indicates the results obtained from an element with an epitaxial channel layer, while the curve II indicates the results obtained from an element with no epitaxial channel layers. As can be seen from the results shown in FIG. 16, Ec represented by the curve I is lower than the one represented by the curve II, and therefore, |Vf0| is so low that the reverse current flows easily in the element with an epitaxial channel layer.

The semiconductor element 100 has the same Vth as the other semiconductor element, but does have an epitaxial channel layer. Thus, the semiconductor element 100 has a lower conduction band energy barrier ø at the channel region when Vgs=0 V, and therefore, the reverse current flows more easily in the element 100, than the other semiconductor element.

The power converter of the present invention shown in FIG. 11 (which is implemented as an inverter circuit 200) is realized by replacing the high-side MISFET H and the low-side MISFET L, which are connected to the freewheeling diode element in the conventional circuit configuration shown in FIG. 17, with the semiconductor elements 100 of this preferred embodiment. The power converter of the present invention can have a lower reverse recovery current peak value (as indicated by the reference numeral 98 in FIG. 18) than the body diode of the MISFET. As a result, the power converter of the present invention can reduce the switching loss significantly and can also minimize the generation of noise. The power converter of the present invention has a smaller absolute value |Vf0| of the threshold voltage than a situation where the pn junction diode of an MISFET (body diode) is used as a freewheeling diode, and therefore, can cut down the conduction loss.

In the preferred embodiment described above, the power converter is supposed to be implemented as the inverter circuit 200. However, the present invention is in no way limited to that specific preferred embodiment. FIG. 19 is a circuit diagram illustrating a voltage step-up/down converter 210 including the semiconductor elements 100 of this preferred embodiment. In this example, the controller is also equivalent to the potential setting section of the present invention.

This voltage step-up/down converter 210 is made up of the semiconductor elements 100, and therefore, can also achieve the effects described above. That is to say, the converter 210 can also reduce the reverse recovery current compared to the body diode, and therefore, can reduce the switching loss significantly and can minimize the generation of noise. On top of that, the converter 210 has a smaller absolute value |Vf0| of the threshold voltage than the body diode of the MISFET, and can cut down the conduction loss. The timing diagram of this voltage step-up/down converter 210 is either the same as, or at least similar to, the timing diagram shown in FIG. 18 with a reduced peak current 98.

FIG. 20 is a circuit diagram illustrating a voltage step-up converter 220 including the semiconductor elements 100 of this preferred embodiment. In FIG. 20, the semiconductor element 100 of the upper arm in the configuration shown in FIG. 19 has its gate and source short-circuited with each other. Specifically, this converter 220 is a voltage step-up converter, of which the upper arm is a diode and the lower arm is a switch. In this example, the controller is also equivalent to the potential setting section of the present invention.

Hereinafter, the structure and the manufacturing process of the semiconductor element 100 of this preferred embodiment will be described with reference to FIG. 21 and FIGS. 22 through 25.

Figure 5:
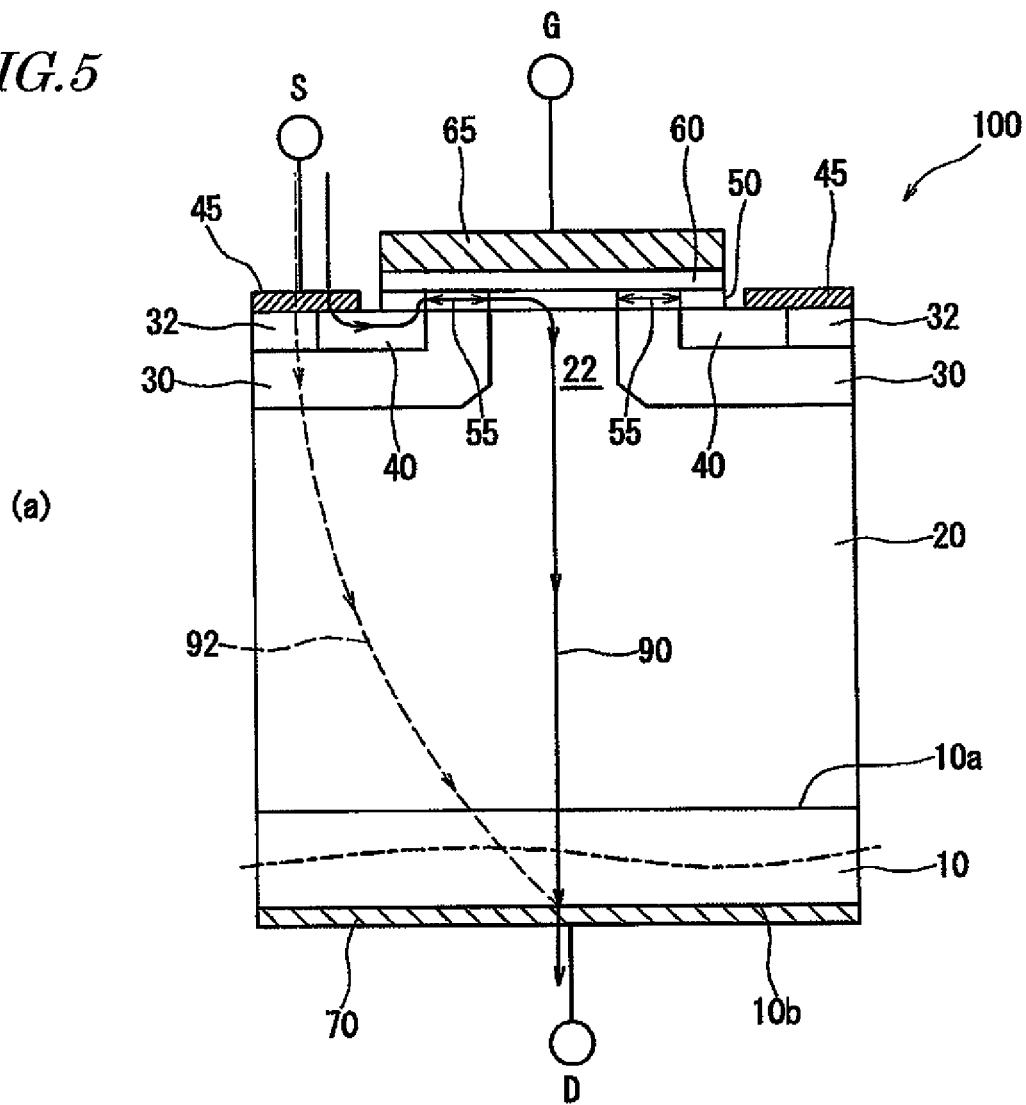
FIG. 5(a) is a cross-sectional view schematically illustrating the structure of a semiconductor element 100 according to a preferred embodiment of the present invention and FIG. 5(b) illustrates the semiconductor element 100 by a circuit symbol.
Figure 5:
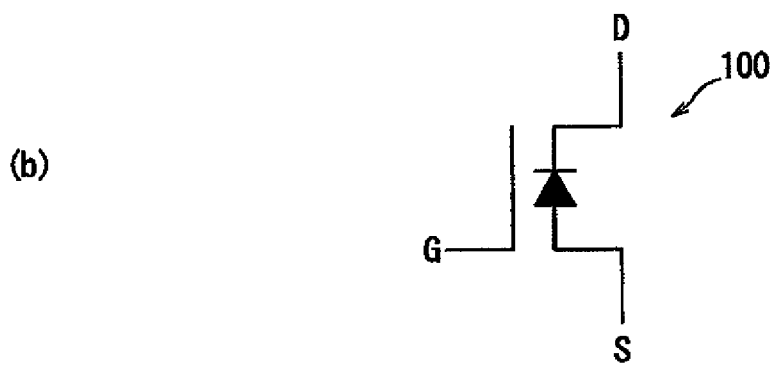

The semiconductor element 100 shown in FIG. 21 has a vertical DMISFET (which is an abbreviation of double-implanted MISFET) structure, which is basically the same as what is illustrated in FIG. 5.

However, unlike the structure shown in FIG. 5, an interlevel dielectric film 67 has been deposited in FIG. 21 on the gate electrode 65 and a source line (or source pad) 47 has been formed on the source electrode 45 and the interlevel dielectric film 67. A die-bonding back surface electrode 72 is also arranged on the back surface of the drain electrode 70, which is another difference from the structure shown in FIG. 5. The die-bonding back surface electrode 72 may be a stack of Ti, Ni and Ag layers, for example.

Hereinafter, it will be described how to fabricate the semiconductor element 100 shown in FIG. 21. First of all, as shown in FIG. 22(a), a substrate 10 is provided. The substrate 10 may be a low-resistance n-type 4H—SiC off-axis cut substrate, for example.

Next, as shown in FIG. 22(b), a high-resistance drift region 20 is grown epitaxially on the substrate 10. The drift region 20 may be made of n-type 4H—SiC, for example. Thereafter, as shown in FIG. 22(c), the drift region 20 is partially covered with a mask 81 of $SiO_2$, for example, through which ions 82 of Al or B are implanted into the drift region 20.

After the ions have been implanted, the mask 81 is removed and then the remaining structure is annealed within an inert gas atmosphere at a high temperature of about 1700° C. As a result, a p-well region (body region) 30 is defined as shown in FIG. 23(a).

Subsequently, ions of nitrogen, for example, are implanted into the p-well region 30 through a mask (not shown), thereby defining a source region 40, and ions of Al, for example, are further implanted into the p-well region 30 through another mask (not shown, either), thereby defining a contact region 32. After these ion implantation processes are finished, the masks are removed and the substrate is annealed to have those dopants activated.

Although the annealing process is supposed to be carried out in the process step shown in FIG. 23(a), the annealing process does not have to be performed in the process step shown in FIG. 23(a). But the annealing process may be carried out only in the process step shown in FIG. 23(b) to activate at a time all of those dopants introduced.

Next, as shown in FIG. 23(c), an epitaxial layer (to be an epitaxial channel layer) 50 of silicon carbide is grown over the entire surface of the drift region 20 including the p-well region 30, the source region 40 and the contact region 32. In this preferred embodiment, the dopant concentration N ($cm^{-3}$) and thickness d (nm) of the epitaxial channel layer 50 are controlled so as to satisfy the following conditions:

$$b_1 \times d^{a_1} \leq N < b_0 \times d^{a_0},$$

$$b_0 = 1.349 \times 10^{21},$$

$$a_0 = -1.824,$$

$$b_1 = 2.188 \times 10^{20} \text{ and}$$

$$a_1 = -1.683$$

Subsequently, after a predetermined part of the epitaxial channel layer 50 has been removed by dry etching, a gate insulating film 60 is formed on the surface of the epitaxial channel layer 50 by thermal oxidation process, for example, as shown in FIG. 24(a). Thereafter, as shown in FIG. 24(b), a polysilicon film 64, which is doped with phosphorus to about $7 \times 10^{20}$ $cm^{-3}$, is deposited to a thickness of about 500 nm on the surface of the gate insulating film 60.

Next, as shown in FIG. 24(c), the polysilicon film 64 is dry-etched through a mask (not shown), thereby forming gate electrodes 65 on predetermined regions. Then, as shown in FIG. 25(a), an interlevel dielectric film 67 of $SiO_2$, for example, is deposited by CVD process over the surface of the gate electrodes 65 and the drift region 20. The interlevel dielectric film 67 may have a thickness of 1.5 μm, for example.

Subsequently, as shown in FIG. 25(b), portions of the interlevel dielectric film 67 are dry-etched away through a mask (not shown) from over the surface of the contact regions 32 and from over a part of the surface of the source region 40, thereby cutting via holes 68.

Thereafter, as shown in FIG. 25(c), a nickel film is deposited to a thickness of about 50 nm over the interlevel dielectric film 67 and then selectively etched away so as to remain only inside and surrounding the via holes 68. After the etching process gets done, the substrate is thermally treated at 950° C. for 5 minutes within an inert gas atmosphere, thereby making the nickel react with the surface of silicon carbide and forming source electrodes 45 of nickel silicide there. In the meantime, nickel, for example, is deposited over the entire back surface of the substrate 10 and is also thermally treated and caused to react with silicon carbide, thereby forming a drain electrode 70 there.

Subsequently, aluminum is deposited to a thickness of about 4 μm over the interlevel dielectric film 67 and the via holes 68 and then etched into a predetermined pattern, thereby forming a source line (or source pad) 47 as shown in FIG. 21. Although not shown, a gate line (or gate pad) to contact with the gate electrode is also formed somewhere else at an end of the chip. Furthermore, Ti, Ni and Ag, for example, may be deposited one upon the other to make a die-bonding back surface electrode 72 on the back surface of the drain electrode 70. In this manner, the semiconductor element 100 shown in FIG. 21 is completed.

Hereinafter, the structure and manufacturing process of another semiconductor element 100' according to this preferred embodiment will be described in detail with reference to FIG. 26 and FIGS. 27 through 30.

The semiconductor element 100' shown in FIG. 26 has a vertical trench MISFET structure. A major difference in structure between the semiconductor element 100' shown in FIG. 26 and the semiconductor element 100 shown in FIG. 5 or 21 lies in that trench (recess). However, the effects of the preferred embodiment described above can also be achieved even by the semiconductor element 100' with the structure shown in FIG. 26.

Hereinafter, a manufacturing process for fabricating the semiconductor element 100' shown in FIG. 26, as well as its structure, will be described.

First of all, as shown in FIG. 27(a), a substrate 10 is provided. The substrate 10 may be a low-resistance n-type 4H—SiC off-axis cut substrate, for example. Next, as shown in FIG. 27(b), a high-resistance drift region 20 is grown epitaxially on the substrate 10. The drift region 20 may be made of n-type 4H—SiC, for example.

Subsequently, as shown in FIG. 27(c), a p-base layer (to be a body region) 30 is grown epitaxially to a thickness of about 0.5 μm to about 1 μm, for example, on the surface of the drift region 20. Next, as shown in FIG. 28(a), an n$^+$-source region 40 is defined on the surface of the p-base layer either by implanting nitrogen ions or epitaxy. Furthermore, by implanting ions of Al, for example, p-type contact regions 32 are defined so as to reach the p-base layer 30 from the surface of the source region 40. After that, an annealing process is carried out at about 1700° C. to 1800° C. for approximately 30 minutes within an inert gas atmosphere to activate those dopant atoms introduced.

Thereafter, as shown in FIG. 28(b), silicon carbide is dry-etched through a mask (not shown), thereby cutting trenches 69 at predetermined regions. The trenches 69 are recesses that extend through the n$^+$-source region 40 and the p-base layer 30 to reach the drift region 20.

Next, as shown in FIG. 28(c), a silicon carbide layer (to be an epitaxial channel layer) 50 is grown epitaxially over the entire surface as well as the inner side surface of the trenches 69. In this preferred embodiment, the dopant concentration N (cm$^{-3}$) and thickness d (nm) of the epitaxial channel layer 50 are controlled so as to satisfy the following conditions:

$$b_1 \times d^{a_1} \leq N < b_0 \times d^{a_0},$$

$$b_0 = 1.349 \times 10^{21},$$

$$a_0 = -1.824,$$

$$b_1 = 2.188 \times 10^{20} \text{ and}$$

$$a_1 = -1.683$$

Optionally, the epitaxial channel layer 50 may have a structure in which its dopant concentration varies in the thickness direction as described above.

Subsequently, after the epitaxial channel layer 50 has been dry-etched into a predetermined pattern, a gate insulating film 60 is formed thereon by thermal oxidation process, for example, as shown in FIG. 29(a).

Thereafter, as shown in FIG. 29(b), a polysilicon film 64, which is doped with phosphorus to about $7 \times 10^{20}$ cm$^{-3}$, is deposited to a thickness of about 500 nm on the surface of the gate insulating film 60. Next, the polysilicon film 64 is dry-etched to have an intended pattern, thereby forming gate electrodes 65 thereon.

Then, as shown in FIG. 30(a), SiO$_2$ is deposited to a thickness of 1.5 μm, for example, as an interlevel dielectric film over the surface of the gate electrodes 65, and then selectively dry-etched, thereby removing portions of the interlevel dielectric film 67 from over the surface of the contact regions 32 and from over a part of the surface of the source region 40. In this manner, via holes are cut so as to expose the contact regions 32 and that part of the source region 40.

Thereafter, as shown in FIG. 30(b), a nickel film is deposited to a thickness of about 50 nm over the interlevel dielectric film 67 and then selectively etched away so as to remain only inside and surrounding the via holes. After the etching process gets done, the substrate is thermally treated at 950° C. for 5 minutes within an inert gas atmosphere, thereby making the nickel react with the surface of silicon carbide and forming source electrodes 45 of nickel silicide there. In the meantime, nickel, for example, is deposited over the entire back surface of the substrate 10 and is also thermally treated and caused to react with silicon carbide, thereby forming a drain electrode 70 there.

Subsequently, aluminum is deposited to a thickness of about 4 μm over the interlevel dielectric film 67 and the via holes and then etched into a predetermined pattern, thereby forming a source line (or source pad) 47 as shown in FIG. 26. Although not shown, a gate line (or gate pad) to contact with the gate electrode is also formed somewhere else at an end of the chip. Furthermore, Ti, Ni and Ag, for example, may be deposited one upon the other to make a die-bonding back surface electrode 72 on the back surface of the drain electrode 70. In this manner, the semiconductor element 100' shown in FIG. 26 is completed.

Various combinations of conventional semiconductor elements and diode elements are shown in FIGS. 31 through 34 and will be compared to the present invention in order to demonstrate the effects of the present invention.

FIG. 31 is an equivalent circuit diagram illustrating a circuit consisting of an Si-MOSFET alone. In FIG. 31, D, S and G denoted drain, source and gate terminals, respectively, If denotes a forward current, and Ir denotes a reverse current. In this circuit, a return current flows as the reverse current Ir through a body diode inside of the Si-MOSFET. Since the body diode is a bipolar element, a reverse recovery current flows through it, thus causing a lot of switching loss and taking a long switching time, too. On the other hand, in the semiconductor element of the present invention, the reverse current flows through a channel layer that performs a unipolar operation, and therefore, the amount of reverse recovery current to flow becomes very small. Consequently, only a minimum switching loss is involved and it takes just a short switching time.

FIG. 32 is an equivalent circuit diagram illustrating a circuit including an Si-MOSFET and a freewheeling diode element in combination. The freewheeling diode element shown in FIG. 32 is an Si-pin diode. Since the freewheeling diode element is a bipolar element, a reverse recovery current also flows through it as in the circuit shown in FIG. 31. As a result, a lot of switching loss is caused and it takes a long switching time.

On the other hand, in the semiconductor element of the present invention, very little reverse recovery current flows and it takes just a short switching time as described above. In addition, in the circuit configuration shown in FIG. 32, the freewheeling diode element needs to be provided as a separate part and connected to the Si-MOSFET, and therefore, the number of parts required is two. According to the present invention, however, no such freewheeling diode elements are needed, and therefore, the number of parts required can be cut down.

FIG. 33 is an equivalent circuit diagram illustrating a circuit including an Si-MOSFET and an SiC-SBD in combination. The freewheeling diode element shown in FIG. 33 is an SiC-SED. A Zener diode is connected in series to the drain of the Si-MOSFET. The Zener diode is needed to make a reverse current flow through the freewheeling diode. A pn junction body diode is included in the Si-MOSFET and has a |Vf0| of about 0.6 V. On the other hand, the freewheeling diode has a |Vf0| of about 1 V.

Were it not for the Zener diode, the reverse current would flow through the body diode of the Si-MOSFET, not through the freewheeling diode, because a reverse current will flow through one of the two diodes that has the smaller absolute value of Vf0. That is to say, the Zener diode is provided in order to prevent the reverse current from flowing through the body diode of the Si-MOSFET.

When a forward current flows, the Zener diode will cause conduction loss. In addition, the Zener diode will also cause some switching loss at the time of switching. Since the freewheeling diode has parasitic capacitance, the energy stored in the parasitic capacitance will increase the switching loss at the time of switching.

Meanwhile, neither such conduction loss and switching loss to be caused by the Zener diode nor such loss to be caused by the parasitic capacitance of the freewheeling diode as seen in the combination of conventional Si-MOSFET and SiC-SBD ever happens in the semiconductor element of the present invention. Consequently, all of those losses can be cut down. On top of that, although the number of parts required is three in the configuration shown in FIG. 33, only one part is required according to the present invention. As a result, the number of parts required can be cut down to one-third according to the present invention.

FIG. 34 is an equivalent circuit diagram illustrating a circuit including an Si-IGBT and a freewheeling diode in combination. The freewheeling diode shown in FIG. 34 is an Si-pin diode. According to this combination, both the semiconductor element and the diode element are bipolar elements, a tail current will flow through the semiconductor element at the time of switching, thus causing a lot of switching loss and taking a long switching time. In addition, since the diode has a large reverse recovery current, a lot of switching loss will also be caused and it will take a long switching time, too.

On the other hand, the semiconductor element of the present invention will cause very little switching loss and will need just a short switching time. On top of that, although the number of parts required in the prior art is two, only one part is required according to the present invention. As a result, the number of parts required can be cut down according to the present invention.

As described above, no freewheeling diodes are needed anymore by adopting the semiconductor device of the present invention. However, if the load current required is greater than the current-carrying capacity of the diode current that flows through the channel region inside the semiconductor device of the present invention, then a freewheeling diode element may be added. In that case, the load current will flow through both the semiconductor device of the present invention and the freewheeling diode element alike. That is why the current-carrying capacity of the freewheeling diode element may be smaller than that of the conventional freewheeling diode element. Consequently, the chip area occupied by the additional freewheeling diode will be smaller than the conventional one, and therefore, the cost can be cut down.

While the present invention has been described with respect to preferred embodiments thereof, the present invention is in no way limited to those specific preferred embodiments but the disclosed invention may be modified in numerous ways and may assume many embodiments other than the ones specifically described above.

FIG. 35 is a cross-sectional view illustrating a modified example for the configuration shown in FIG. 5. In the example illustrated in FIG. 35, the upper surface of the epitaxial channel layer 50 is level with that of the n$^+$-source region 40 and the p-contact regions 32, which is a major difference from the configuration shown in FIG. 5. The semiconductor element 101 of this modified example is obtained by sequentially performing the process step of forming an epitaxial channel layer 50 after the body region 30 has been defined and then the process step of defining an n$^+$-source region 40 and p-contact regions 32 in predetermined regions.

Optionally, the epitaxial channel layer 50 may be replaced with an ion implanted layer, which is formed by implanting an n-type dopant into a target region. That is to say, according to the present invention, the "second silicon carbide semiconductor layer" that has been formed so as to be at least partially in contact with the body region and the source region does not have to be the layer that has been grown epitaxially on the drift layer (first silicon carbide semiconductor layer) but may also be a surface region of the first silicon carbide semiconductor layer to which dopant ions have been implanted. For example, after the process step shown in FIG. 23(b) has been performed, ions of nitrogen or phosphorus are implanted into the surface of the first silicon carbide semiconductor layer (drift layer) 20, which is not the surface in contact with the substrate 10 but the opposite surface thereof. In this case, a surface region of the first silicon carbide semiconductor layer 20, which is located inside of the body region 30 and which is not covered with the body contact region 32 or the source region 40, becomes a channel region. By implanting ions of nitrogen or phosphorus into that channel region, donors that are an n-type dopant and acceptors that are a p-type dopant will be both included there. In this case, the ion implant dose and implant energy are determined so that the difference between the donor and acceptor concentrations Nd and Na (where Nd−Na=N) satisfy the following conditions:

$$b_1 \times d^{a_1} \leq N < b_0 \times d^{a_0},$$

$$b_0 = 1.349 \times 10^{21},$$

$$a_0 = -1.824,$$

$$b_1 = 2.188 \times 10^{20} \text{ and}$$

$$a_1 = -1.583$$

d denotes the thickness of the second silicon carbide semiconductor layer that has been formed by ion implantation. According to this preferred embodiment, "d" is defined to be the thickness of an implanted region that satisfies Nd>Na. That is to say, d is a size of the implanted region that satisfies the relation Nd>Na as measured perpendicularly to the substrate 10, and is substantially equal to a distance from the surface of the first silicon carbide semiconductor layer (drift layer) 20 to a point where Nd=Na is satisfied.

In the semiconductor element of the present invention, the turn-on voltage of the diode, in which current flows from the source electrode toward the drain electrode through the channel layer, may be measured when Vgs is 0 V, for example.

In the semiconductor device and semiconductor element of the present invention, current can flow through the body diode by applying a voltage that makes Vds<0 when the channel region of the MISFET is in totally OFF state (i.e., not electrically conductive) by setting Vgs to be sufficiently under zero (e.g., Vgs=−20V). In that state, the turn-on voltage of the body diode can be measured.

In a MISFET that uses a silicon carbide layer as a channel layer, if the absolute value |Vf0| of the turn-on voltage Vf0 of a reverse current when Vgs is equal to 0 V is smaller than the turn-on voltage of the body diode obtained by the measuring method described above in a situation where 0V≤Vgs<Vth is satisfied at room temperature, then the MISFET may be regarded as functioning as a diode in which current flows from the source electrode to the drain electrode through the channel layer.

Although the body diode is supposed to have a turn-on voltage of 2.7 V in the foregoing description, the turn-on voltage actually varies slightly according to some parameter of the element fabricated, and therefore, should be modified appropriately as needed. Also, even if a voltage Vgs=0 is applied to the MISFET, leakage current may still flow between the drain and source in a situation where the channel cannot be turned OFF sufficiently or where the pn junction of the body diode is defective. In that case, even in a voltage range that is smaller than the absolute value of the turn-on voltage of the body diode, some leakage current may be observed and the apparent value of the turn-on voltage may change.

To determine whether or not the element is working properly as a channel diode when there is such leakage current, the following method can be used effectively. Specifically, if the voltage at which a diode current of 1 A flows from the source electrode to the drain electrode when Vgs=0V is greater than the turn-on voltage (that has been determined by supplying such current with Vgs defined to be sufficiently under zero and with a voltage that makes Vds<0 applied), then it can be determined that current is flowing through the body diode. On the other hand, if the voltage at which a diode current of 1 A flows from the source electrode to the drain electrode when Vgs=0V is smaller than the turn-on voltage (that has been determined by supplying such current with Vgs defined to be sufficiently under zero and with a voltage that makes Vds<0 applied), then it can be determined that current is flowing through the channel diode.

INDUSTRIAL APPLICABILITY

The present invention provides a semiconductor element that can hinder the progress of deterioration of crystallinity of an SiC semiconductor device even without increasing the number of parts to use.

REFERENCE SIGNS LIST 10, 110 substrate (silicon carbide semiconductor substrate)
20, 120 first silicon carbide semiconductor layer (drift layer)
22 JFET region
30, 130 body region (well region)
32, 132 body contact region (contact region)
40, 140 source region
45, 145 source electrode
47 source line (source pad)
50, 150 second silicon carbide semiconductor layer or channel layer (epitaxial channel layer)
55 channel region
60, 160 gate insulating film
64 polysilicon film
65, 165 gate electrode
67 interlevel dielectric film
68 via hole
69 trench
70, 170 drain electrode
72 back surface electrode
81 mask
90 diode current
100 semiconductor element
100' semiconductor element
101 semiconductor element
102 semiconductor element
112 substrate
180, 181, 182 body diode
200 power converter (inverter circuit)
210 voltage step-up/down converter
220 voltage step-up converter
500 load
1000 inverter circuit
1100 semiconductor element
1110 semiconductor element
1200 freewheeling diode element
1500 load
2000 DC power supply
2100 inductive load
2200 controller

The invention claimed is:
1. A semiconductor device comprising
  a semiconductor element including a metal-insulator-semiconductor field effect transistor, and
  a potential setting section for setting a potential at the semiconductor element,
  wherein the metal-insulator-semiconductor field effect transistor includes:
  a semiconductor substrate of a first conductivity type;
  a first silicon carbide semiconductor layer of the first conductivity type, which is arranged on the principal surface of the semiconductor substrate;
  a body region of a second conductivity type, which is defined in the first silicon carbide semiconductor layer;
  a source region of the first conductivity type, which is defined in the body region;
  a second silicon carbide semiconductor layer of the first conductivity type, which is arranged on the first silicon carbide semiconductor layer so as to be at least partially in contact with the body region and the source region;
  a gate insulating film, which is arranged on the second silicon carbide semiconductor layer;
  a gate electrode, which is arranged on the gate insulating film;
  a source electrode, which contacts with the source region; and
  a drain electrode, which is arranged on the back surface of the semiconductor substrate, and
  wherein supposing the potential of the drain electrode with respect to the potential of the source electrode is identified by Vds,
  the potential of the gate electrode with respect to the potential of the source electrode is identified by Vgs,
  the gate threshold voltage of the metal-insulator-semiconductor field effect transistor is identified by Vth,
  the direction of a current flowing from the drain electrode toward the source electrode is defined to be a forward direction, and the direction of a current flowing from the source electrode toward the drain electrode is defined to be a reverse direction, and Vth is equal to or higher than 2 V at room temperature, in a transistor turned-ON mode, the potential setting section raises the potential Vgs of the gate electrode with respect to the potential of the source electrode to a level that is equal to or higher than the gate threshold voltage Vth, thereby making the drain electrode and the source electrode electrically conductive with each other, and in a transistor turned-OFF mode, the potential setting section sets the potential Vgs of the gate electrode with respect to the potential of the source electrode to be equal to or higher than zero volts but less than the gate threshold voltage Vth, thereby making the metal-insulator-semiconductor field effect transistor function as a diode that makes a current flow in the reverse direction from the source electrode toward the drain electrode, and wherein the absolute value of a turn-on voltage of the diode is smaller than the absolute value of a turn-on voltage of a body diode that is formed by the body region and the first silicon carbide semiconductor layer, and wherein the difference in the absolute value of the turn-on voltage between the diode and the body diode is 0.7 V or more, and wherein the absolute value of the turn-on voltage of the diode is less than 1.0 V at room temperature.

2. The semiconductor device of claim 1, wherein the second silicon carbide semiconductor layer contacts with, and is arranged on, at least a portion of the source region, and wherein the second silicon carbide semiconductor layer has a thickness of 40 nm or less.

3. The semiconductor device of claim 2, wherein the second silicon carbide semiconductor layer has an average dopant concentration of $1 \times 10^{18}$ cm$^{-3}$ or more.

4. The semiconductor device of claim 1, wherein the absolute value of the turn-on voltage of the diode is less than 0.6 V at room temperature.

5. The semiconductor device of claim 1, further comprising a terminal to be electrically connected to a power supply.

6. The semiconductor device of claim 5, further comprising a terminal to be electrically connected to an inductive load.

7. The semiconductor device of claim 1, wherein the second silicon carbide semiconductor layer is doped with a dopant of the first conductivity type by ion implantation.

8. A semiconductor element comprising a metal-insulator-semiconductor field effect transistor, wherein the metal-insulator-semiconductor field effect transistor comprises:

a semiconductor substrate of a first conductivity type;

a first silicon carbide semiconductor layer of the first conductivity type, which is arranged on the principal surface of the semiconductor substrate;

a body region of a second conductivity type, which is defined in the first silicon carbide semiconductor layer;

a source region of the first conductivity type, which is defined in the body region;

a second silicon carbide semiconductor layer of the first conductivity type, which is arranged on the first silicon carbide semiconductor layer so as to be at least partially in contact with the body region and the source region;

a gate insulating film, which is arranged on the second silicon carbide semiconductor layer;

a gate electrode, which is arranged on the gate insulating film;

a source electrode, which contacts with the source region; and a drain electrode, which is arranged on the back surface of the semiconductor substrate, and wherein supposing the potential of the drain electrode with respect to the potential of the source electrode is identified by Vds, the potential of the gate electrode with respect to the potential of the source electrode is identified by Vgs, the gate threshold voltage of the metal-insulator-semiconductor field effect transistor is identified by Vth, the direction of a current flowing from the drain electrode toward the source electrode is defined to be a forward direction, and the direction of a current flowing from the source electrode toward the drain electrode is defined to be a reverse direction, Vth is equal to or higher than 2 V at room temperature, if Vgs≥Vth is satisfied, then the metal-insulator-semiconductor field effect transistor makes the drain electrode and the source electrode electrically conductive with each other, and if 0 V≤Vgs<Vth is satisfied, then the metal-insulator-semiconductor field effect transistor does not make a current flow in the forward direction but functions as a diode that makes a current flow in the reverse direction from the source electrode toward the drain electrode when Vds<0 V, and wherein the absolute value of a turn-on voltage of the diode is smaller than the absolute value of a turn-on voltage of a body diode that is formed by the body region and the first silicon carbide semiconductor layer, and wherein the difference in the absolute value of the turn-on voltage between the diode and the body diode is 0.7 V or more, and wherein the absolute value of the turn-on voltage of the diode is less than 1.0 V at room temperature.

9. The semiconductor element of claim 8, wherein the second silicon carbide semiconductor layer contacts with, and is arranged on, at least a portion of the source region, and wherein the second silicon carbide semiconductor layer has a thickness of 40 nm or less.

10. The semiconductor element of claim 9, wherein the second silicon carbide semiconductor layer has an average dopant concentration of $1 \times 10^{18}$ cm$^{-3}$ or more.

11. The semiconductor element of claim 8, wherein the absolute value of the turn-on voltage of the diode is less than 0.6 V at room temperature.

12. The semiconductor element of claim 8, wherein the semiconductor element is used in a semiconductor device that comprises a semiconductor element including a transistor that has a gate electrode, a source electrode, a drain electrode and a channel region, and a potential setting section for setting the potential of the gate electrode, and wherein supposing the potential of the drain electrode with respect to the potential of the source electrode is identified by Vds, the potential of the gate electrode with respect to the potential of the source electrode is identified by Vgs, the gate threshold voltage of the transistor is identified by Vth, the direction of a current flowing from the drain electrode toward the source electrode is defined to be a forward direction, and the direction of a current flowing from the source electrode toward the drain electrode is defined to be a reverse direction, in a transistor turned-ON mode, the potential setting section raises the potential Vgs of the gate electrode with respect to the potential of the source electrode to a level that is equal to or higher than the gate threshold voltage Vth, thereby making the drain electrode and the source electrode electrically conductive with each other, and in a transistor turned-OFF mode, the potential setting section sets the potential Vgs of the gate electrode with respect to the potential of the source electrode to be equal to or higher than zero volts but less than the gate threshold voltage Vth, thereby making the transistor function as a diode that makes a current flow in the reverse direction from the source electrode toward the drain electrode.

13. The semiconductor element of claim 8,
wherein the second silicon carbide semiconductor layer includes at least one dopant doped layer, which is doped with a dopant of the first conductivity type, and
wherein if the second silicon carbide semiconductor layer has an average dopant concentration of N (cm$^{-3}$) and a thickness of d (nm), then N and d satisfy $$b_1 \times d^{a_1} < N < b_0 \times d^{a_0},$$

$$b_0 = 1.349 \times 10^{21},$$

$$a_0 = -1.824,$$

$$b_1 = 2.188 \times 10^{20}, \text{ and}$$

$$a_1 = -1.683.$$

14. The semiconductor element of claim 13, wherein N and d further satisfy $$N \geq b_{0.6} \times d^{a_{0.6}},$$

$$b_{0.6} = 7.609 \times 10^{20} \text{ and}$$

$$a_{0.6} = -1.881.$$

15. The semiconductor element of claim 13, wherein d is within the range of 5 nm to 200 nm.

16. The semiconductor element of claim 13, wherein d is within the range of 10 nm to 100 nm.

17. The semiconductor element of claim 13, wherein d is within the range of 20 nm to 75 nm.

18. The semiconductor element of claim 8, wherein the second silicon carbide semiconductor layer is doped with a dopant of the first conductivity type by ion implantation.

19. A power converter comprising:
the semiconductor element of claim 8;
a first line for applying at least a part of a supply voltage to between the source and drain electrodes of the semiconductor element; and
a second line for applying a voltage from a controller, which controls switching of the semiconductor element, to the gate electrode of the semiconductor element,
wherein the power converter outputs power to be supplied to a load.

20. A method for controlling a semiconductor element comprising a metal-insulator-semiconductor field effect transistor,
wherein the metal-insulator-semiconductor field effect transistor includes:
a semiconductor substrate of a first conductivity type;
a first silicon carbide semiconductor layer of the first conductivity type, which is arranged on the principal surface of the semiconductor substrate;
a body region of a second conductivity type, which is defined in the first silicon carbide semiconductor layer;
a source region of the first conductivity type, which is defined in the body region;
a second silicon carbide semiconductor layer of the first conductivity type, which is arranged on the first silicon carbide semiconductor layer so as to be at least partially in contact with the body region and the source region;
a gate insulating film, which is arranged on the second silicon carbide semiconductor layer;
a gate electrode, which is arranged on the gate insulating film;
a source electrode, which contacts with the source region; and
a drain electrode, which is arranged on the back surface of the semiconductor substrate, and
wherein supposing the potential of the drain electrode with respect to the potential of the source electrode is identified by Vds,
the potential of the gate electrode with respect to the potential of the source electrode is identified by Vgs,
the gate threshold voltage of the metal-insulator-semiconductor field effect transistor is identified by Vth,
the direction of a current flowing from the drain electrode toward the source electrode is defined to be a forward direction, and
the direction of a current flowing from the source electrode toward the drain electrode is defined to be a reverse direction,
Vth is equal to or higher than 2 V at room temperature,
the method comprising:
turn-ON step for making electrically conductive between the drain electrode and the source electrode by adjusting the potential Vgs of the gate electrode with respect to the potential of the source electrode to a level that is equal to or higher than the gate threshold voltage Vth, and
turn-OFF step for allowing the metal-insulator-semiconductor field effect transistor to function as a diode that makes a current flow in the reverse direction from the source electrode toward the drain electrode by adjusting the potential Vgs of the gate electrode with respect to the potential of the source electrode to be equal to or higher than zero volts but less than the gate threshold voltage Vth, and
wherein the absolute value of the turn-on voltage of the diode is less than 1.0 V at room temperature.

21. A semiconductor device comprising
a semiconductor element including a metal-insulator-semiconductor field effect transistor, and
a potential setting section for setting a potential at the semiconductor element,
wherein the metal-insulator-semiconductor field effect transistor includes:
a semiconductor substrate of a first conductivity type;
a first silicon carbide semiconductor layer of the first conductivity type, which is arranged on the principal surface of the semiconductor substrate;
a body region of a second conductivity type, which is arranged on the first silicon carbide semiconductor layer;
a source region of the first conductivity type, which is arranged on the body region;

a recess, which extends through the body region and the source region to reach the first silicon carbide semiconductor layer;

a second silicon carbide semiconductor layer of the first conductivity type, which defines the side surface of the recess and which is arranged so as to be at least partially in contact with the body region and the source region;

a gate insulating film, which is arranged on the second silicon carbide semiconductor layer;

a gate electrode, which is arranged on the gate insulating film;

a source electrode, which contacts with the source region; and a drain electrode, which is arranged on the back surface of the semiconductor substrate, and wherein supposing the potential of the drain electrode with respect to the potential of the source electrode is identified by Vds, the potential of the gate electrode with respect to the potential of the source electrode is identified by Vgs, the gate threshold voltage of the metal-insulator-semiconductor field effect transistor is identified by Vth, the direction of a current flowing from the drain electrode toward the source electrode is defined to be a forward direction, and the direction of a current flowing from the source electrode toward the drain electrode is defined to be a reverse direction, Vth is equal to or higher than 2 V at room temperature, and in a transistor turned-ON mode, the potential setting section raises the potential Vgs of the gate electrode with respect to the potential of the source electrode to a level that is equal to or higher than the gate threshold voltage Vth, thereby making the drain electrode and the source electrode electrically conductive with each other, and in a transistor turned-OFF mode, the potential setting section sets the potential Vgs of the gate electrode with respect to the potential of the source electrode to be equal to or higher than zero volts but less than the gate threshold voltage Vth, thereby making the metal-insulator-semiconductor field effect transistor function as a diode that makes a current flow in the reverse direction from the source electrode toward the drain electrode, and wherein the absolute value of a turn-on voltage of the diode is smaller than the absolute value of a turn-on voltage of a body diode that is formed by the body region and the first silicon carbide semiconductor layer, and wherein the difference in the absolute value of the turn-on voltage between the diode and the body diode is 0.7 V or more, and wherein the absolute value of the turn-on voltage of the diode is less than 1.0 V at room temperature.

22. The semiconductor device of claim 21, wherein the second silicon carbide semiconductor layer contacts with, and is arranged on, at least a portion of the source region, and wherein the second silicon carbide semiconductor layer has a thickness of 40 nm or less.

23. The semiconductor device of claim 22, wherein the second silicon carbide semiconductor layer has an average dopant concentration of $1 \times 10^{18}$ cm$^{-3}$ or more.

24. The semiconductor device of claim 21, wherein the absolute value of the turn-on voltage of the diode is less than 0.6 V at room temperature.

25. The semiconductor device of claim 21, further comprising a terminal to be electrically connected to a power supply.

26. The semiconductor device of claim 25, further comprising a terminal to be electrically connected to an inductive load.

27. The semiconductor element of claim 21, wherein the second silicon carbide semiconductor layer is doped with a dopant of the first conductivity type by ion implantation.

28. A semiconductor element comprising a metal-insulator-semiconductor field effect transistor, wherein the metal-insulator-semiconductor field effect transistor comprises:

a semiconductor substrate of a first conductivity type;

a first silicon carbide semiconductor layer of the first conductivity type, which is arranged on the principal surface of the semiconductor substrate;

a body region of a second conductivity type, which is arranged on the first silicon carbide semiconductor layer;

a source region of the first conductivity type, which is arranged on the body region;

a recess, which extends through the body region and the source region to reach the first silicon carbide semiconductor layer;

a second silicon carbide semiconductor layer of the first conductivity type, which defines the side surface of the recess and which is arranged so as to be at least partially in contact with the body region and the source region;

a gate insulating film, which is arranged on the second silicon carbide semiconductor layer;

a gate electrode, which is arranged on the gate insulating film;

a source electrode, which contacts with the source region; and a drain electrode, which is arranged on the back surface of the semiconductor substrate, and wherein supposing the potential of the drain electrode with respect to the potential of the source electrode is identified by Vds, the potential of the gate electrode with respect to the potential of the source electrode is identified by Vgs, the gate threshold voltage of the metal-insulator-semiconductor field effect transistor is identified by Vth, the direction of a current flowing from the drain electrode toward the source electrode is defined to be a forward direction, and the direction of a current flowing from the source electrode toward the drain electrode is defined to be a reverse direction, Vth is equal to or higher than 2 V at room temperature, and if Vgs≥Vth is satisfied, then the metal-insulator-semiconductor field effect transistor makes the drain electrode and the source electrode electrically conductive with each other, and if 0 V≤Vgs<Vth is satisfied, then the metal-insulator-semiconductor field effect transistor does not make a current flow in the forward direction but functions as a diode that makes a current flow in the reverse direction from the source electrode toward the drain electrode when Vds<0 V, and wherein the absolute value of a turn-on voltage of the diode is smaller than the absolute value of a turn-on voltage of a body diode that is formed by the body region and the first silicon carbide semiconductor layer, and wherein the difference in the absolute value of the turn-on voltage between the diode and the body diode is 0.7 V or more, and wherein the absolute value of the turn-on voltage of the diode is less than 1.0 V at room temperature.

29. The semiconductor element of claim 28, wherein the second silicon carbide semiconductor layer contacts with, and is arranged on, at least a portion of the source region, and
wherein the second silicon carbide semiconductor layer has a thickness of 40 nm or less.

30. The semiconductor element of claim 29, wherein the second silicon carbide semiconductor layer has an average dopant concentration of $1 \times 10^{18}$ cm$^{-3}$ or more.

31. The semiconductor element of claim 28, wherein the absolute value of the turn-on voltage of the diode is less than 0.6 V at room temperature.

32. The semiconductor element of claim 28, wherein the semiconductor element is used in a semiconductor device that comprises
   a semiconductor element including a transistor that has a gate electrode, a source electrode, a drain electrode and a channel region, and
   a potential setting section for setting the potential of the gate electrode, and
   wherein supposing the potential of the drain electrode with respect to the potential of the source electrode is identified by Vds,
   the potential of the gate electrode with respect to the potential of the source electrode is identified by Vgs,
   the gate threshold voltage of the transistor is identified by Vth,
   the direction of a current flowing from the drain electrode toward the source electrode is defined to be a forward direction, and
   the direction of a current flowing from the source electrode toward the drain electrode is defined to be a reverse direction,
   in a transistor turned-ON mode, the potential setting section raises the potential Vgs of the gate electrode with respect to the potential of the source electrode to a level that is equal to or higher than the gate threshold voltage Vth, thereby making the drain electrode and the source electrode electrically conductive with each other, and
   in a transistor turned-OFF mode, the potential setting section sets the potential Vgs of the gate electrode with respect to the potential of the source electrode to be equal to or higher than zero volts but less than the gate threshold voltage Vth, thereby making the transistor function as a diode that makes a current flow in the reverse direction from the source electrode toward the drain electrode.

33. The semiconductor element of claim 28,
   wherein the second silicon carbide semiconductor layer includes at least one dopant doped layer, which is doped with a dopant of the first conductivity type, and
   wherein if the second silicon carbide semiconductor layer has an average dopant concentration of N (cm$^{-3}$) and a thickness of d (nm), then N and d satisfy $b_1 \times d^{a_1} \leq N < b_0 \times d^{a_0}$, $b_0 = 1.349 \times 10^{21}$, $a_0 = -1.824$, $b_1 = 2.188 \times 10^{20}$, and $a_1 = -1.683$.

34. The semiconductor element of claim 33, wherein N and d further satisfy $N \geq b_{0.6} \times d^{a_{0.6}}$, $b_{0.6} = 7.609 \times 10^{20}$ and $a_{0.6} = -1.881$.

35. The semiconductor element of claim 33, wherein d is within the range of 5 nm to 200 nm.

36. The semiconductor element of claim 33, wherein d is within the range of 10 nm to 100 nm.

37. The semiconductor element of claim 33, wherein d is within the range of 20 nm to 75 nm.

38. The semiconductor element of claim 28, wherein the second silicon carbide semiconductor layer is doped with a dopant of the first conductivity type by ion implantation.

39. A power converter comprising:
   the semiconductor element of claim 28;
   a first line for applying at least a part of a supply voltage to between the source and drain electrodes of the semiconductor element; and
   a second line for applying a voltage from a controller, which controls switching of the semiconductor element, to the gate electrode of the semiconductor element,
   wherein the power converter outputs power to be supplied to a load.

40. A method for controlling a semiconductor element comprising a metal-insulator-semiconductor field effect transistor,
   wherein the metal-insulator-semiconductor field effect transistor includes:
   a semiconductor substrate of a first conductivity type;
   a first silicon carbide semiconductor layer of the first conductivity type, which is arranged on the principal surface of the semiconductor substrate;
   a body region of a second conductivity type, which is arranged on the first silicon carbide semiconductor layer;
   a source region of the first conductivity type, which is arranged on the body region;
   a recess, which extends through the body region and the source region to reach the first silicon carbide semiconductor layer;
   a second silicon carbide semiconductor layer of the first conductivity type, which defines the side surface of the recess and which is arranged so as to be at least partially in contact with the body region and the source region;
   a gate insulating film, which is arranged on the second silicon carbide semiconductor layer;
   a gate electrode, which is arranged on the gate insulating film;
   a source electrode, which contacts with the source region; and
   a drain electrode, which is arranged on the back surface of the semiconductor substrate, and
   wherein supposing the potential of the drain electrode with respect to the potential of the source electrode is identified by Vds,
   the potential of the gate electrode with respect to the potential of the source electrode is identified by Vgs,
   the gate threshold voltage of the metal-insulator-semiconductor field effect transistor is identified by Vth,
   the direction of a current flowing from the drain electrode toward the source electrode is defined to be a forward direction, and
   the direction of a current flowing from the source electrode toward the drain electrode is defined to be a reverse direction,
   Vth is equal to or higher than 2 V at room temperature,
   the method comprising:
   turn-ON step for making electrically conductive between the drain electrode and the source electrode by adjusting the potential Vgs of the gate electrode with respect to the potential of the source electrode to a level that is equal to or higher than the gate threshold voltage Vth, and turn-OFF step for allowing the metal-insulator-semiconductor field effect transistor to function as a diode that makes a current flow in the reverse direction from the source electrode toward the drain electrode by adjusting the potential Vgs of the gate electrode with respect to the potential of the source electrode to be equal to or higher than zero volts but less than the gate threshold voltage Vth, and wherein the absolute value of the turn-on voltage of the diode is less than 1.0 V at room temperature.

* * * * *